(12) United States Patent
Chen et al.

(10) Patent No.: US 11,195,930 B1
(45) Date of Patent: Dec. 7, 2021

(54) SEMICONDUCTOR DEVICES WITH BACKSIDE POWER RAIL AND METHODS OF FABRICATION THEREOF

(71) Applicant: TAIWAN SEMICONDUCTOR MANUFACTURING CO., LTD., Hsinchu (TW)

(72) Inventors: Chun-Yuan Chen, Hsinchu (TW); Pei-Yu Wang, Hsinchu (TW); Huan-Chieh Su, Changhua County (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/936,233

(22) Filed: Jul. 22, 2020

(51) Int. Cl.
| | | |
|---|---|---|
| *H01L 21/28* | (2006.01) | |
| *H01L 23/535* | (2006.01) | |
| *H01L 29/40* | (2006.01) | |
| *H01L 29/423* | (2006.01) | |
| *H01L 29/45* | (2006.01) | |
| *H01L 29/786* | (2006.01) | |

(52) U.S. Cl.
CPC ...... *H01L 29/456* (2013.01); *H01L 21/28097* (2013.01); *H01L 23/535* (2013.01); *H01L 29/401* (2013.01); *H01L 29/42392* (2013.01); *H01L 29/78696* (2013.01)

(58) Field of Classification Search
CPC ................. H01L 29/456; H01L 29/401; H01L 29/42392; H01L 29/78696; H01L 21/28097; H01L 23/535

USPC ........................................................ 257/401
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2020/0135578 A1* | 4/2020 | Ching ............. H01L 21/823475 |
| 2020/0411436 A1* | 12/2020 | Xie ...................... H01L 29/0673 |
| 2021/0098306 A1* | 4/2021 | Smith ................... H01L 27/092 |

* cited by examiner

*Primary Examiner* — Tong-Ho Kim
(74) *Attorney, Agent, or Firm* — NZ Carr Law Office PLLC

(57) ABSTRACT

The present disclosure relates to a semiconductor device having a backside source/drain contact, and method for forming the device. The semiconductor device includes a source/drain feature having a top surface and a bottom surface, a first silicide layer formed in contact with the top surface of the source/drain feature, a first conductive feature formed on the first silicide layer, and a second conductive feature having a body portion and a first sidewall portion extending from the body portion, wherein the body portion is below the bottom surface of the source/drain feature, and the first sidewall portion is in contact with the first conductive feature.

20 Claims, 54 Drawing Sheets

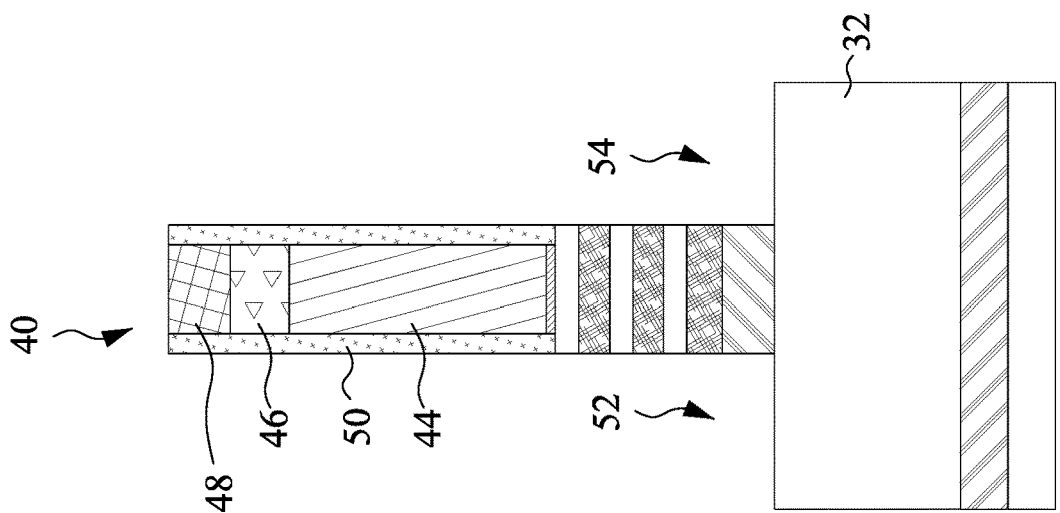
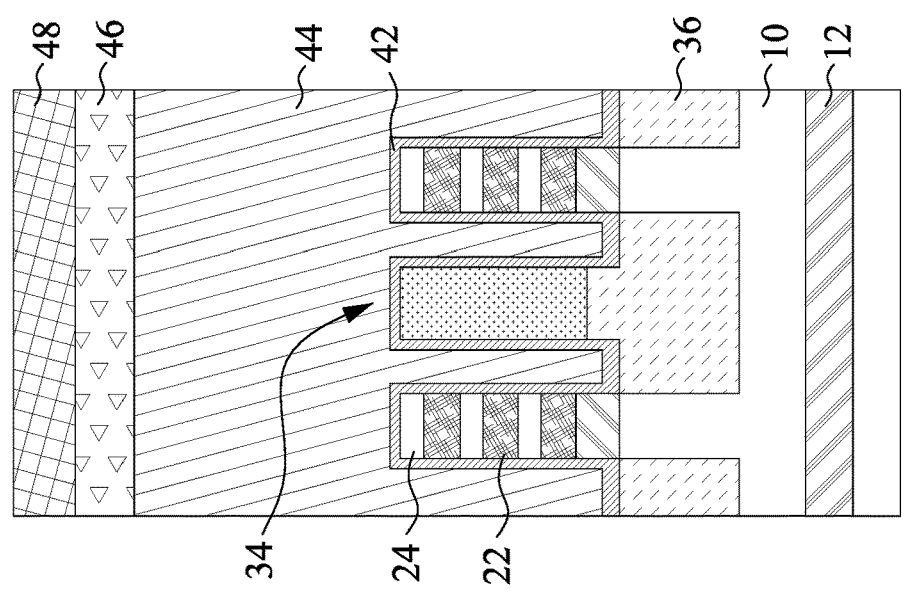
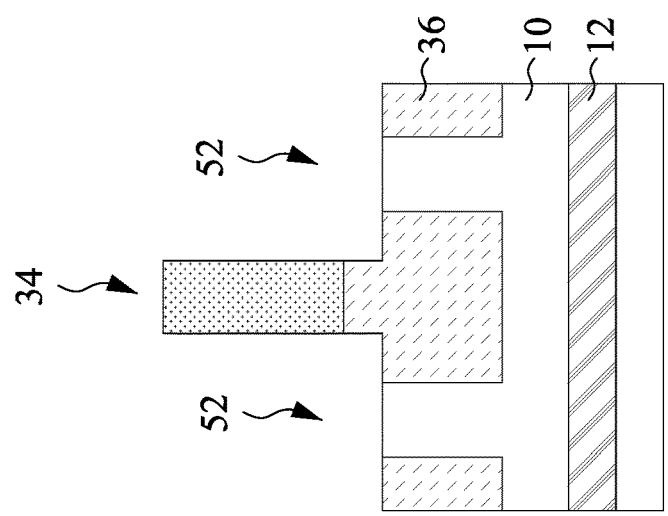
Fig. 6D
Fig. 6C
Fig. 6B

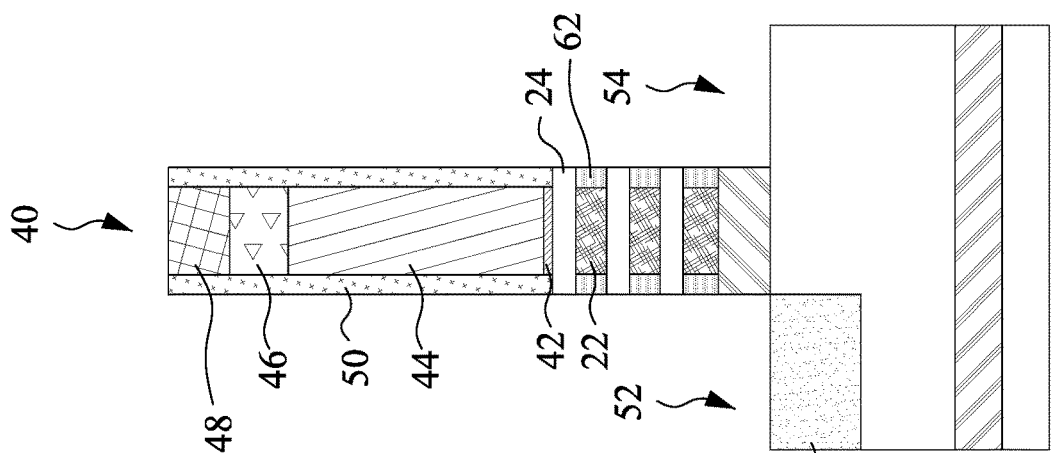
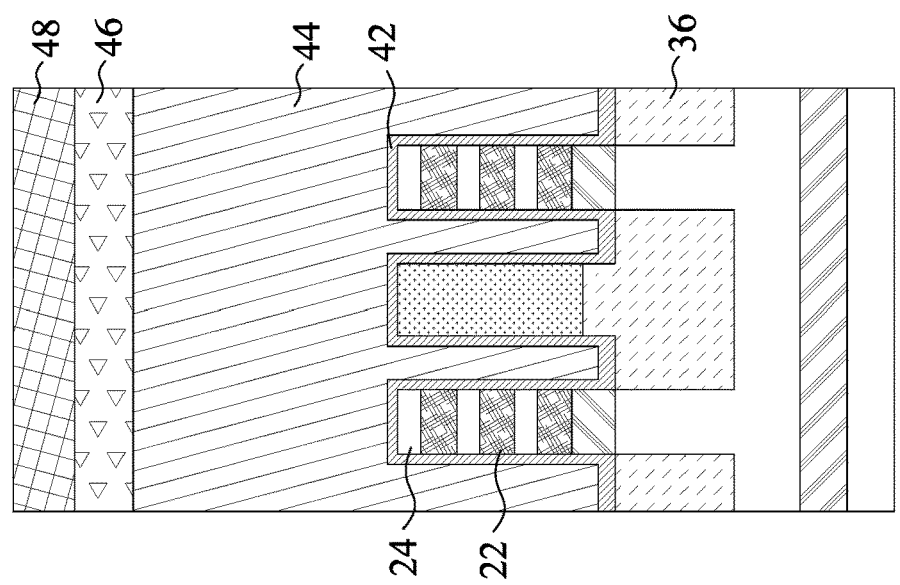
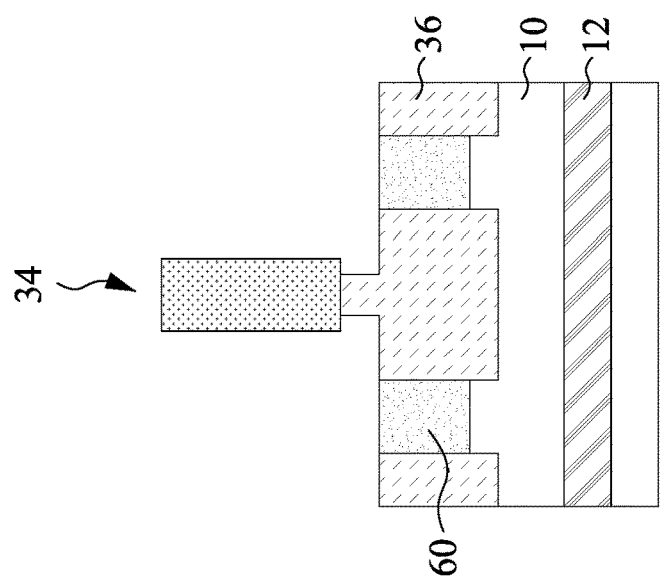
Fig. 9D
Fig. 9C
Fig. 9B

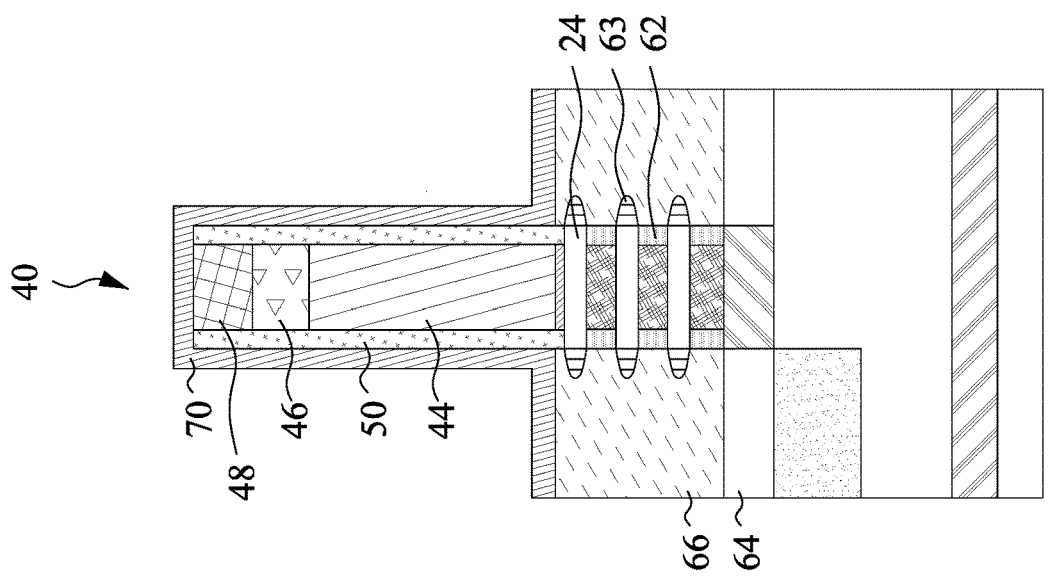
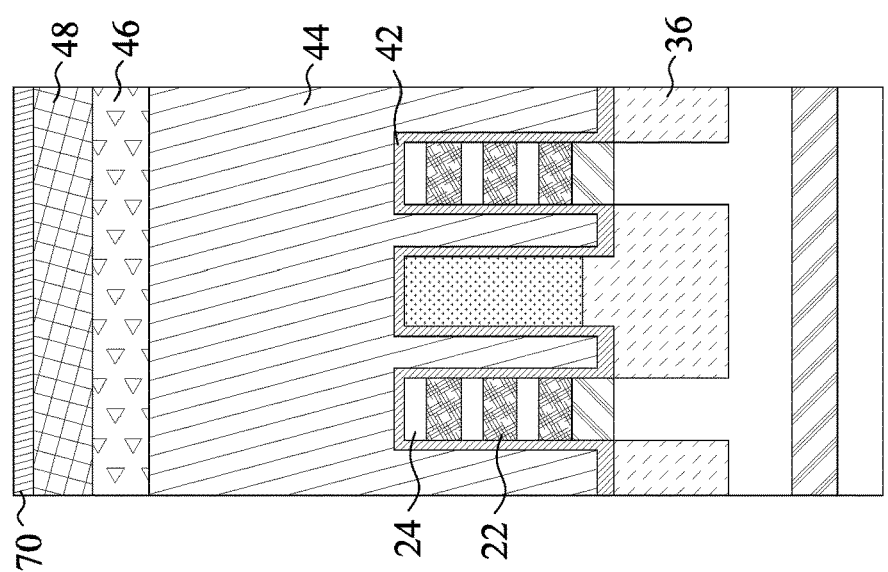
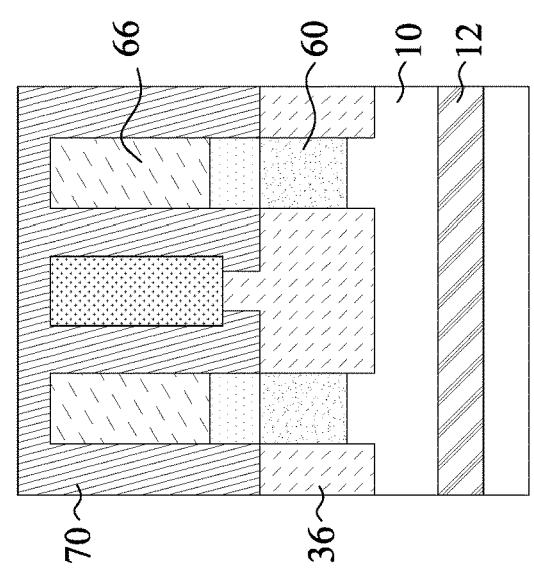
Fig. 11D
Fig. 11C
Fig. 11B

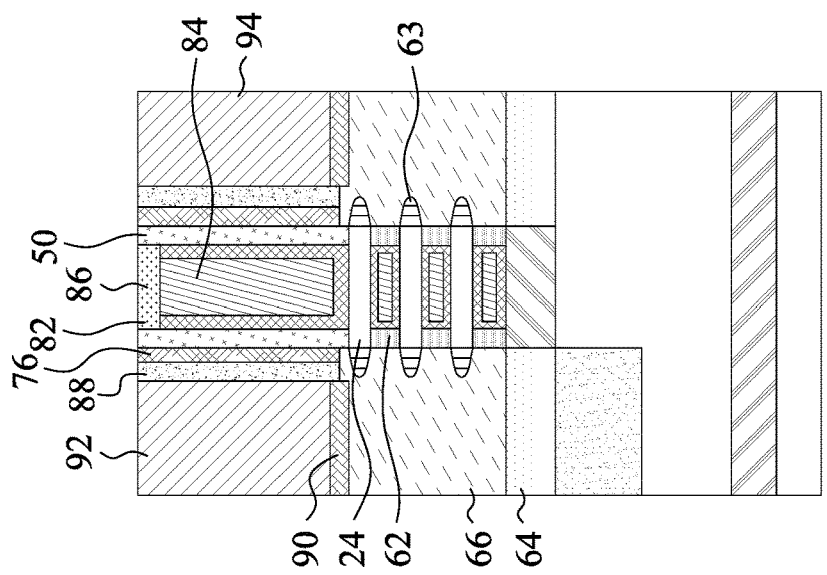
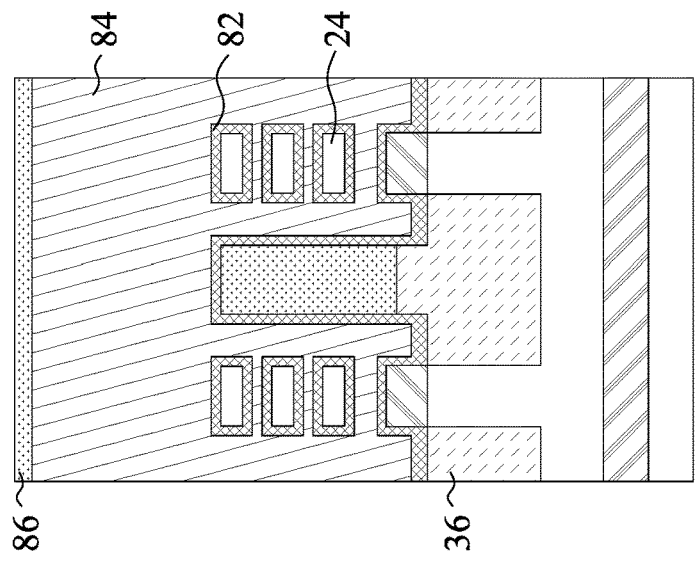
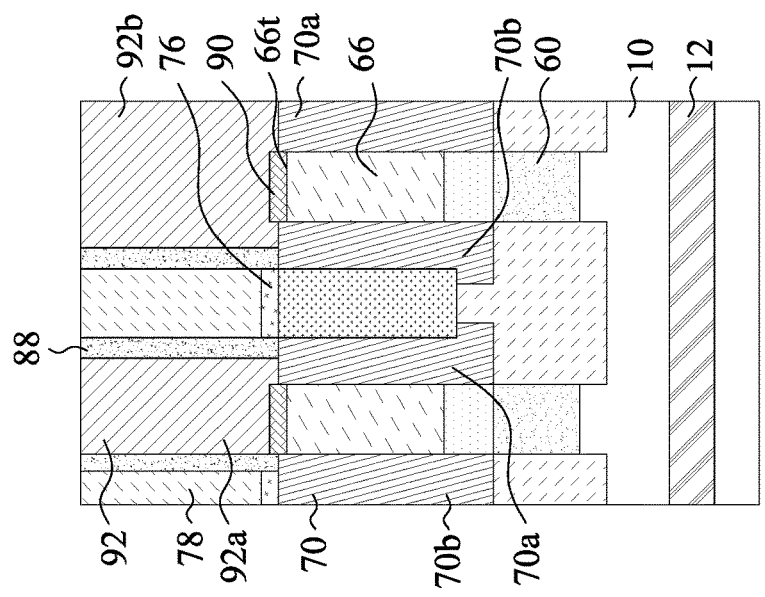
Fig. 17D
Fig. 17C
Fig. 17B

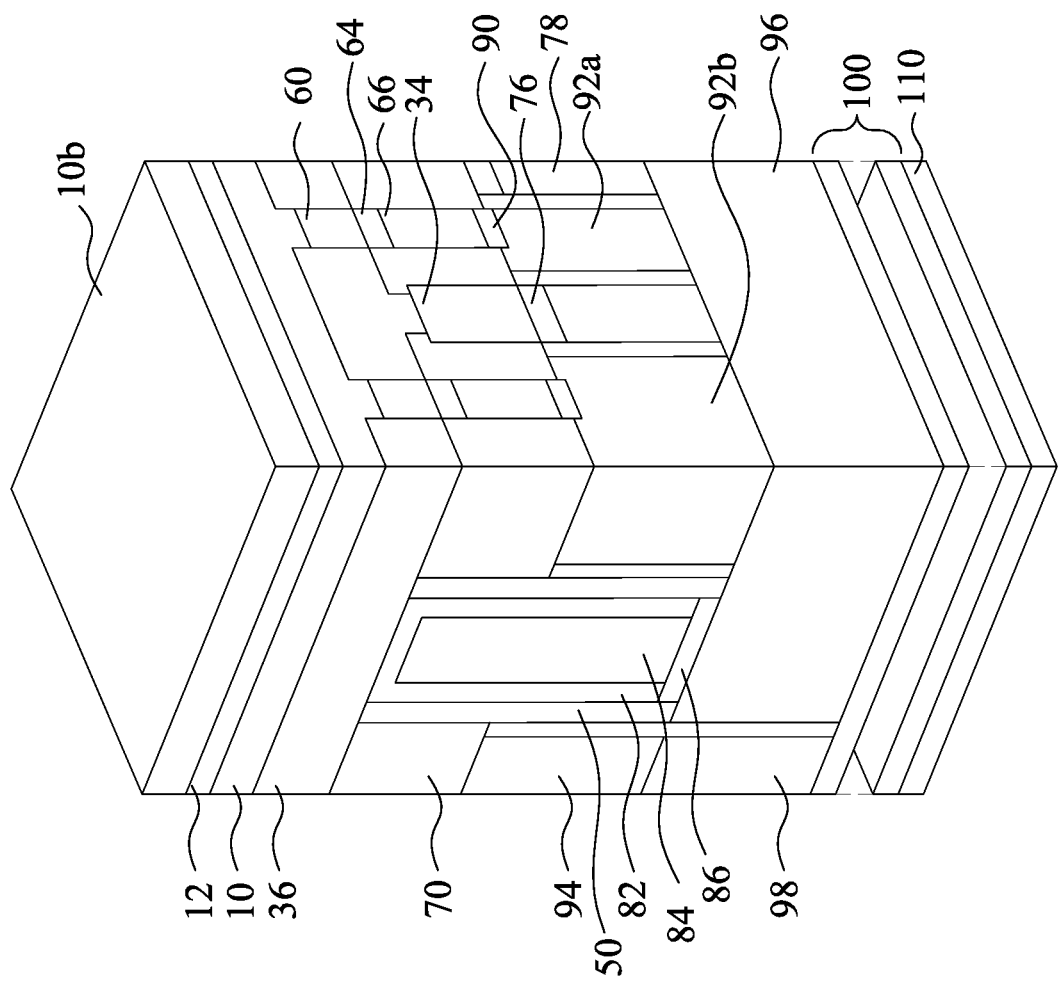
Fig. 19B
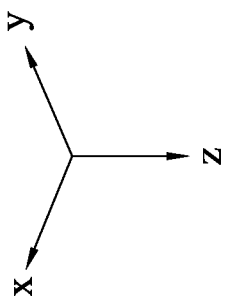

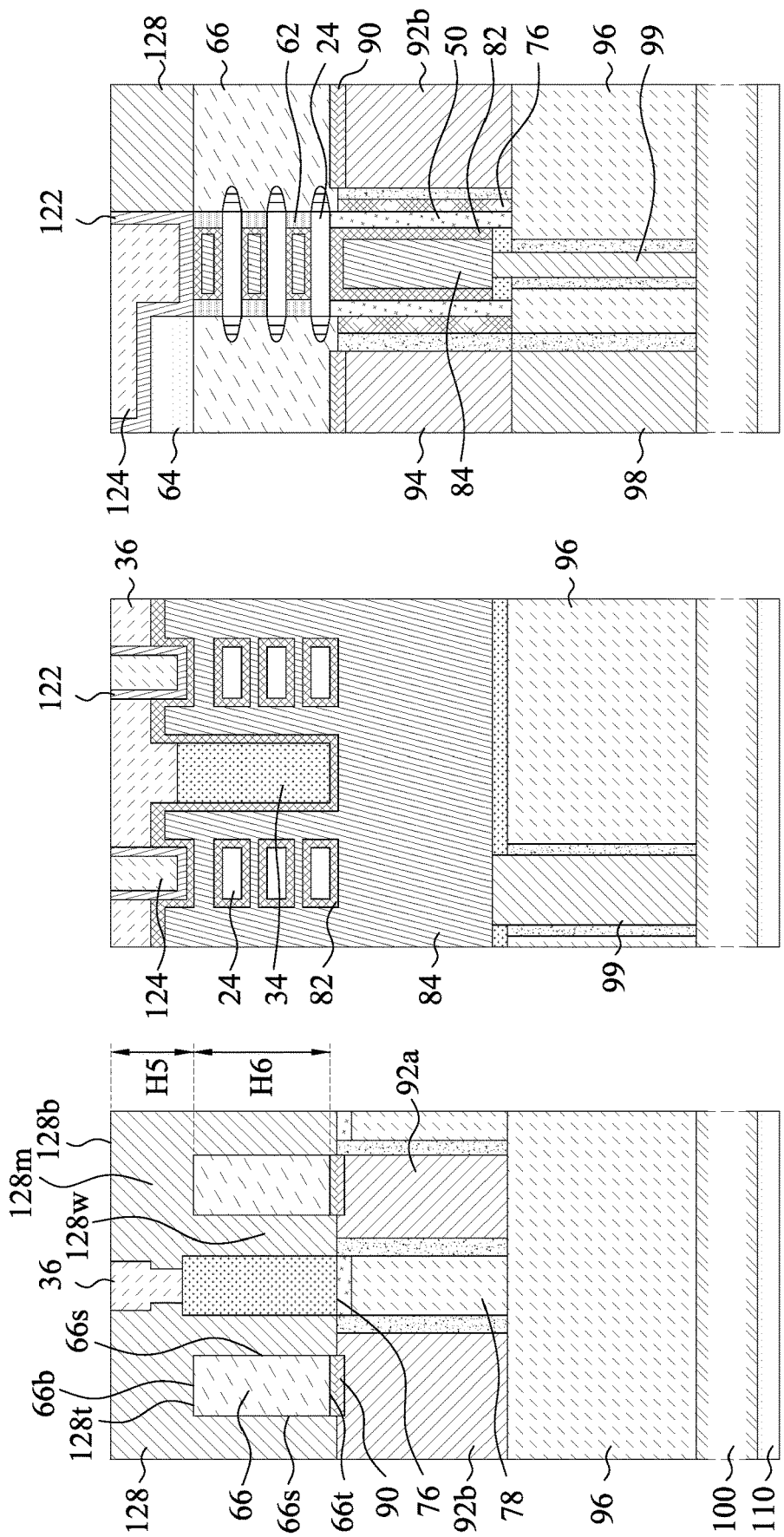

SEMICONDUCTOR DEVICES WITH BACKSIDE POWER RAIL AND METHODS OF FABRICATION THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, metal layer routing in the intermetal connection layers also becomes more complex. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 to 4, FIGS. 5A-5D to 18A-18D, FIGS. 19A-19B, FIGS. 20A-20D to 25A-25D, FIGS. 26A-26G, FIGS. 27A-27D, and FIGS. 28A-28C schematically illustrate various stages of manufacturing a semiconductor device according to embodiments of the present disclosure.

DETAILED DESCRIPTION

Figure 1:
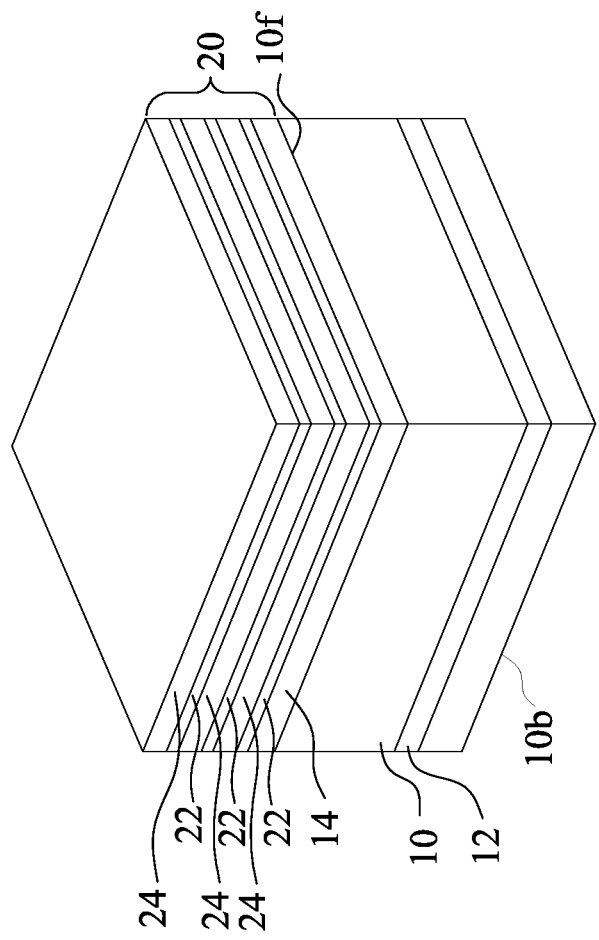
Figure 1:
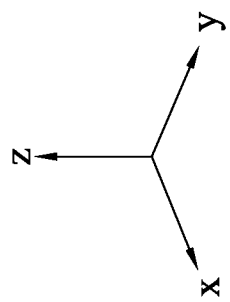

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

An integrated circuit (IC) typically includes a plurality of semiconductor devices, such as field-effect transistors and metal interconnection layers formed on a semiconductor substrate. The interconnection layers, designed to connect the semiconductor devices to power supplies, input/output signals, and to each other, may include signal lines and power rails, such as a positive voltage rail (VDD) and a ground rail (GND). As semiconductor device size shrinks, space for metal power rails and signal lines decreases.

Embodiments of the present disclosure provide semiconductor devices having metal contacts for connecting to power rails formed on a backside of a substrate, and methods for fabricating such semiconductor devices. When the power rails are formed on the backside of the substrate, metal layers in the back end of line (BEOL) may be manufactured using reduced number of masks with improved performance, width of gates in field-effector transistors (FETs) can be enlarged, and width of power rails can also be increased. Metal contacts on the backside and the backside power rail are formed by backside processes which are performed after completing BEOL processes and flipping the substrate over. As a result, backside processes are performed within the conditions to maintain integrities of the BEOL structures. For example, it is challenging to form a silicide layer between an active semiconductor region, such as a source/drain region, and a backside metal contact. Embodiments of the present disclosure provide a semiconductor device having a conductive feature, which is formed during backside processes and connects with a source/drain feature through a silicide layer formed on the front side of the substrate.

FIGS. 1-28C illustrate various stages of manufacturing a nanosheet FET device according to one embodiment of the present disclosure. Additional operations can be provided before, during, and after processes shown by FIGS. 1-28C, and some of the operations described below can be replaced or eliminated, for additional embodiments of the method. The order of the operations/processes may be interchangeable.

In FIG. 1, a substrate 10 is provided to form a semiconductor device thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as n-type field effect transistors (NFET), and p-type field effect transistors (PFET). In some embodiments, the substrate 10 may be a silicon-on-insulator (SOI) substrate including an insulator structure 12 for enhancement.

The substrate 10 has a front surface 10f and a back surface 10b. A buffer layer 14 is formed over a region on the front surface 10f of the substrate 10. The buffer layer 14 functions to gradually change the lattice constant from that of the substrate 10 to that of source/drain regions to be formed over the substrate 10. The buffer layer 14 may be formed from epitaxially grown single crystalline semiconductor materials such as, but not limited to Si, SiGe, SiGe, SiGeB, SiP, SiAs, or other Si related material. In some embodiments, the buffer layer 14 has a thickness between about 5 nm and about 50 nm.

A semiconductor stack 20 is formed over the buffer layer 14. The semiconductor stack 20 includes alternating semiconductor layers made of different materials to facilitate formation of nanosheet channels in a multi-gate device, such as nanosheet channel FETs. In some embodiments, the semiconductor stack 20 includes first semiconductor layers 22 interposed by second semiconductor layers 24. The first semiconductor layers 22 and second semiconductor layers 24 have different oxidation rates and/or etch selectivity.

In later fabrication stages, portions of the semiconductor layers 24 form nanosheet channels in a multi-gate device. Three first semiconductor layers 22 and three second semiconductor layers 24 are alternately arranged as illustrated in FIG. 1 as an example. More or less semiconductor layers 22 and 24 may be included in the semiconductor stack 20 depending on the desired number of channels in the semiconductor device to be formed. In some embodiments, the number of semiconductor layers 24 is between 1 and 10.

The semiconductor layers 22, 24 may be formed by a molecular beam epitaxy (MBE) process, a metalorganic chemical vapor deposition (MOCVD) process, and/or other suitable epitaxial growth processes. In some embodiments, the semiconductor layers 24 include the same material as the substrate 10. In some embodiments, the semiconductor layers 22 and 24 include different materials than the substrate 10. In some embodiments, the semiconductor layers 22 and 24 are made of materials having different lattice constants. In some embodiments, the first semiconductor layers 22 include an epitaxially grown silicon germanium (SiGe) layer and the second semiconductor layers 24 include an epitaxially grown silicon (Si) layer. Alternatively, in some embodiments, either of the semiconductor layers 22 and 24 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

In some embodiments, each second semiconductor layer 24 has a thickness in a range between about 5 nm and about 30 nm. In other embodiments, each second semiconductor layer 24 has a thickness in a range between about 10 nm and about 20 nm. In some embodiments, each second semiconductor layer 24 has a thickness in a range between about 6 nm and about 12 nm. In some embodiments, the second semiconductor layers 24 in the semiconductor stack 20 are uniform in thickness. The first semiconductor layers 22 in channel regions may eventually be removed and serve to define a vertical distance between adjacent channel regions for a subsequently formed multi-gate device. In some embodiments, the thickness of the first semiconductor layer 22 is equal to or greater than the thickness of the second semiconductor layer 24. In some embodiments, each semiconductor layer 22 has a thickness in a range between about 5 nm and about 50 nm. In other embodiments, each first semiconductor layer 22 has a thickness in a range between about 10 nm and about 30 nm.

Figure 2:
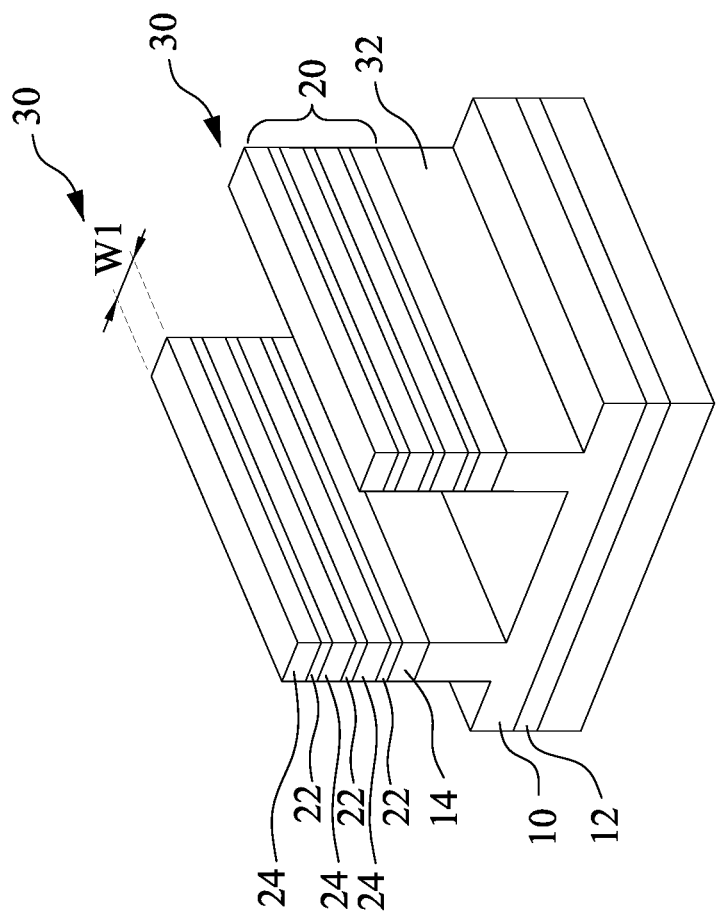

In FIG. 2, semiconductor fins 30 are formed from the semiconductor stack 20, the buffer layer 14, and a portion of the substrate 10. The semiconductor fins 30 may be formed by patterning a hard mask (not shown) formed on the semiconductor stack 20 and one or more etching processes. Each semiconductor fin 30 has an upper portion including the semiconductor layers 22, 24 and a well portion 32 formed from the substrate 10. In FIG. 2, the semiconductor fins 30 are formed along the X direction. A width W1 of the semiconductor fins 30 along the Y direction is in a range between about 10 nm and about 40 nm. In some embodiments, the width W1 of the semiconductor fins 30 along the Y direction is in a range between about 20 nm and about 30 nm.

Figure 3:
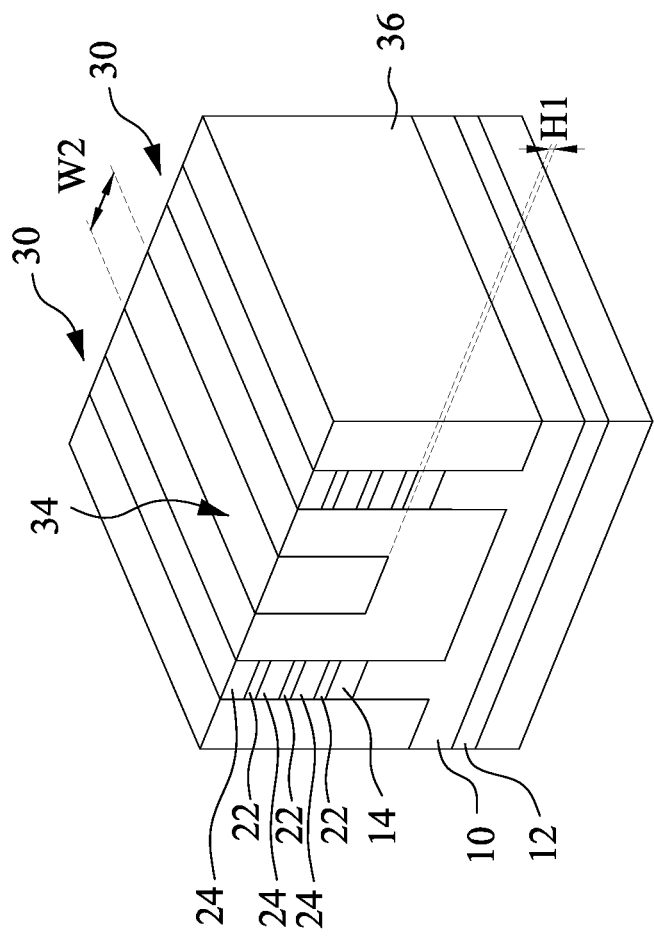

In FIG. 3, an isolation layer 36 is formed over the substrate 10 and hybrid fins 34 are formed in the isolation layer 36 between neighboring semiconductor fins 30. The isolation layer 36 may be formed by a high density plasma chemical vapor deposition (HDP-CVD), a flowable CVD (FCVD), or other suitable deposition process. In some embodiments, the isolation layer 36 is formed conformally to cover the semiconductor fins 30 by a suitable deposition process, such as atomic layer deposition (ALD). In some embodiments, the isolation layer 36 may include silicon oxide, silicon nitride, silicon oxynitride, fluorine-doped silicate glass (FSG), a low-k dielectric, combinations thereof.

In some embodiments, the conformal deposition of the isolation layer 36 results in trenches formed in the isolation layer 36 between neighboring semiconductor fins 30. The trenches are subsequently filled with one or more dielectric layers to form the hybrid fins 34 therein. After the formation of the hybrid fins 34, a planarization process, such as a chemical mechanical polishing (CMP) process, is performed to remove the excessive isolation layer 36 and hybrid fins 34 until the semiconductor fins 30 are exposed.

In some embodiments, the hybrid fins 34, also referred to as dummy fins or dielectric fins, include a high-k dielectric material layer, a low-k dielectric material layer, or a bi-layer dielectric material including high-k upper part and a low-k lower part. In some embodiments, the hybrid fins 34 include a high-k metal oxide, such as $HfO_2$, $ZrO_2$, $HfAlO_x$, $HfSiO_x$, $Al_2O_3$, and the like, a low-k material such as SiONC, SiCN, SiOC, or other dielectric material.

In some embodiments, a width W2 of the hybrid fins 34 along the Y direction is in a range from about 3 nm to about 50 nm. In some embodiments, the hybrid fins 34 may extend to the level of the buffer layer 14. For example, the bottom of the hybrid fin 34 may be at a height H1 below the top of the buffer layer 14 along the Z direction. In some embodiments, the height H1 is in a range between about 5 nm and 8 nm.

Figure 4:
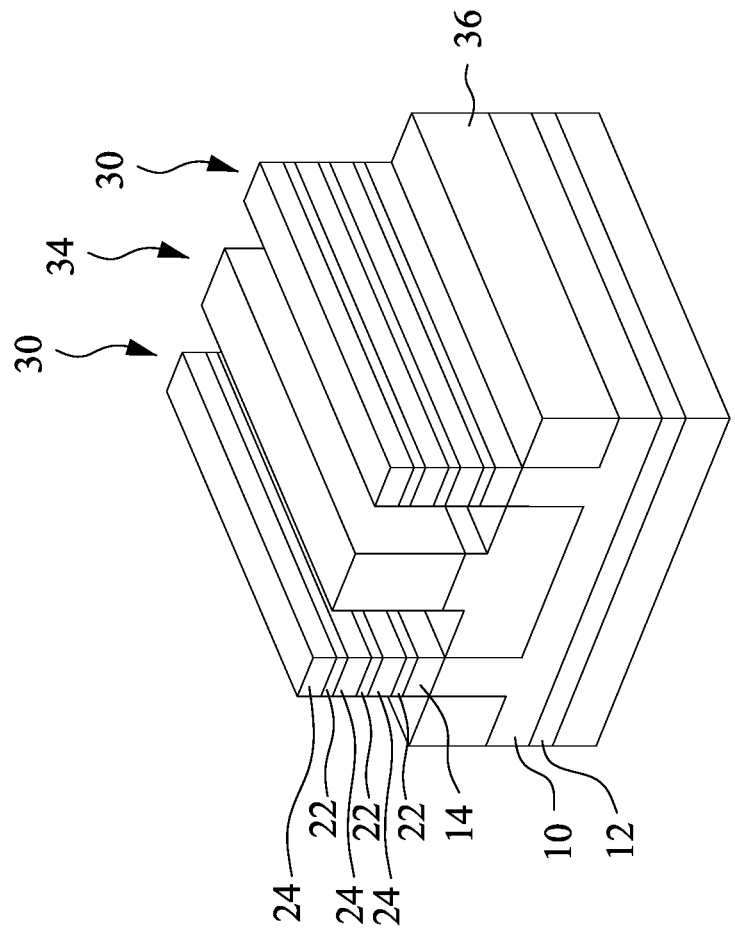
Figure 4:
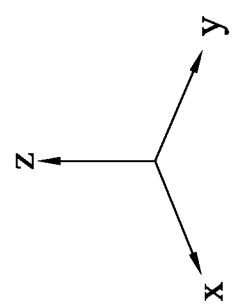

In FIG. 4, the isolation layer 36 is recess etched using a suitable anisotropic etching process to expose the semiconductor fins 30 and the hybrid fins 34. In some embodiments, the isolation layer 36 is etched to expose at least a portion of the buffer layer 14 in the semiconductor fins 30.

Figure 5A:
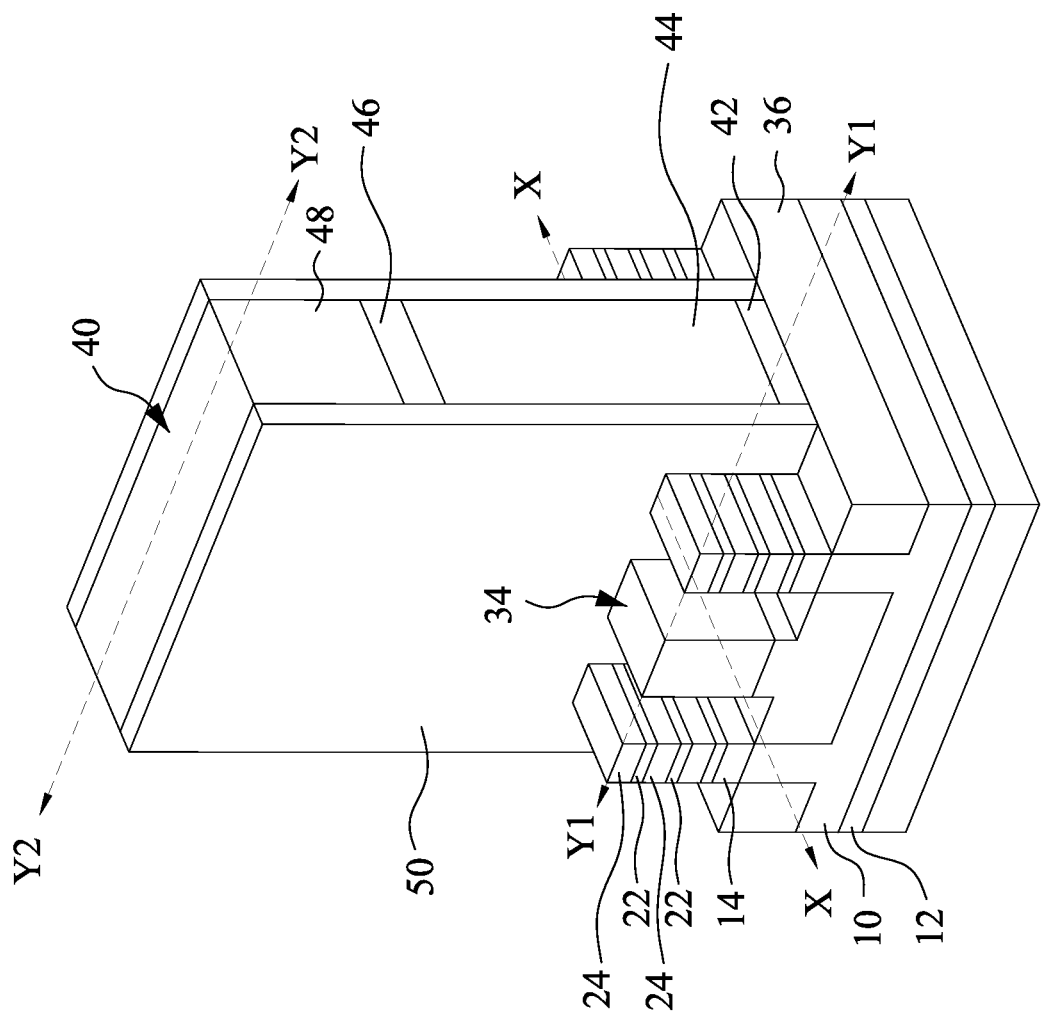
Figure 5D:
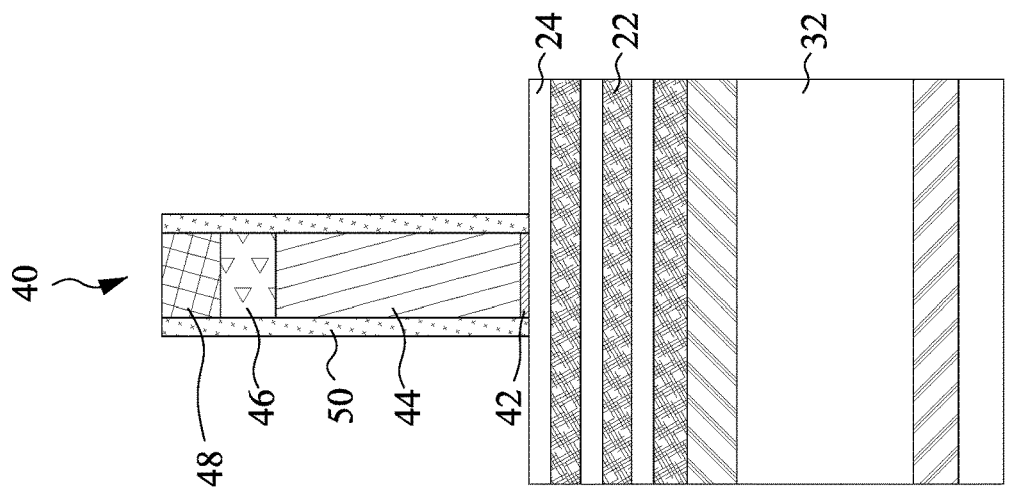
Figure 5C:
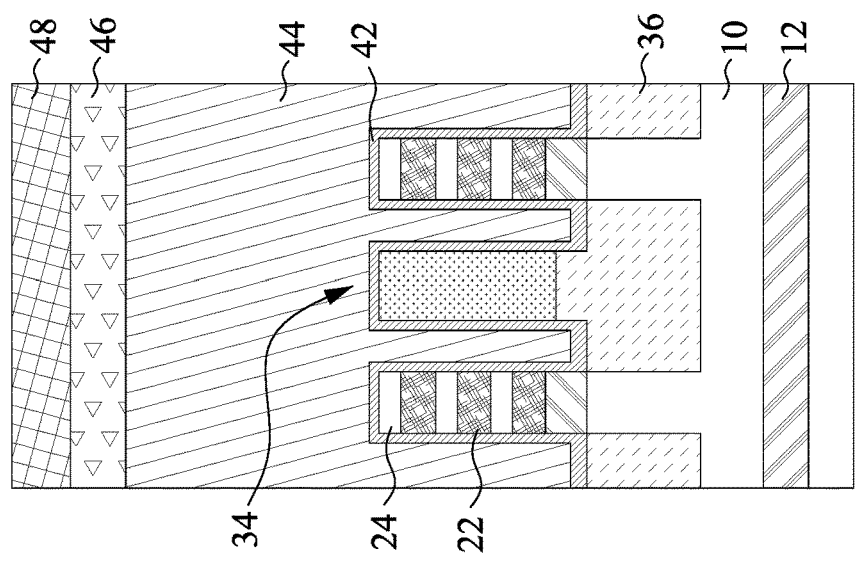
Figure 5B:
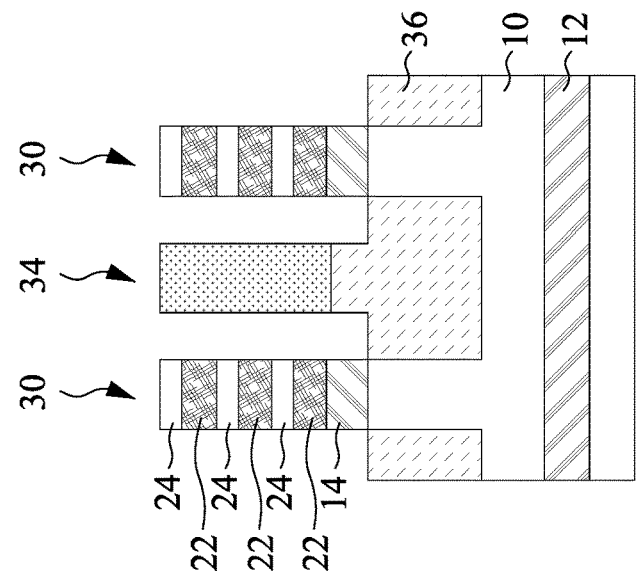

In FIGS. 5A-5D to FIGS. 18A-18D, FIGS. 5B-18B are cross sectional views corresponding to line Y1-Y1 in FIG. 5A. FIGS. 5C-18C are cross sectional views corresponding to line Y2-Y2 in FIG. 5A. FIGS. 5D-18D are across sectional views corresponding to line X-X in FIG. 5A.

In FIGS. 5A-5D, sacrificial gate structures 40 are formed over the semiconductor fins 30 and the hybrid fins 34. Sidewall spacers 50 are subsequently formed on sidewalls of each sacrificial gate structure 40. The sacrificial gate structure 40 is formed over a portion of the semiconductor fin 30 which is to be a channel region. The sacrificial gate structure 40 may include a sacrificial gate dielectric layer 42, a sacrificial gate electrode layer 44, a pad layer 46, and a mask layer 48.

The sacrificial gate dielectric layer 42 is formed by a blanket deposition over the semiconductor fins 30 and the hybrid fins 34. The sacrificial gate dielectric layer 42 includes one or more layers of insulating material, such as a silicon oxide-based material. In some embodiments, silicon oxide formed by CVD is used. In some embodiments, the sacrificial gate dielectric layer 42 has a thickness in a range between about 1 nm and about 5 nm.

The sacrificial gate electrode layer 44 is then blanket deposited on the sacrificial gate dielectric layer 42 and over the semiconductor fins 30 and the hybrid fins 34, such that the fin structures are fully embedded in the sacrificial gate electrode layer 44. The sacrificial gate electrode layer 44 includes silicon such as polycrystalline silicon or amorphous silicon. The thickness of the sacrificial gate electrode layer is in a range between about 100 nm and about 200 nm. In some embodiments, the sacrificial gate electrode layer 44 is subjected to a planarization operation. The sacrificial gate electrode layer 44 may be deposited using CVD, including LPCVD and PECVD, PVD, ALD, or other suitable process.

Subsequently, the pad layer 46 and the mask layer 48 are formed over the sacrificial gate electrode layer 44. The pad layer 46 may include silicon nitride. The mask layer 48 may include silicon oxide. Next, a patterning operation is performed on the mask layer 48, the pad layer 46, the sacrificial gate electrode layer 44, and the sacrificial gate dielectric layer 42 to form the sacrificial gate structure 40.

After the sacrificial gate structure 40 is formed, the sidewall spacers 50 are formed by a blanket deposition of an insulating material followed by anisotropic etch to remove insulating material from horizontal surfaces. The sidewall spacers 50 may have a thickness in a range between about 2 nm and about 10 nm. In some embodiments, the insulating material of the sidewall spacers 50 is a silicon nitride-based material, such as SiN, SiON, SiOCN or SiCN and combinations thereof.

In FIGS. 6A-6D, the semiconductor fins 30 on opposite sides of the sacrificial gate structure 40 are recess etched, forming source/drain spaces 52 and 54 between the neighboring hybrid fins 34 on either side of the sacrificial gate structure 40. The first semiconductor layers 22 and the second semiconductor layers 24 in the semiconductor fins 30 are etched down on both sides of the sacrificial gate structure 40 using one or more lithography and etching operations. In some embodiments, all layers in the semiconductor stack 20 of the semiconductor fins 30 are etched to expose the well portion 32 of the semiconductor fin 30. In some embodiments, suitable dry etching and/or wet etching may be used to remove the first semiconductor layers 22, the second semiconductor layer 24, and the buffer layer 14, together or separately.

Figure 6A:
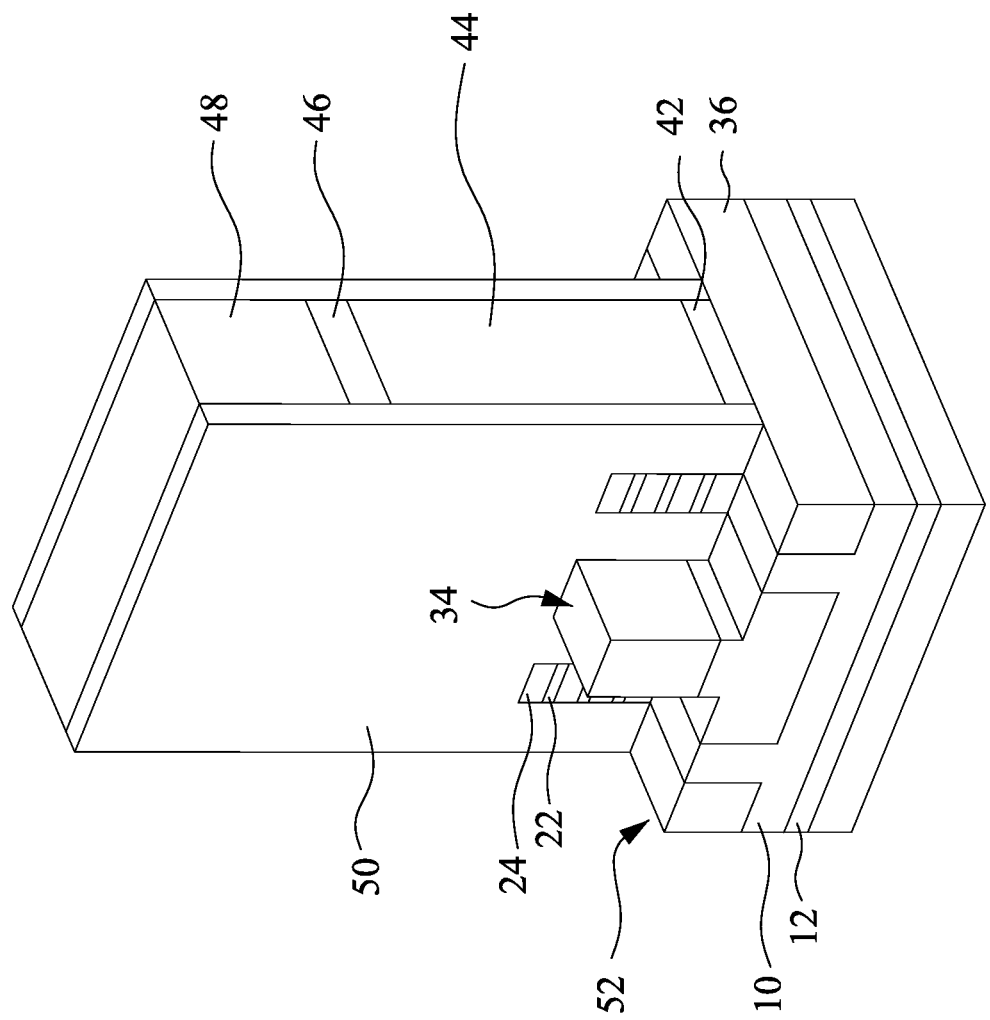
Figure 7A:
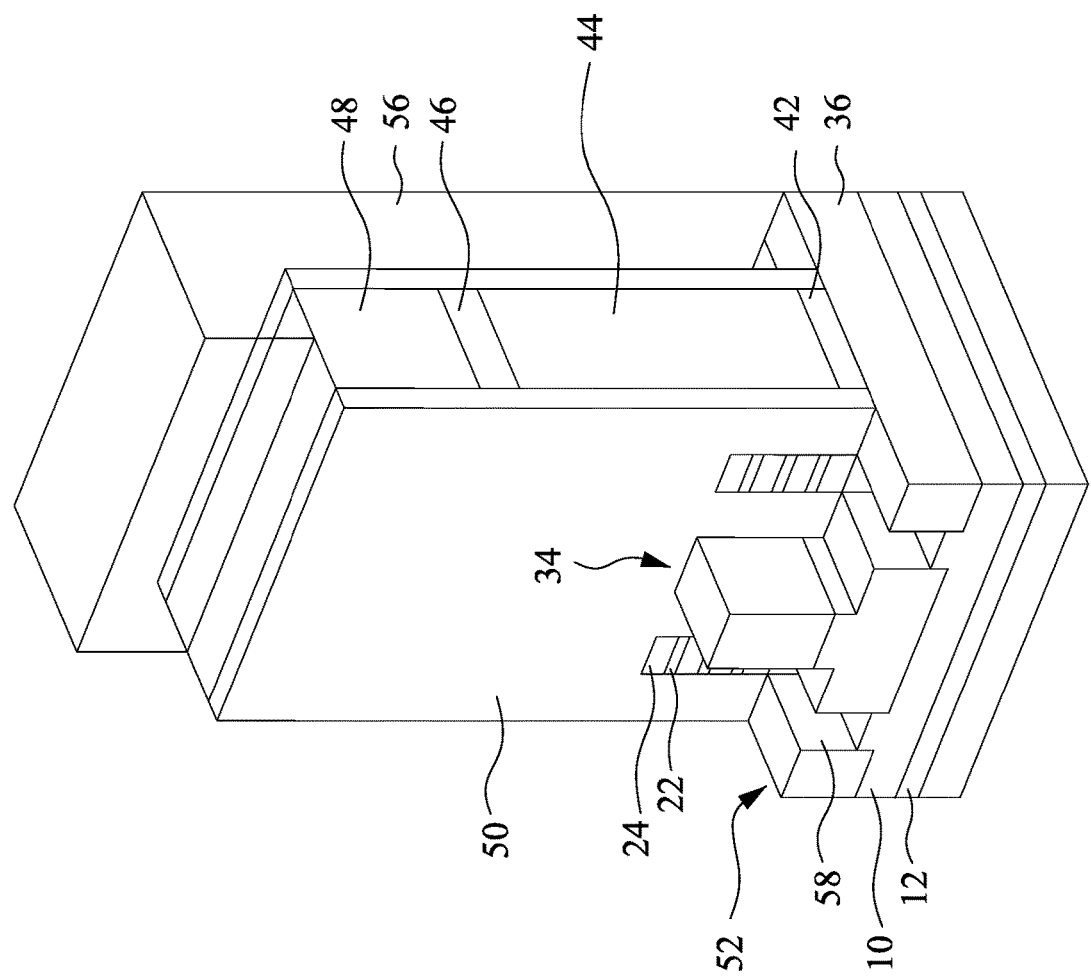
Figure 7D:
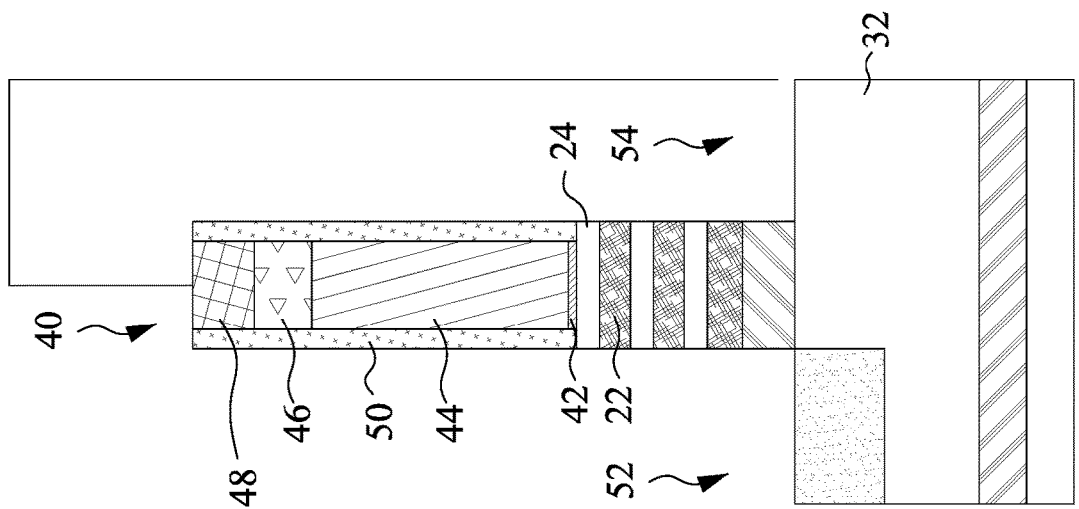
Figure 7C:
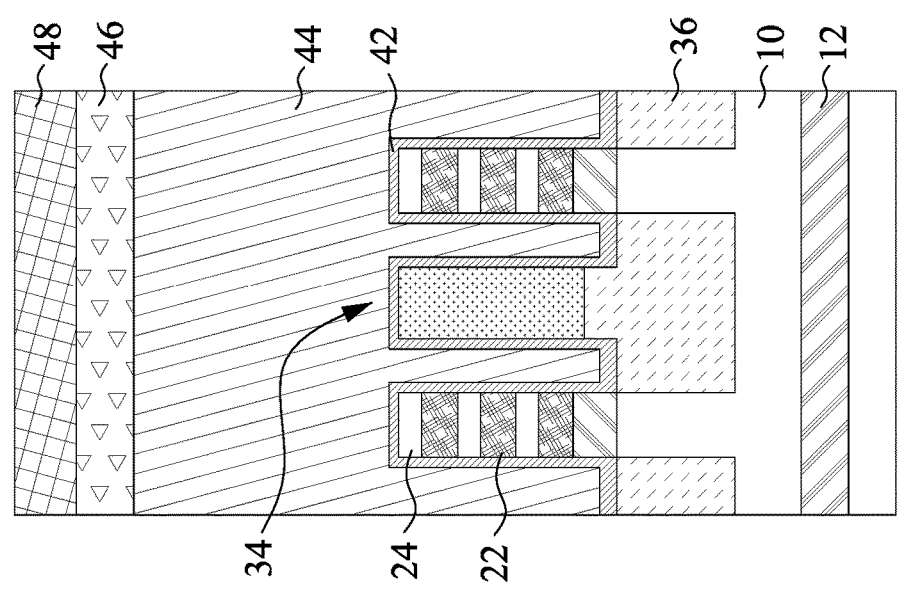
Figure 7B:
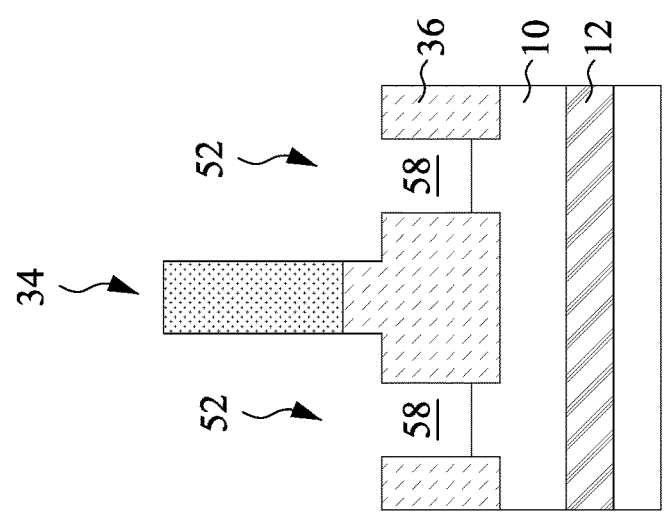
Figure 8A:
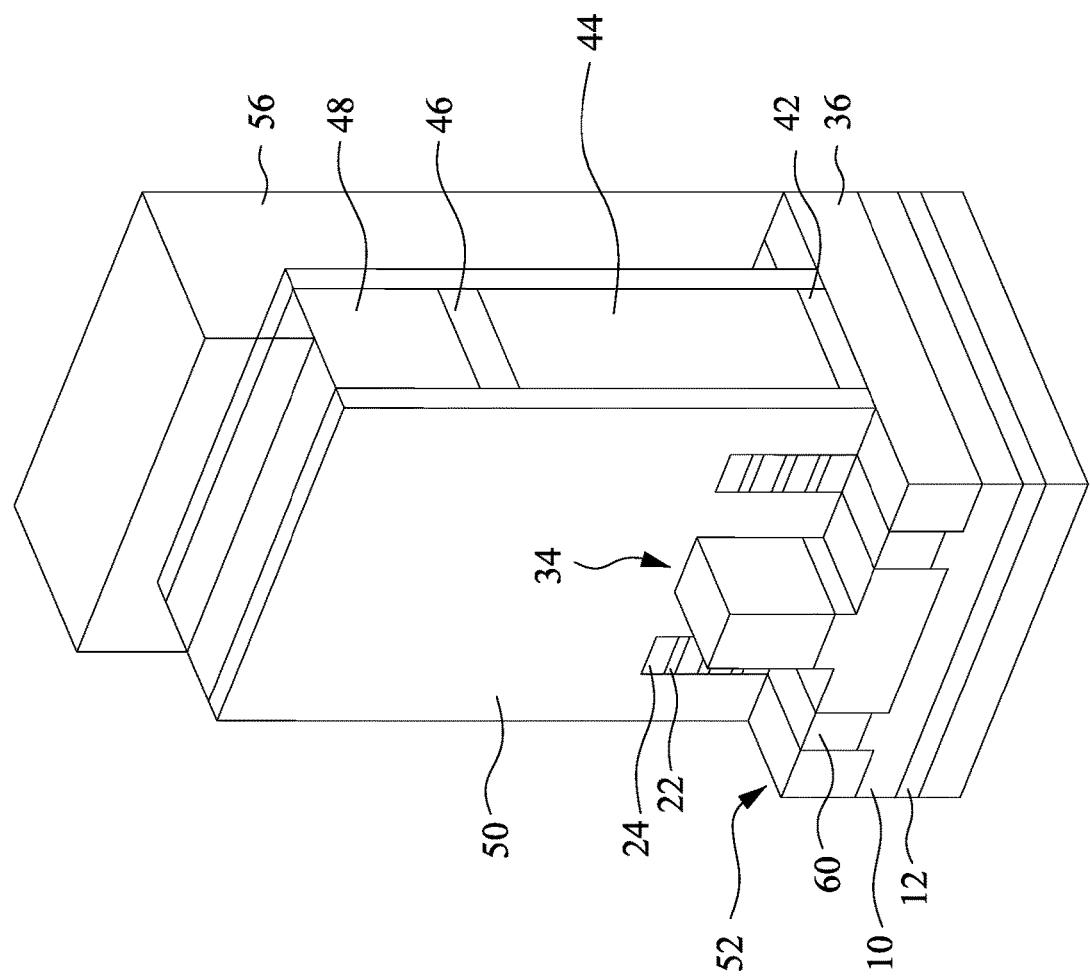
Figure 8D:
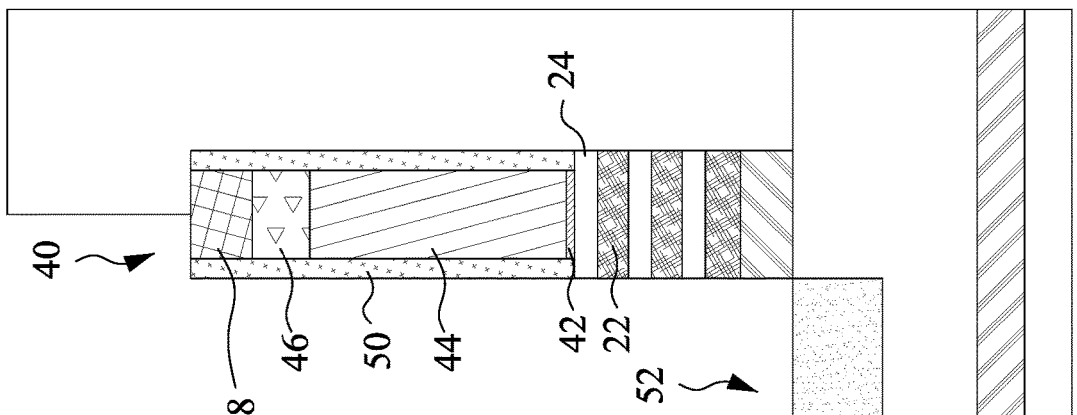
Figure 8C:
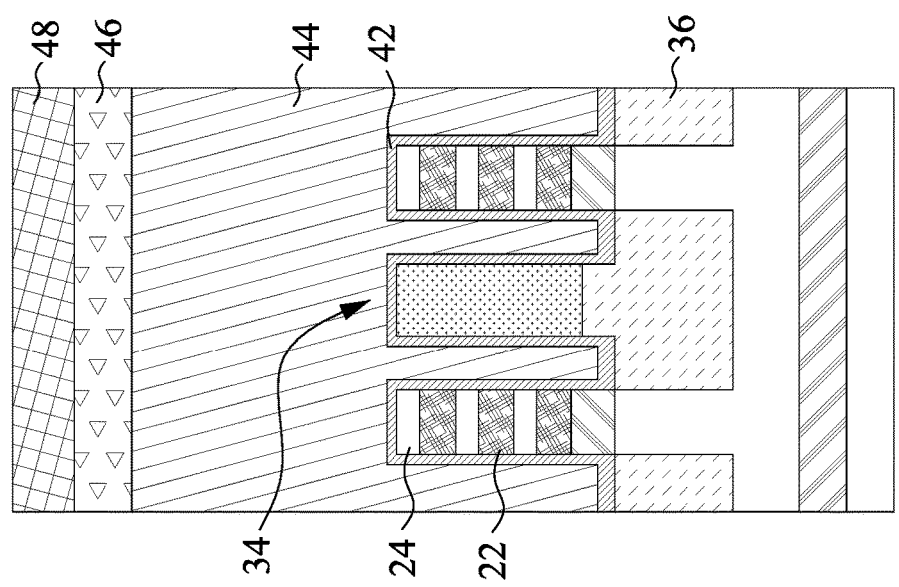
Figure 8B:
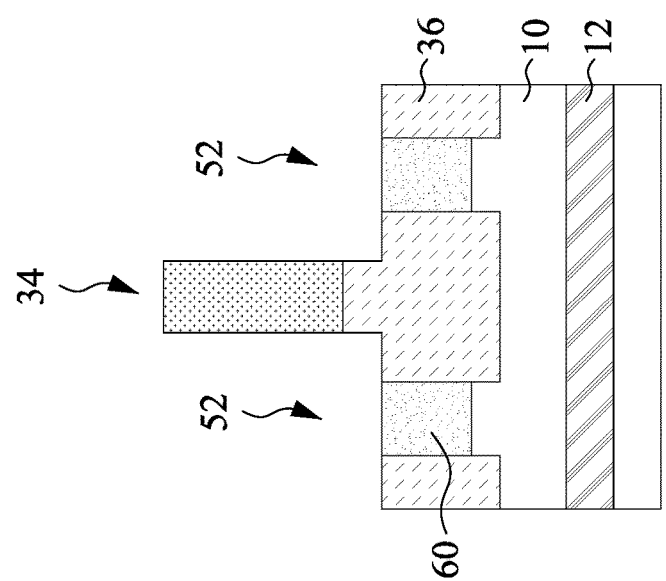

As shown in FIGS. 6A and 6B, the hybrid fins 34 separate neighboring source/drain spaces 52 on one side of the sacrificial gate structure 40. Similarly, the hybrid fins 34 also separate neighboring source/drain spaces 54 on opposite side of the sacrificial gate structure 40.

In FIGS. 7A-7D, the remaining portions of the semiconductor fins 30 corresponding to regions below the source/drain space 52, 54 to be connected to a power rail therebelow are further etched to form alignment recesses 58. A patterned protective layer 56, such as a patterned stack including a photoresist layer and hard mask layer, may be used to expose areas where the alignment recesses 58 are to be formed and to protect areas where the alignment recesses 58 are not to be formed. Suitable dry etching and/or wet etching is used to remove at least part of the well portions 32 of the semiconductor fins 30 to form the alignment recesses 58. Each alignment recess 58 has a height "H2", which is a distance measured from the top of the buffer layer 14 to the bottom of the alignment recess 58. In some embodiments, the height H2 is in a range between about 10 nm and about 30 nm.

In FIGS. 8A-8D, backside contact alignment features 60 are formed in the alignment recesses 58 by any suitable method, such as by CVD, CVD epitaxy, molecular beam epitaxy (MBE), or any suitable deposition technique. In some embodiments, the backside contact alignment features 60 are formed by a selective deposition process. The backside contact alignment features 60 will be removed to form backside contact holes in the substrate 10 at a later stage.

The backside contact alignment features 60 are formed from a material to have etch selectivity relative to the material of the substrate 10, material in the well portions 32 of the semiconductor fins 30 and the insulating material in the isolation layer 36. During backside process, the material in the backside contact alignment features 60 allows portions of the semiconductor fins 30 in the channel region and opposite source/drain region to be selectively removed from the backside contact alignment features 60. Additionally, the backside contact alignment features 60 can be selectively removed without etching the dielectric materials in the isolation layers 36.

In some embodiments, the backside contact alignment features 60 may include SiGe, such as a single crystal SiGe material. In some embodiments, the backside contact alignment features 60 is formed from SiGe having a germanium composition percentage between about 50% and 95%. Alternatively, the backside contact alignment features 60 may include other materials such as Si, Ge, a compound semiconductor such as SiC, GeAs, GaP, InP, InAs, and/or InSb, an alloy semiconductor such as GaAsP, AlInAs, AlGaAs, InGaAs, GaInP, and/or GaInAsP, or combinations thereof. After the formation of the backside contact alignment features 60 on one side of the sacrificial gate structure 40, the patterned protective layer 56 formed on the other side of the sacrificial gate structure 40 is removed.

Figure 9A:
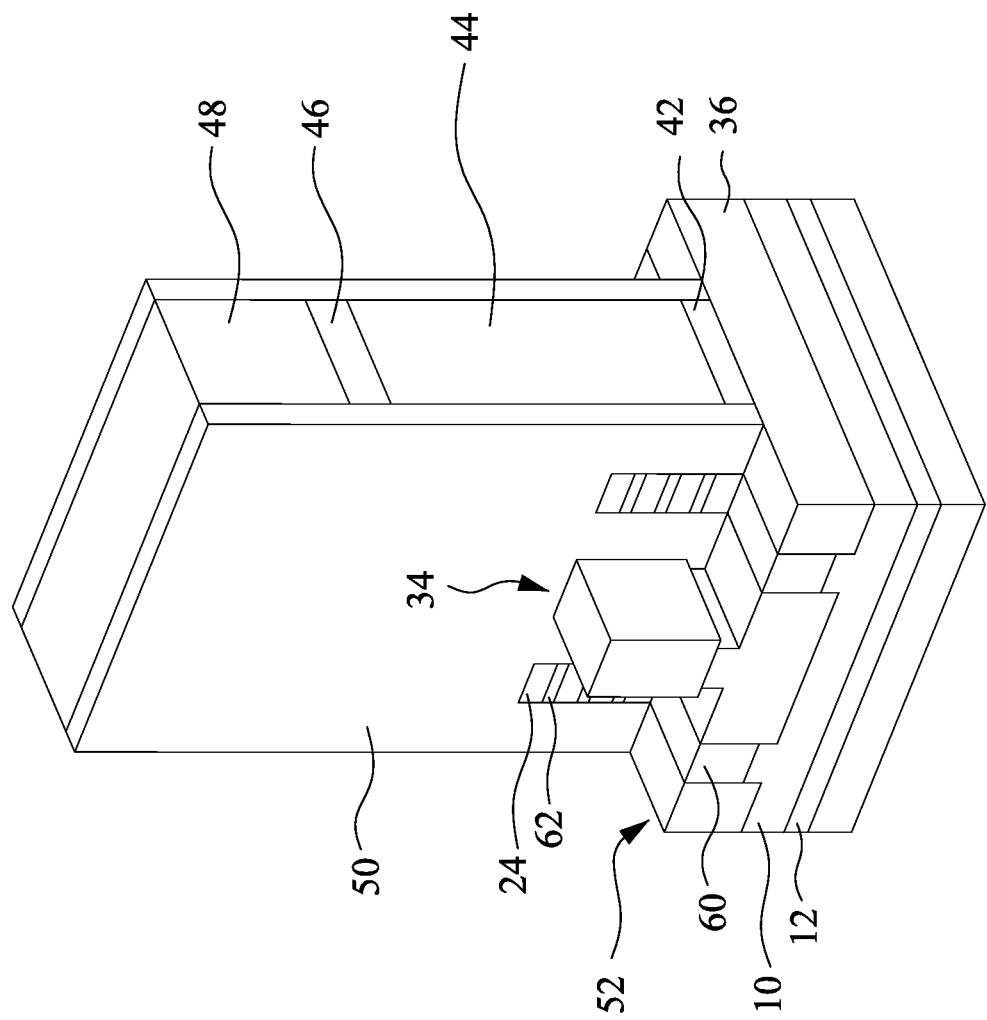

In FIGS. 9A-9D, inner spacers 62 are formed on exposed ends of the first semiconductor layers 22 under the sacrificial gate structure 40. The first semiconductor layers 22 exposed to the source/drain spaces 52, 54 are first etched horizontally along the X direction to form cavities. In some embodiments, the first semiconductor layers 22 can be selectively etched by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. In some embodiments, the amount of etching of the first semiconductor layer 22 is in a range between about 2 nm and about 10 nm along the X direction. By selecting an appropriate crystal orientation of the first semiconductor layers 22 and an etchant, the cavity at the end of the first semiconductor layers 22 can have different shapes, such as a rectangular shape as shown in FIG. 9D or an open-triangle shape (not shown).

After forming cavities in the first semiconductor layers 22, the inner spacers 62 can be formed in the cavities by conformally deposit and then partially remove an insulating layer. The insulating layer can be formed by ALD or any other suitable method. In some embodiments, the insulating layer may include one of silicon nitride (SiN) and silicon oxide ($SiO_2$) and have a thickness in a range from about 0.5 nm to about 3.0 nm. The subsequent etch process removes most of the insulating layer except inside the cavities, resulting in the inner spacers 62.

Figure 10A:
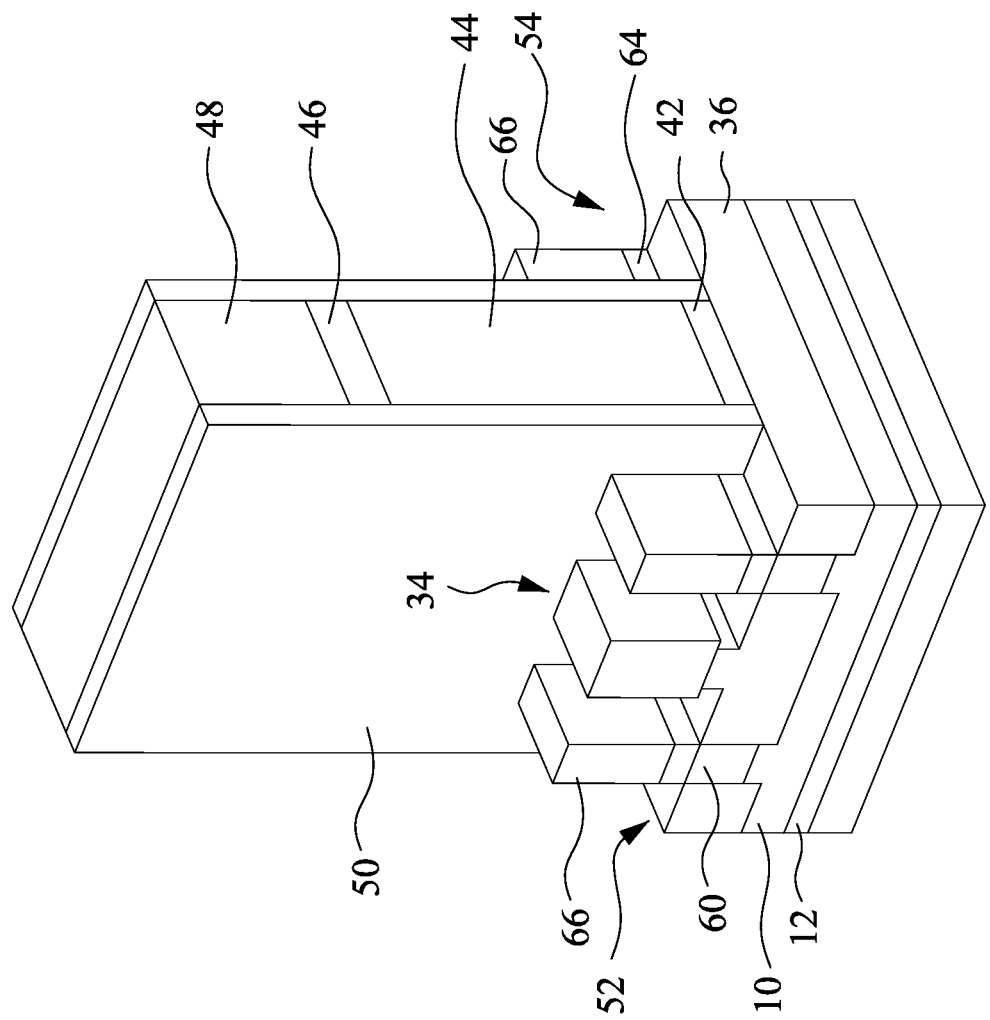
Figure 10D:
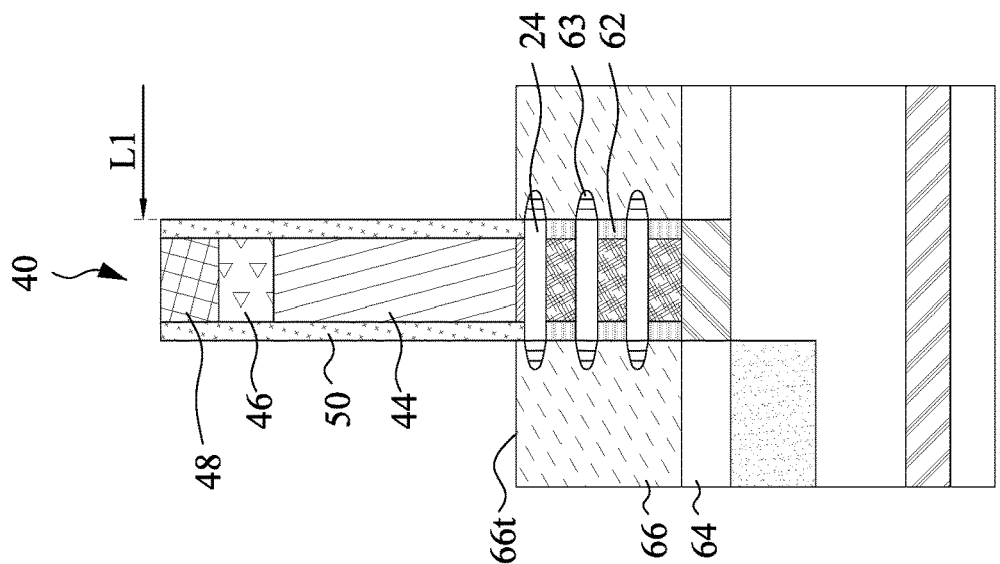
Figure 10C:
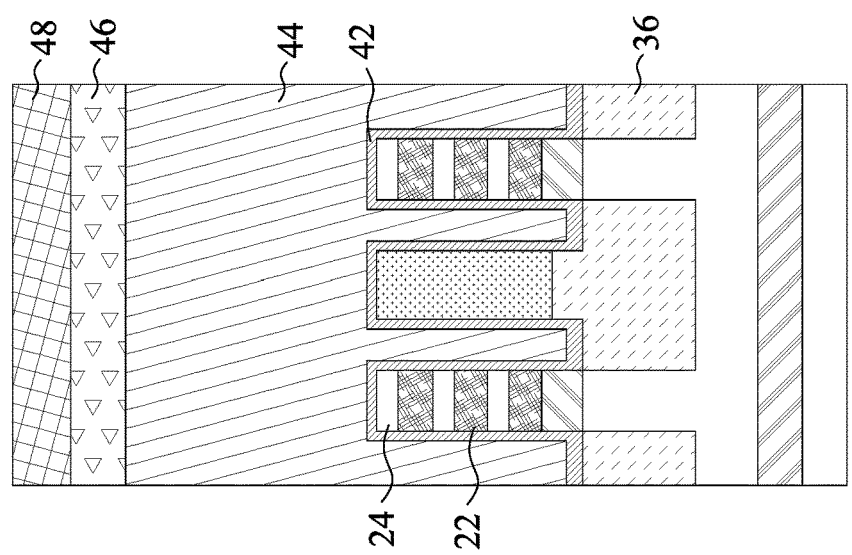
Figure 10B:
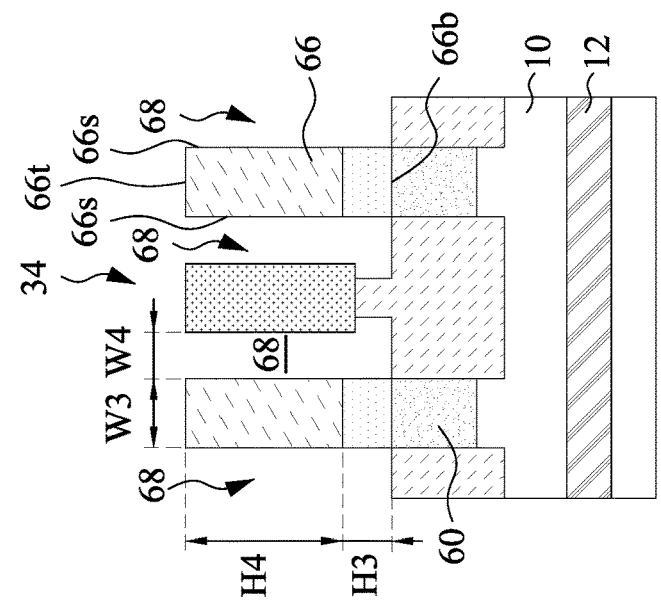
Figure 11A:
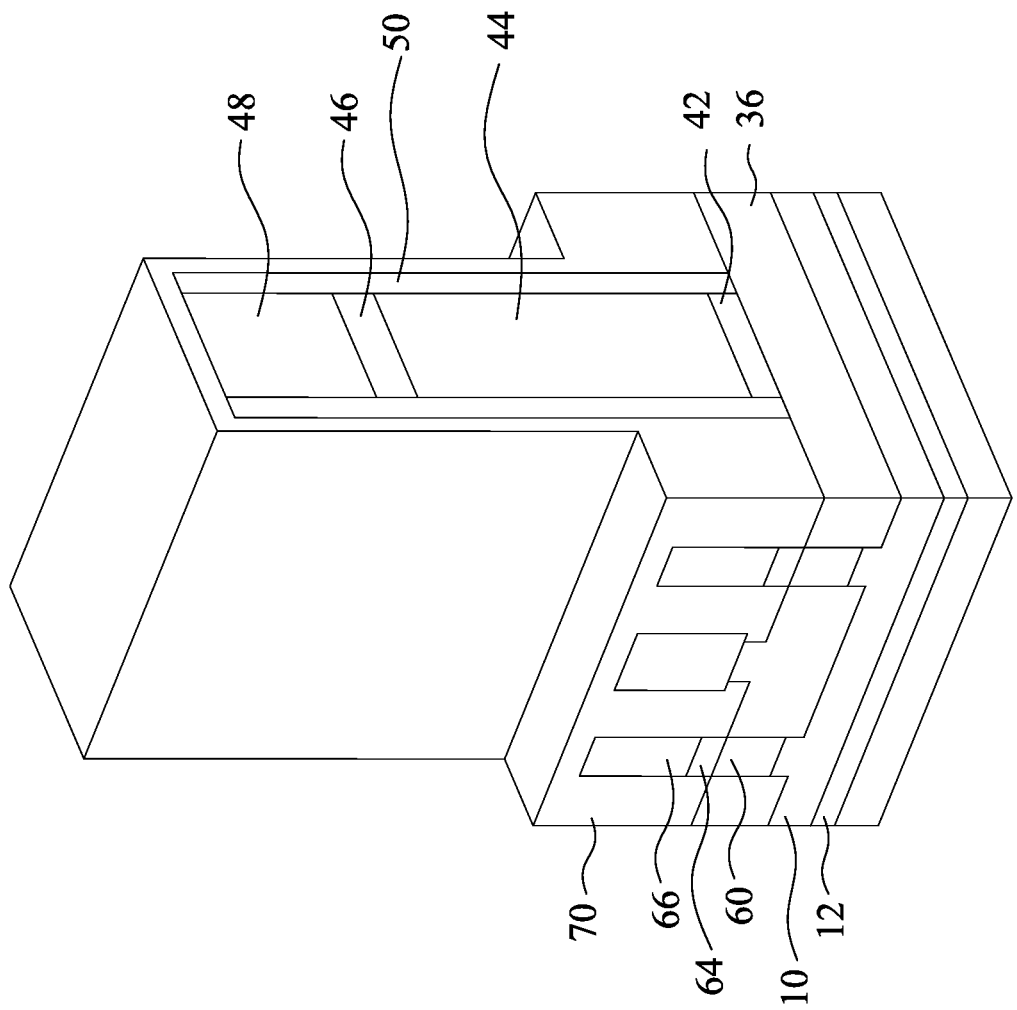
Figure 11A:
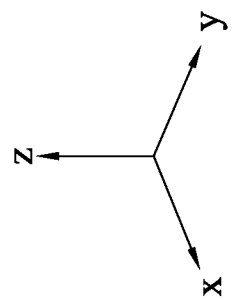
Figure 12A:
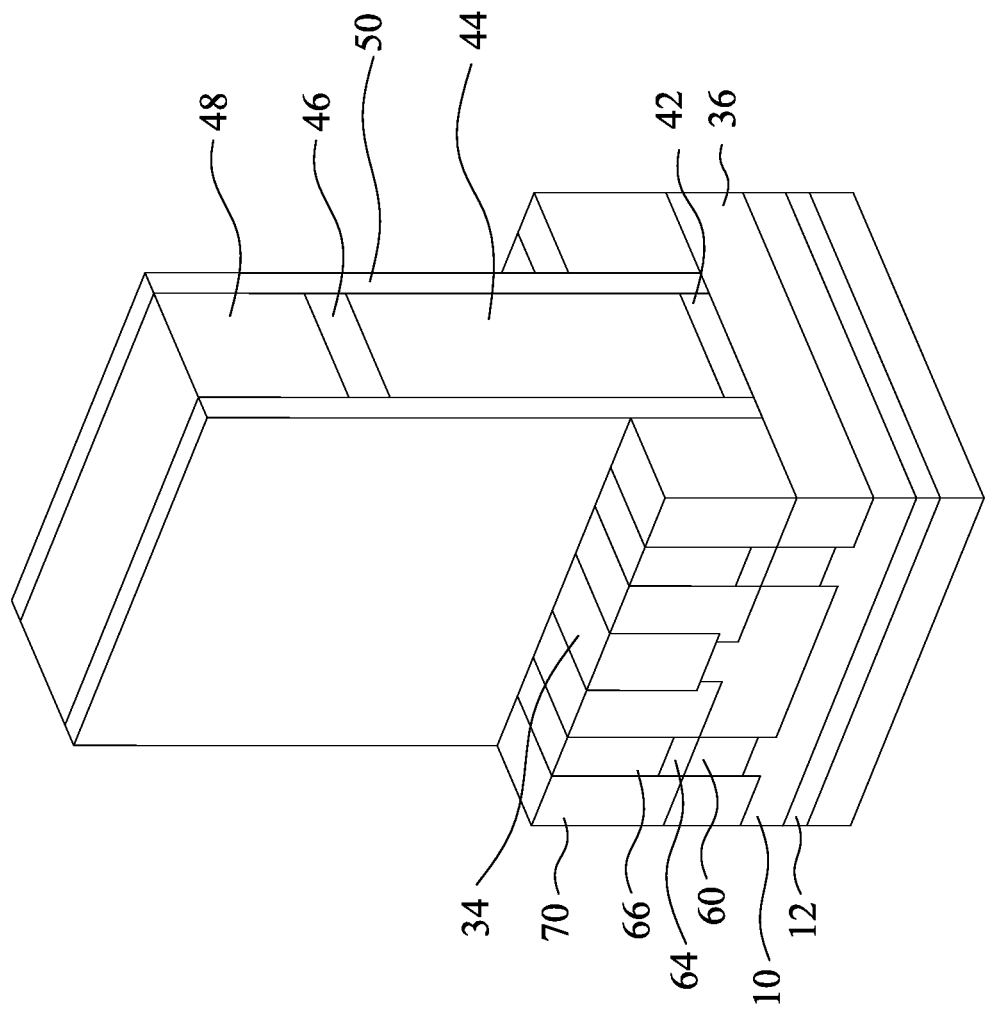
Figure 12D:
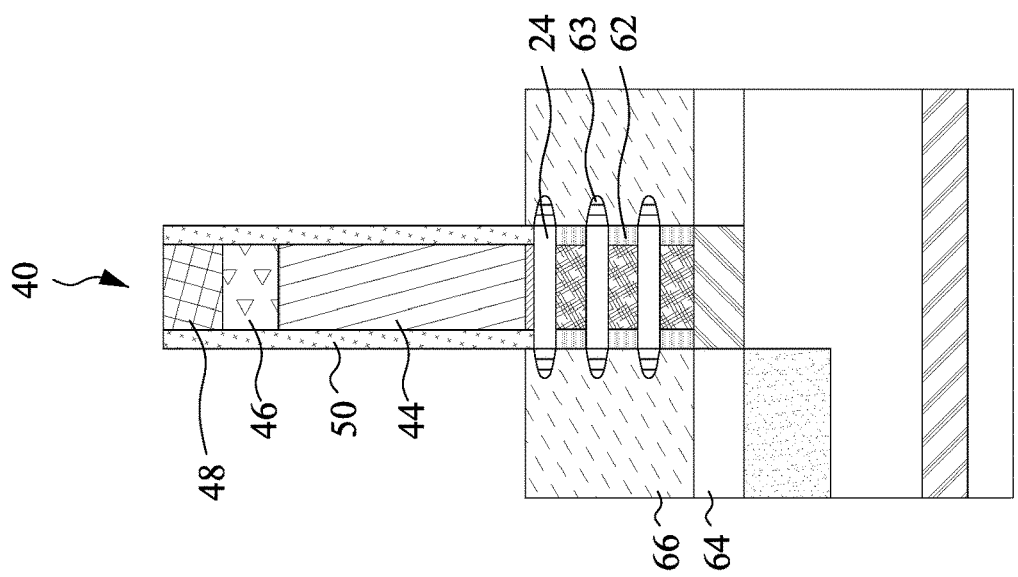
Figure 12C:
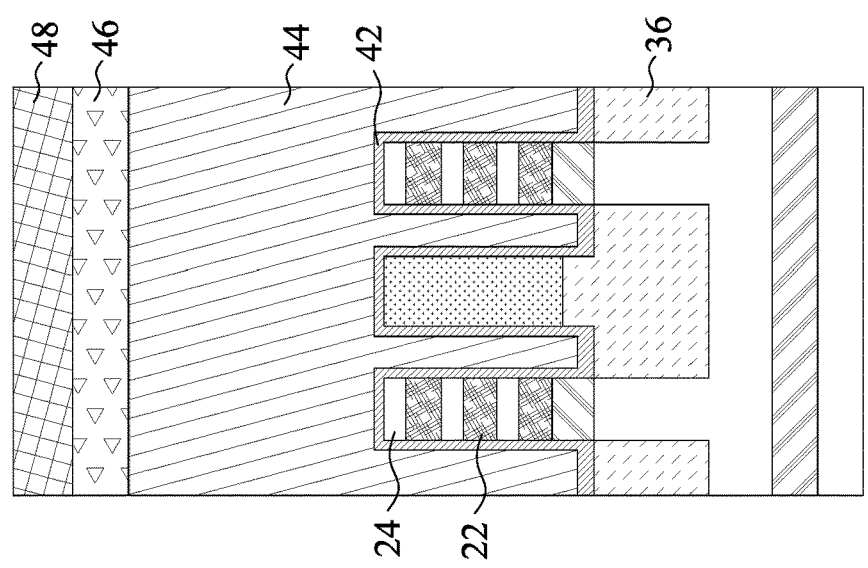
Figure 12B:
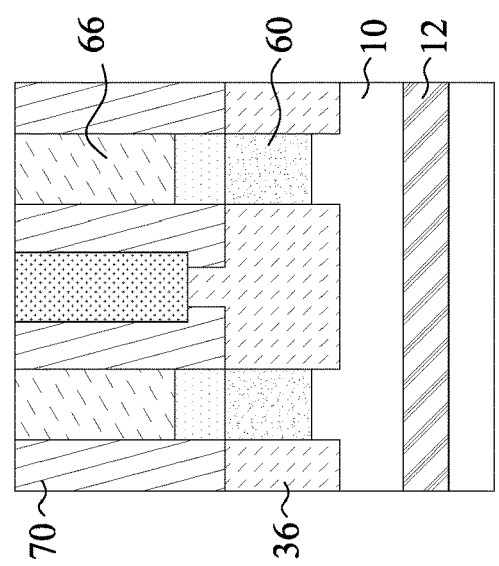
Figure 13A:
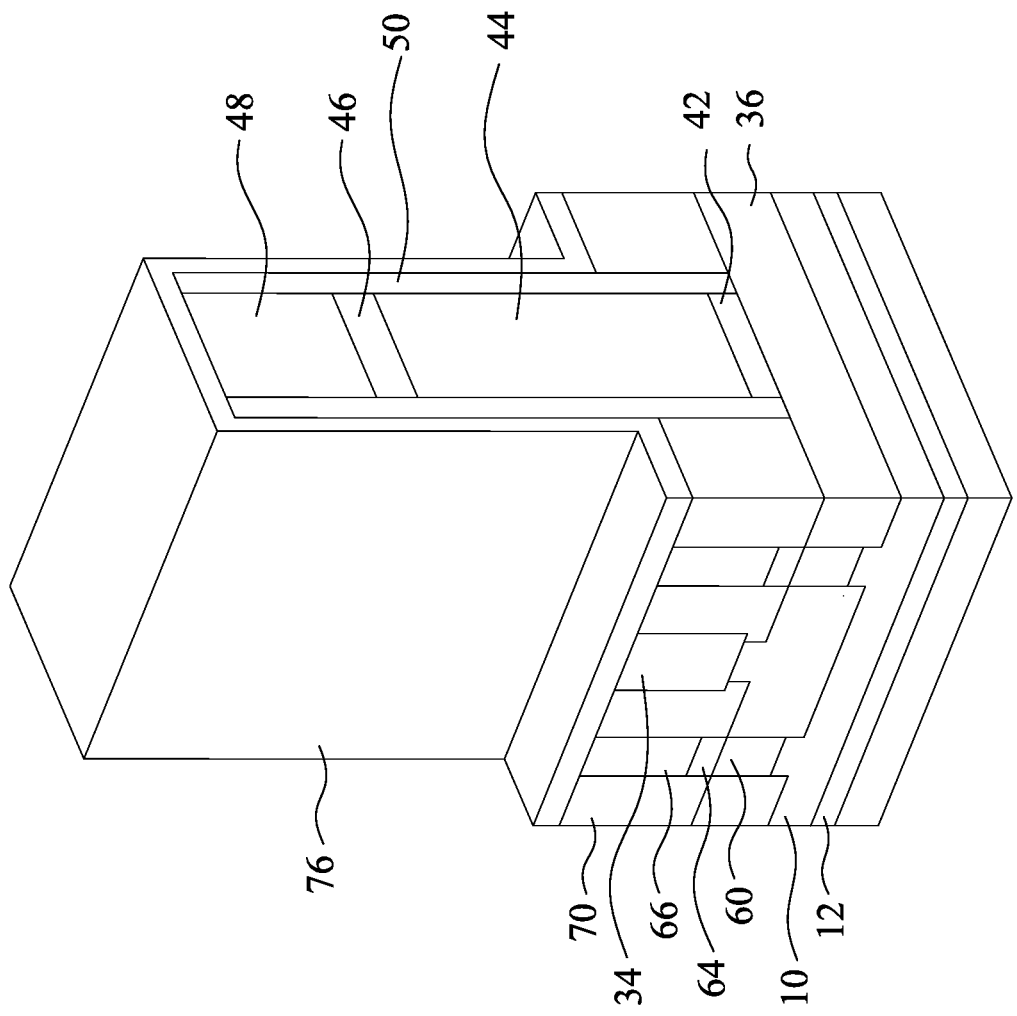
Figures 13B, 13C, 13D:
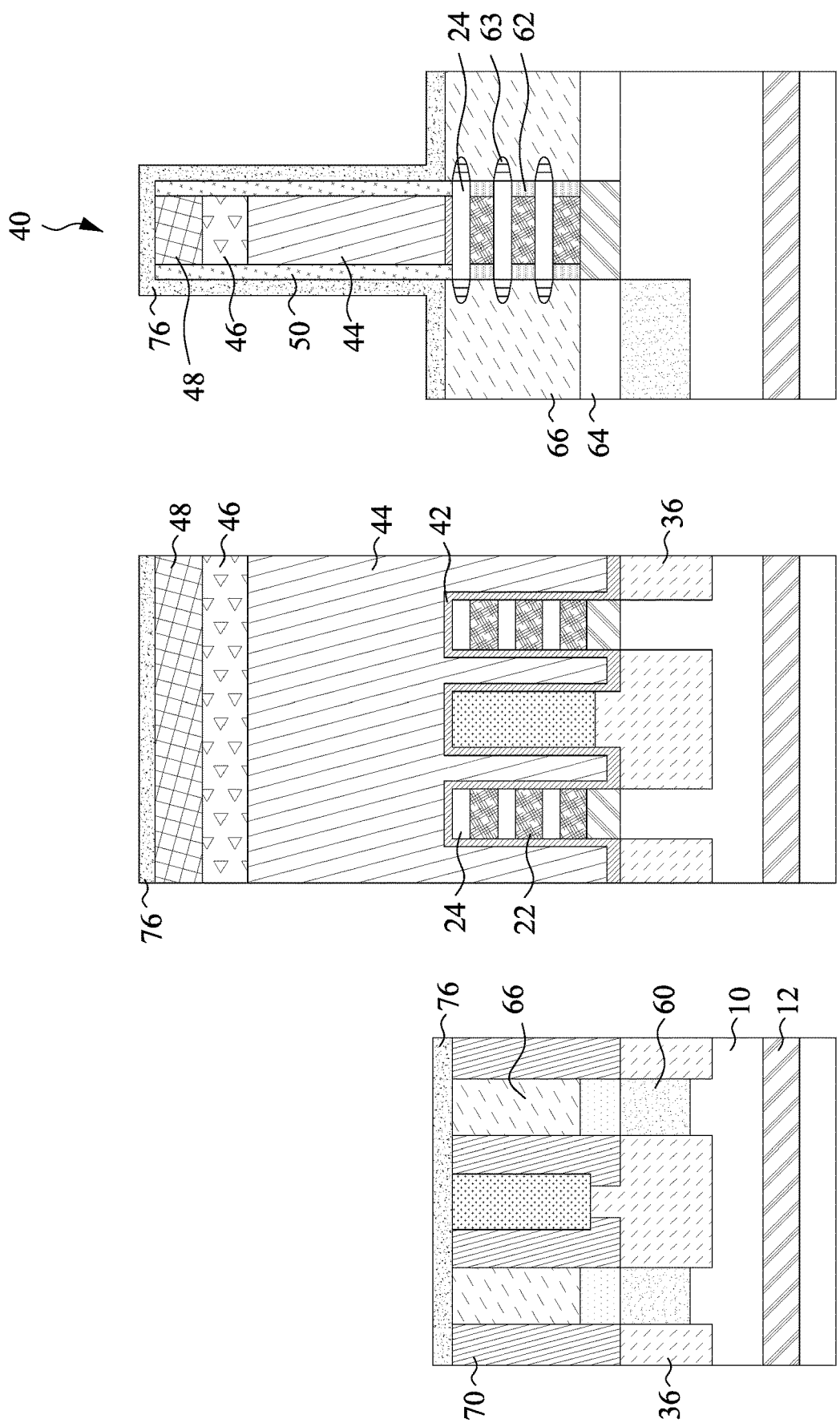
Figure 14A:
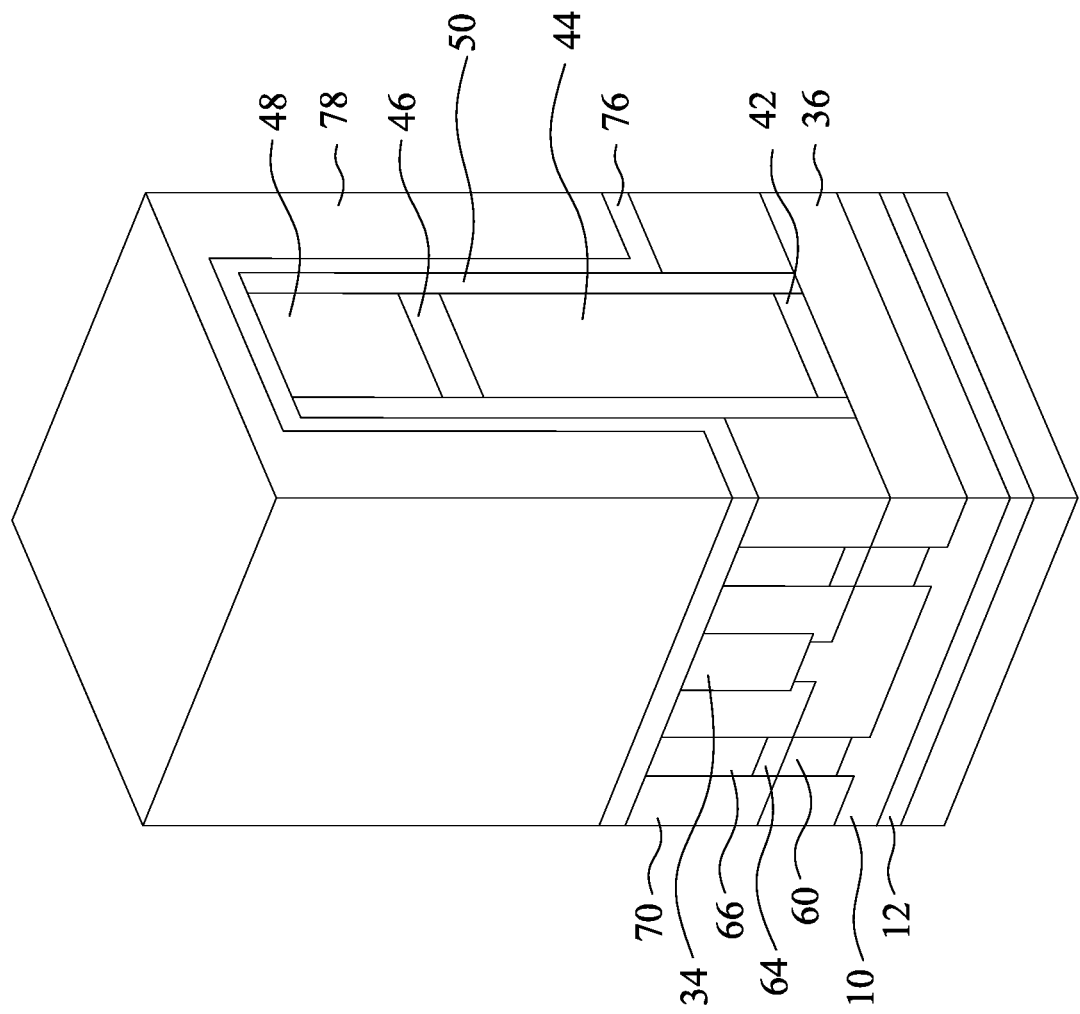
Figure 14D:
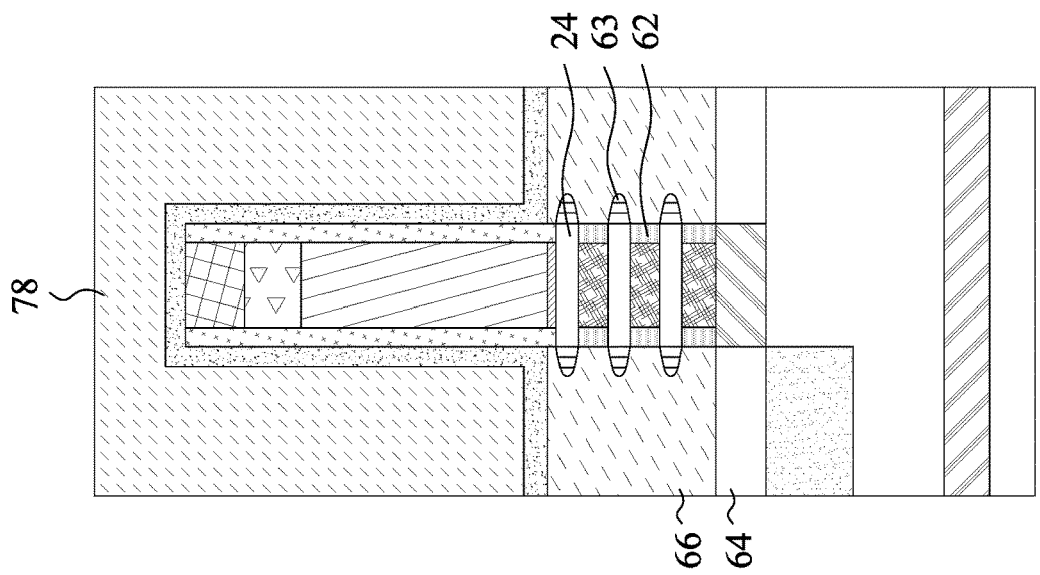
Figure 14C:
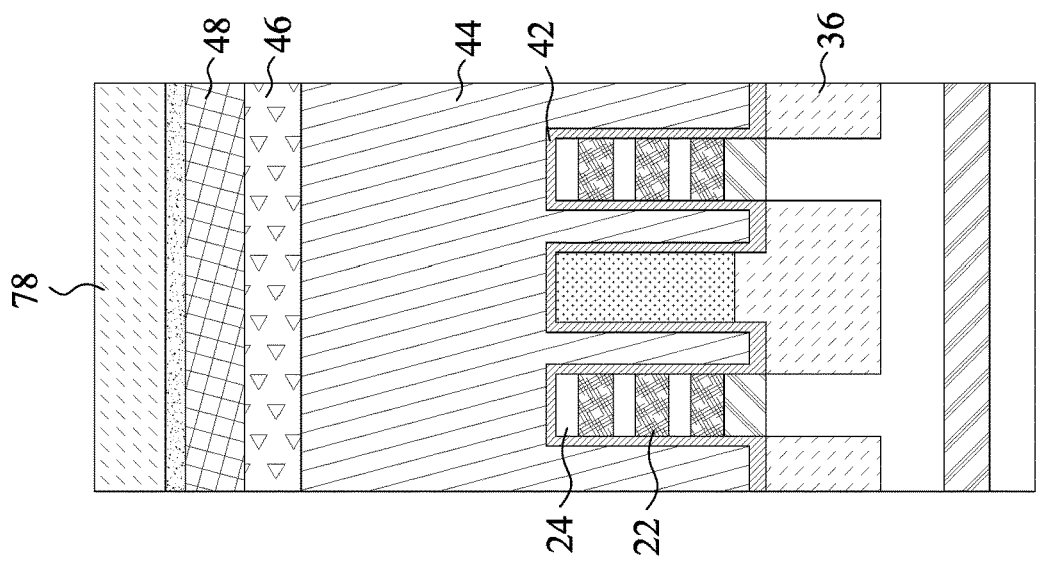
Figure 14B:
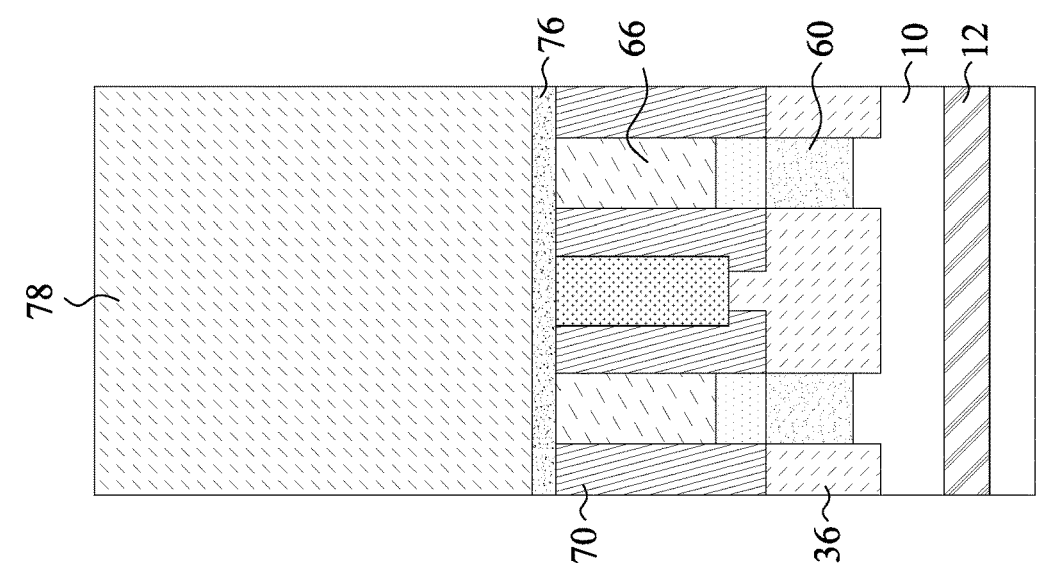

In FIGS. 10A-10D, epitaxial source/drain features 66 are formed in the source/drain spaces 52, 54. In some embodiments, a preclean process may be performed prior to epitaxial growth of semiconductor material in the source/drain spaces 52, 54. As shown in FIG. 10B, exposed areas of the isolation layers 36 may be recessed during the preclean process.

Transitional epitaxial layer 64 may be first formed on the exposed surfaces, such as the exposed surfaces of the backside contact alignment features 60 in the source/drain spaces 52 and the exposed surfaces of the semiconductor fins 30 in the source/drain spaces 54. The transitional epitaxial layer 64 function to provide a bridge of lattice structures between the existing semiconductor features, such as the backside contact alignment features 60 or the remaining portion of the semiconductor fins 30, and the epitaxial source/drain features 66 to be formed. In some embodiments, the transitional epitaxial layer 64 is formed from Si, SiGe, SiGeB, SiP, SiAs, and other silicon related epitaxial materials.

In some embodiments, material of the transitional epitaxial layer 64 is selected to have different etch and/or oxidation rate relative to the material of the substrate 10, the material of the buffer layer 14, and the backside contact alignment features 60. In some embodiments, the transitional epitaxial layer 64 is formed from SiGeB when the backside contact alignment features 60 are formed from SiGe.

According to embodiments of the present disclosure, the transitional epitaxial layer 64 is grown in a bar-shape having generally rectangular cross section along the Y1-Y1 as shown in FIG. 10B so that gaps 68 are formed between the transitional epitaxial layer 64 and the hybrid fins 34. In some embodiments, the transitional epitaxial layer 64 has a height H3 along the Z direction in a range between about 5 nm and about 50 nm.

The epitaxial source/drain features 66 are formed over the transitional epitaxial layer 64 within the source/drain spaces 52, 54. The epitaxial source/drain features 66 are formed by an epitaxial growth method using CVD, ALD or molecular beam epitaxy (MBE). The epitaxial source/drain features 66 may include one or more layers of Si, SiP, SiC and SiCP for NFET or Si, SiGe, Ge for a PFET. For the PFET, p-type dopants, such as boron (B), may also be included in the epitaxial source/drain features 66. As shown in FIG. 10D, the epitaxial source/drain features 66 are formed in contact with the second semiconductor layers 24 under the sacrificial gate structure 40 through transitional regions 63.

According to embodiments of the present disclosure, the epitaxial source/drain features 66 are formed in a bar-shape, having generally rectangular cross section along the Y1-Y1 as shown in FIG. 10B. The bar-shape can be achieved by selecting an appropriate crystal orientation for epitaxial growth. In some embodiments, the bar-shape is achieved by selecting the <110> crystal orientation for epitaxial growth. In the cross sectional view shown in FIG. 10B, each epitaxial source/drain feature 66 has a top surface 66t, a bottom surface 66b, and two side surfaces 66s. The bottom surface 66b contacts the transitional epitaxial layer 64. Each side surface 66s faces a hybrid fin 34. After the formation of the epitaxial source/drain features 66, the gaps 68 between the epitaxial source/drain features 66 and the hybrid fins 34 are extended along the Z direction.

In some embodiments, the epitaxial source/drain features 66 have a height H4 along the Z direction in a range between about 10 nm and about 70 nm. The epitaxial source/drain features 66 have a width W3 along the Y direction. The width W3 can be smaller, larger and equal to the channel width W1, which is shown in FIG. 2. The epitaxial source/drain features 66 have a length L1 along the X direction. In some embodiments, the length L1 is in a range between about 10 nm and about 50 nm.

Each gap 68 may have a width W4 along the Y direction in a range between about 1 nm and about 15 nm. As described below, each gap 68 is first filled with a dielectric material and then replaced with a conductive material. The width W4 of the gap 68 is selected to enable formation and function of the conductive material. When the width W4 is less than 1 nm, it would be difficult to form a continuous conductive material therein, and the resistance of the conductive material would be large and not suitable as a contact for the epitaxial source/drain features 66, in some instances. When the width W4 is greater than 15 nm, the size of the epitaxial source/drain features 66 would be reduced without significant additional advantages, in some instance.

In FIGS. 11A-11D, a gap fill dielectric layer 70 is formed over the substrate 10. In some embodiments, the gap fill dielectric layer 70 is formed conformally to cover exposed surfaces on the substrate 10 by a suitable deposition process, such as atomic layer deposition (ALD). During deposition, as the thickness of the gap fill dielectric layer 70 increases, material deposited on the side surfaces 66s of the epitaxial source/drain feature 66 and film deposition on the neighboring hybrid fins 34 converge together filling the gaps 68.

In some embodiments, the gap fill dielectric layer 70 may include a low-k material, such as SiONC, SiCN, SiOC, a high-k metal oxide, such as $HfO_2$, $ZrO_2$, $HfAlO_x$, $HfSiO_x$, $Al_2O_3$, and the like, or other dielectric material. Material of the gap fill dielectric layer 70 is selected to have etch selectivity relative to the material of the epitaxial source/drain features 66 and the material of the hybrid fins 34. In some embodiments, the gap fill dielectric layer 70 is a high-k metal oxide, such as $Al_2O_3$. During backside process, the material of the gap fill dielectric layer 70 can be selectively removed without etching the epitaxial source/drain features 66.

In FIGS. 12A-12D, an isotropic etch is performed to remove the gap fill dielectric layer 70 from horizontal and vertical surfaces on the substrate, leaving the gaps 68 filled with the gap fill dielectric layer 70. Any suitable etching method can be used, for example a wet etching process with a suitable etchant can be used to remove a portion of the gap fill dielectric layer 70.

In FIGS. 13A-13D, a contact etch stop layer (CESL) 76 is formed over the substrate 10. The CESL 76 is formed on the epitaxial source/drain features 66 and the gap fill dielectric layer 70. In some embodiments, the CESL 76 has a thickness in a range between about 1 nm and about 15 nm. The CESL 76 may include $Si_3N_4$, SiON, SiCN or any other suitable material, and may be formed by CVD, PVD, or ALD.

In FIGS. 14A-14D, an interlayer dielectric (ILD) layer 78 is formed over the substrate 10. The materials for the ILD layer 78 include compounds comprising Si, O, C, and/or H, such as silicon oxide, SiCOH and SiOC. Organic materials, such as polymers, may be used for the ILD layer 78. After the ILD layer 78 is formed, a planarization operation, such as CMP, is performed to expose the sacrificial gate electrode layer 44 for subsequent removal of the sacrificial gate structures 40. The ILD layer 78 protects the epitaxial source/drain features 66 during the removal of the sacrificial gate structures 40.

In FIGS. 15A-15D, the sacrificial gate electrode layer 44 and the sacrificial gate dielectric layer 42 are removed. The sacrificial gate structures 40 can be removed using plasma dry etching and/or wet etching. When the sacrificial gate electrode layer 44 is polysilicon and the ILD layer 78 is silicon oxide, a wet etchant such as a Tetramethylammonium hydroxide (TMAH) solution can be used to selectively remove the sacrificial gate electrode layer 44 without removing the dielectric materials of the ILD layer 78, the CESL 76, and the sidewall spacers 50. The sacrificial gate dielectric layer 42 is thereafter removed using plasma dry etching and/or wet etching.

Figure 15A:
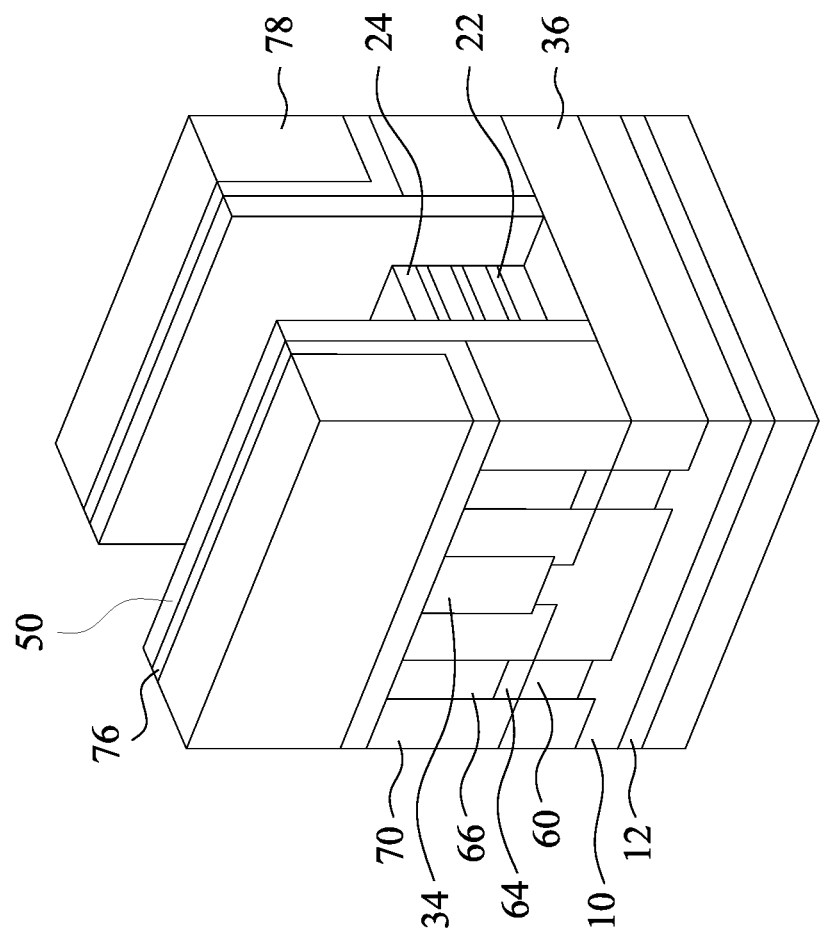
Figure 15D:
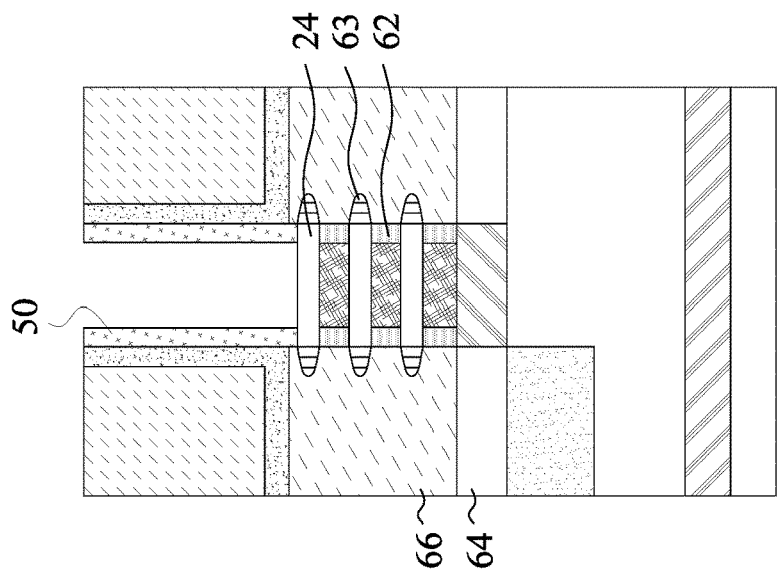
Figure 15C:
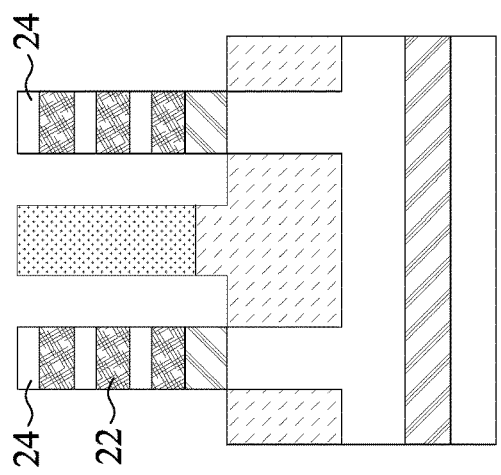
Figure 15B:
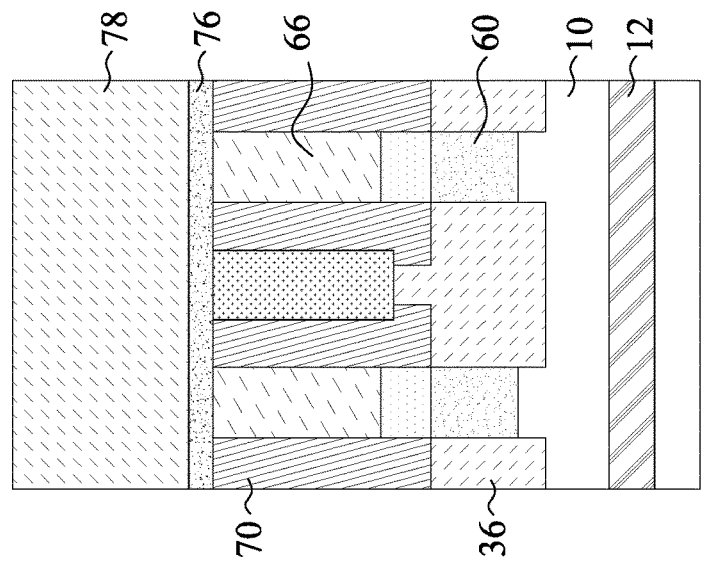
Figure 16A:
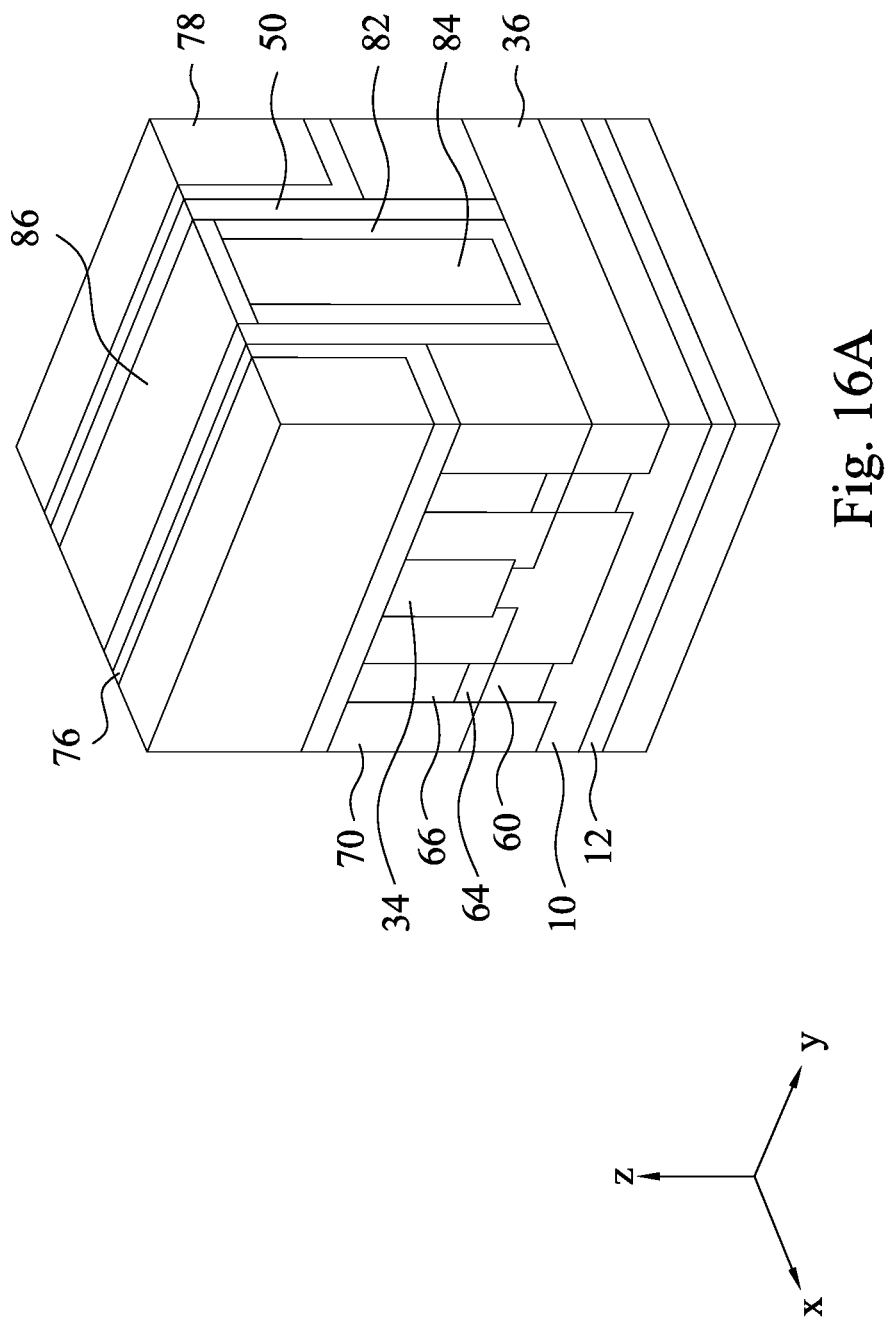
Figure 16D:
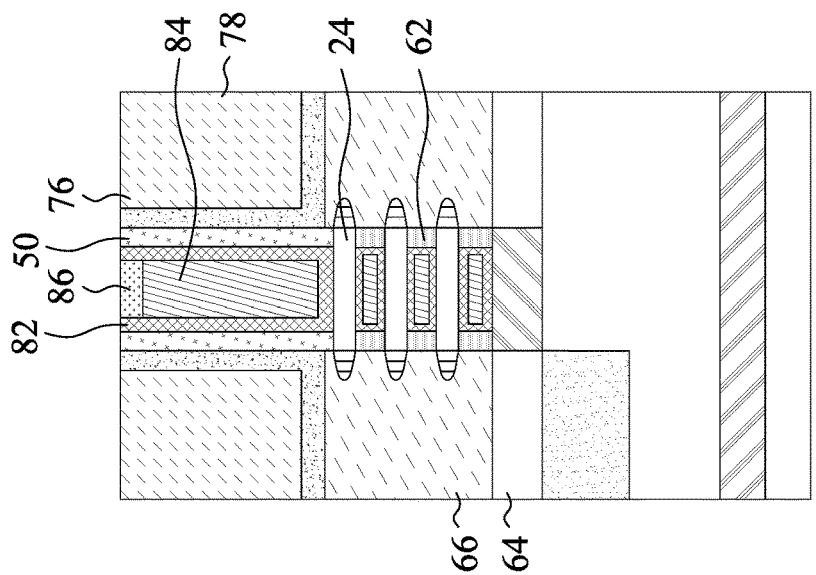
Figure 16C:
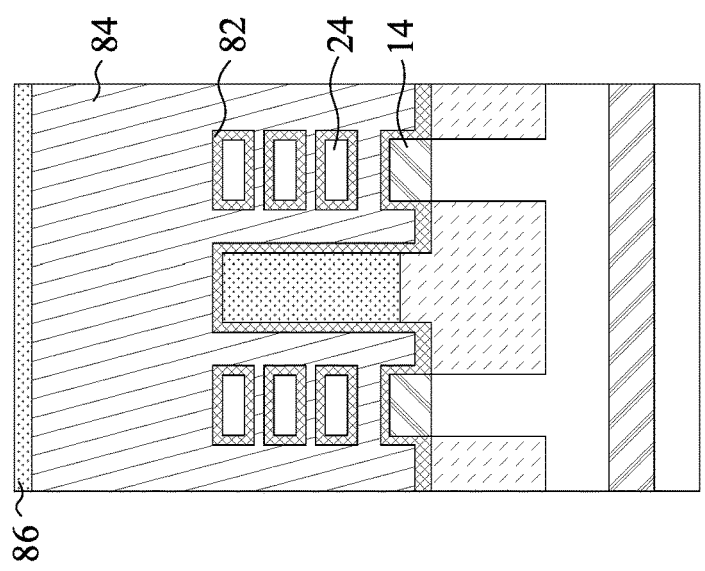
Figure 16B:
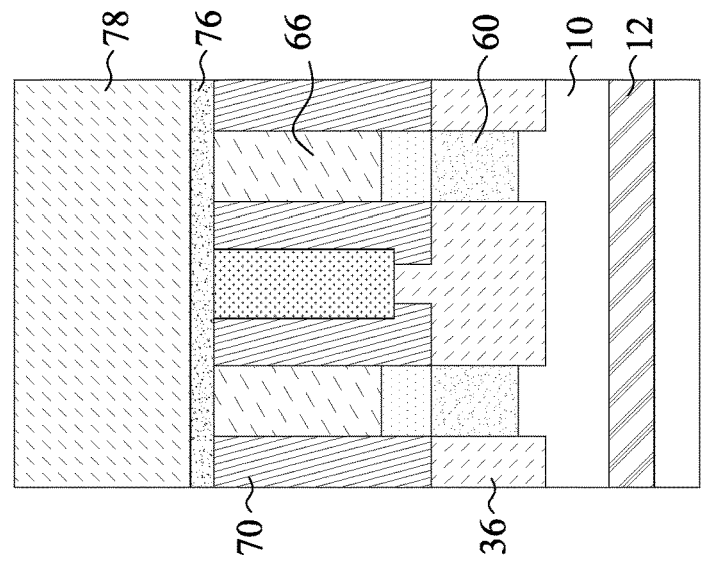
Figure 17A:
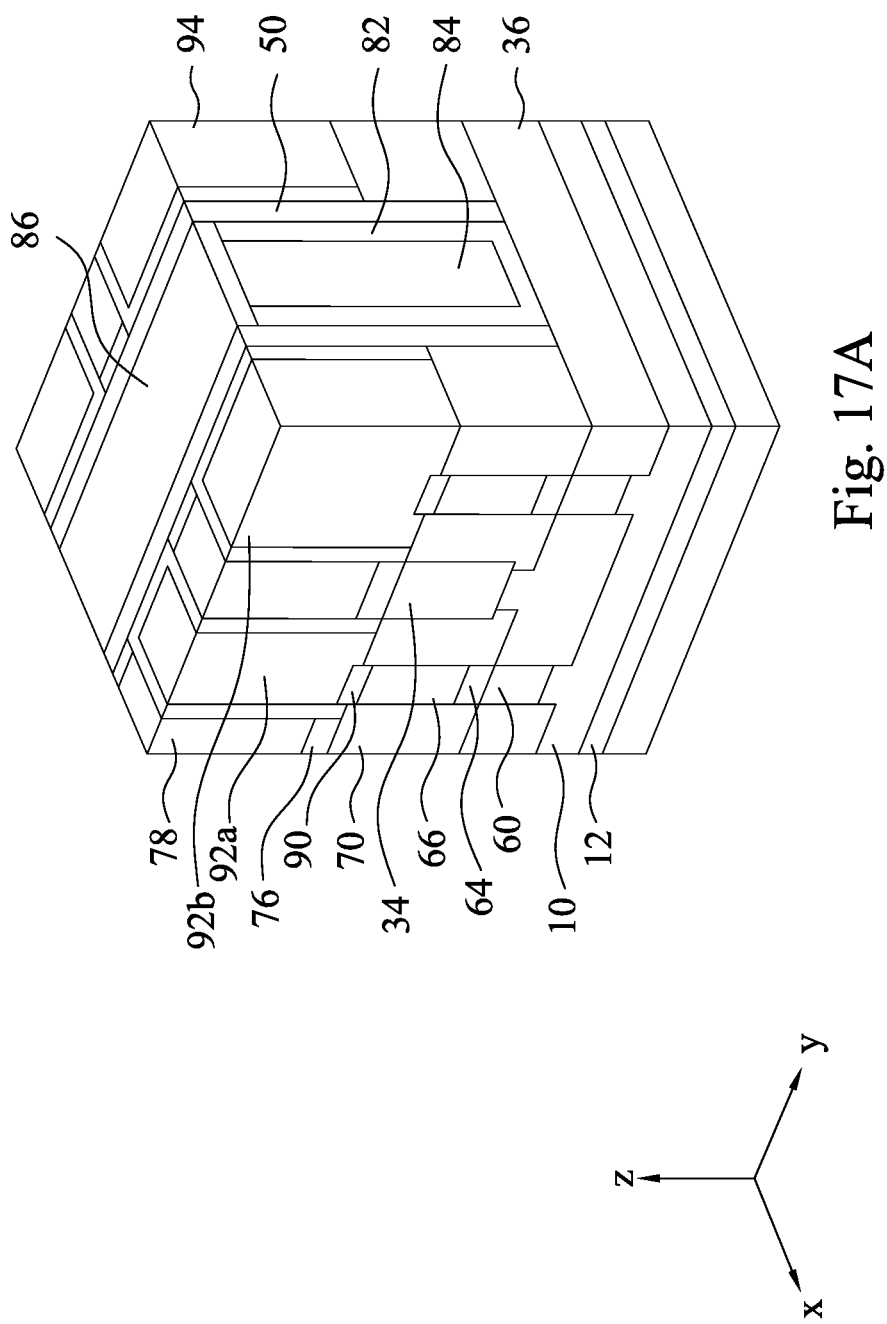
Figure 18A:
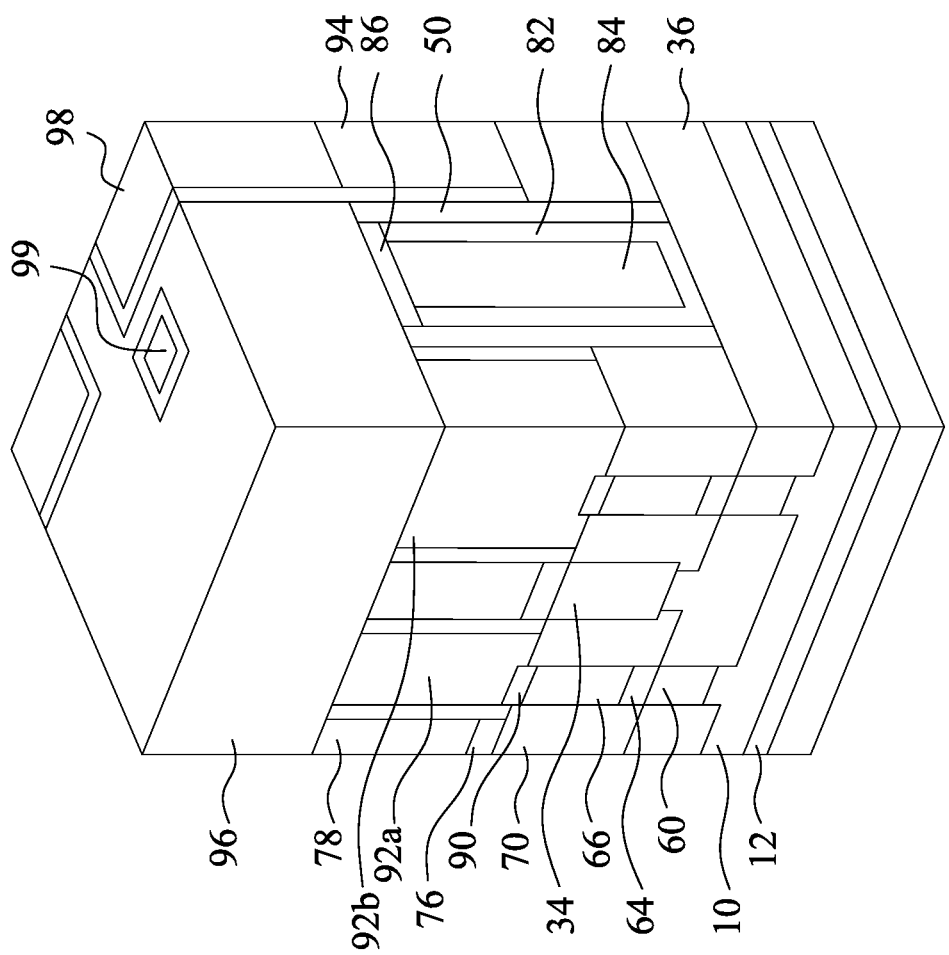
Figure 18D:
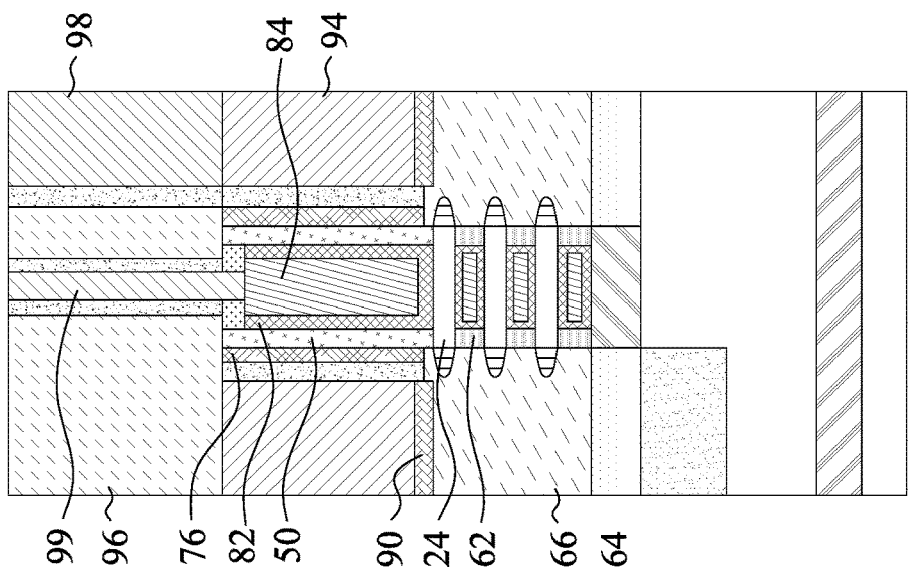
Figure 18C:
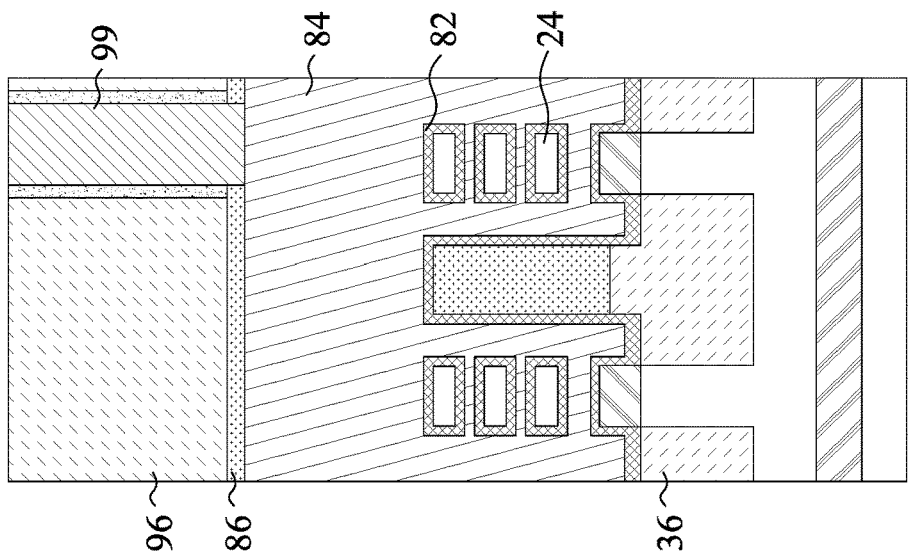
Figure 18B:
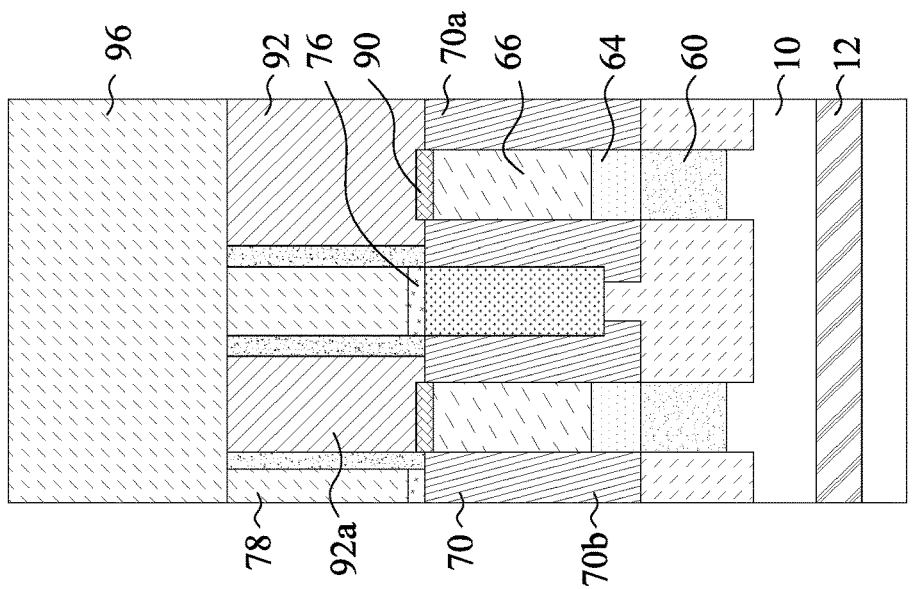

As shown in FIG. 15C, after the sacrificial gate electrode layer 44 and the sacrificial gate dielectric layer 42 are removed, the first semiconductor layers 22 and second semiconductor layers 24 are exposed. The first semiconductor layers 22 can be selectively removed resulting in nanosheets of the second semiconductor layers 24.

The first semiconductor layers 22 can be removed using an etchant that can selectively etch the first semiconductor layers 22 against the second semiconductor layers 24. When the first semiconductor layers 22 are Ge or SiGe and the second semiconductor layers 24 are Si, the first semiconductor layers 22 can be selectively removed using a wet etchant such as, but not limited to, ammonium hydroxide (NH$_4$OH), tetramethylammonium hydroxide (TMAH), ethylenediamine pyrocatechol (EDP), or potassium hydroxide (KOH) solution.

As shown in FIGS. 16A-16D, after the nanosheets of the second semiconductor layers 24 are formed, a gate dielectric layer 82 is formed around each nanosheet of the second semiconductor layers 24, and a gate electrode layer 84 is formed on the gate dielectric layer 82. The gate dielectric layer 82 and the gate electrode layer 84 may be referred to as a gate stack.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer 82 having a uniform thickness around each of the second semiconductor layers 24. In some embodiments, the thickness of the gate dielectric layer 82 is in a range between about 1 nm and about 6 nm.

The gate dielectric layer 82 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof.

In some embodiments, an interfacial layer (not shown) is formed between the second semiconductor layer 24 and the gate dielectric layer 82. In some embodiments, one or more work function adjustment layers (not shown) are interposed between the gate dielectric layer 82 and the gate electrode layer 84.

The gate electrode layer 84 is formed on the gate dielectric layer 82 to surround each of the second semiconductor layer 24 (i.e., each channel) and the gate dielectric layer 82. The gate electrode layer 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. After the formation of the gate electrode layer 84, a planarization process, such as a CMP process, is performed to remove excess deposition of the gate electrode material and expose the top surface of the ILD layer 78.

After the planarization operation, the gate electrode layer 84 is recessed and a cap insulating layer 86 is formed over the recessed gate electrode layer 84. The cap insulating layer 86 includes one or more layers of a silicon nitride-based material, such as SiN. The cap insulating layer 86 can be formed by depositing an insulating material followed by a planarization operation. In some embodiments, the cap insulating layer 86 may be omitted.

In FIGS. 17A-17D, front side source/drain contacts 92, 94 are formed in the ILD layer 78. Prior to forming the front side source/drain contacts 92, 94, contact holes are formed. Suitable photolithographic and etching techniques are used to form the contact holes through various layers, including the ILD layer 78 and the CESL 76 to expose the epitaxial source/drain features 66. In some embodiments, the contact holes for front side source/drain contacts 92, 94 are formed to expose the top of the gap fill dielectric layer 70 on one or both sides of the epitaxial source/drain features 66.

After the formation of the contact holes, a silicide layer 90 is selectively formed over the exposed top surface 66t of the epitaxial source/drain features 66. The silicide layer 90 conductively couples the epitaxial source/drain features 66 to the subsequently formed front side source/drain contacts 92, 94. The silicide layer 90 may be formed by depositing a metal source layer over the substrate 10 to cover the epitaxial source/drain features 66 and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed, for example, a rapid anneal at about 800° C. During the rapid anneal process, the portion of the metal source layer over the epitaxial source/drain features 66 reacts with silicon in the epitaxial source/drain features 66 to form the silicide layer 90. Unreacted portion of the metal source layer is then removed. In some embodiments, the silicide layer 90 includes one or more of WSi, CoSi, NiSi, TiSi, MoSi, and TaSi. In some embodiments, the silicide layer 90 has a thickness in a range between about 4 nm and 10 nm, for example between 5 nm and 6 nm.

After the silicide layer 90 is formed, the front side source/drain contacts 92, 94 are formed in the contact holes by CVD, ALD, electro-plating, or other suitable method. The front side source/drain contacts 92, 94 may be in contact with the silicide layer 90 and the exposed surfaces of the gap fill dielectric layer 70. The front side source/drain contacts 92, 94 may include one or more of Co, Ni, W, Ti, Ta, Cu, Al, TiN and TaN. In some embodiments, a barrier layer 88 may be formed on sidewalls of the contact holes prior to forming the front side source/drain contacts 92, 94. After deposition to fill the contact holes, a planarization process, such as CMP, is performed to remove excess deposition of the contact material and expose the top surface of the cap insulating layer 86.

The front side source/drain contact 92 denotes conductive features in connection with the epitaxial source/drain features 66 to be connected to a power rail, such as VDD or GND disposed therebelow. In some embodiments, the front side source/drain contacts 92 are not further connected to signal lines formed on subsequent interconnect layers thereabove. As shown in FIG. 17B, at this stage of the fabrication, the front side source/drain contacts 92 (92a, 92b) are in contact with the gap fill dielectric layer 70 next to the corresponding epitaxial source/drain features 66. As shown in FIG. 17B, the gap fill dielectric layers 70 (70a, 70b) are positioned on either side of the epitaxial source/drain features 66. In the example of FIG. 17B, the front side source/drain contact 92a contacts only the gap fill dielectric layer 70a. The front side source/drain contact 92b contacts the gap fill dielectric layer 70a and 70b.

The front side source/drain contact 94 denotes conductive features in connection with the epitaxial source/drain features 66 to be connected to a signal line in the subsequent formed interconnect layers or to other devices on the substrate 10.

In FIGS. 18A-18D, a second ILD layer 96 is formed over the substrate 10. Conductive features are formed in the second ILD layer 96 to provide electrical connections to the epitaxial source/drain features 66 and/or the gate electrode layers 84. In the example of FIG. 18A-18D, a conductive feature 98 in the second ILD layer 96 is connected to the front side source/drain contact 94. In some embodiments, the conductive feature 98 is a signal line or connected to a signal line. A gate contact 99 is formed in the second ILD layer 96 to connect the gate electrode layer 84 to a signal line or to other devices. In some embodiments, the front side source/drain contacts 92 are not further connected to conductive features in the second ILD layer 96.

Figure 19A:
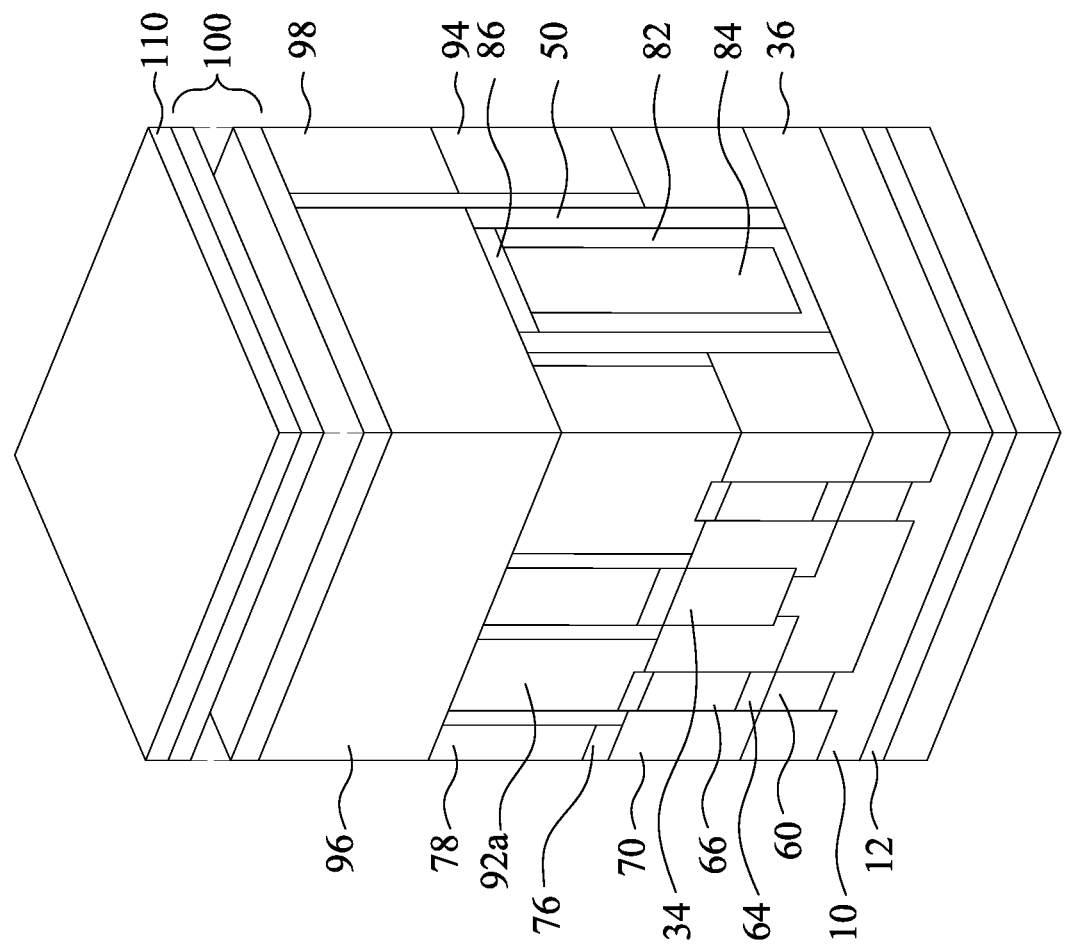

As shown in FIG. 19A, after conductive features are formed in the second ILD layer 96, an interconnect structure 100, which includes multiple dielectric layers having metal lines and vias (not shown) formed therein, is formed on the second ILD layer 96 and electrically connected to the active semiconductor devices on the substrate 10. The metal lines and vias in the interconnect structure 100 may be formed of copper or copper alloys, and may be formed using one or more damascene processes. The interconnect structure 100 may include multiple sets of inter-layer dielectric (ILD) layers and inter-metal dielectrics (IMDs) layers.

In some embodiments, the interconnect structure 100 includes metal lines and vias for connecting signal lines only, but not connecting to power rails or connections to power rails. In other embodiments, the interconnect structure 100 incudes a portion of power rails. Power rails indicate conductive lines connecting between the epitaxial source/drain features 66 and a power source, such as VDD, and VSS (GND).

After the formation of the interconnect structure 100, a carrier wafer 110 is temporarily bonded to a top side of the interconnect structure 100. The carrier wafer 110 serves to provide mechanical support for the interconnect structure 100 and devices formed on the substrate 10.

In FIG. 19B, the carrier wafer 110 along with the substrate 10 is flipped over so that the backside of the substrate 10 (i.e., the back surface 10b) is facing up for backside processing as shown in FIGS. 20A-20D to 25A-25D, FIGS. 26A-26G, and FIGS. 27A-27D. FIGS. 20B-27B are cross sectional views corresponding to line Y1-Y1 in FIG. 20A. FIGS. 20C-27C are cross sectional views corresponding to line Y2-Y2 in FIG. 20A. FIGS. 20D-27D are across sectional views corresponding to line X-X in FIG. 20A.

In FIGS. 20A-20D, a backside grinding is performed to expose the isolation layer 36, the well portion 32 of the semiconductor fins 30 and the backside contact alignment features 60. In FIGS. 21A-21D, the exposed well portion 32 of the semiconductor fins 30 and the buffer layer 14 in contact with the gate dielectric layer 82 layer are removed from the backside by one or more etching processes. A liner layer 122 and a dielectric layer 124 are subsequently formed in the space vacated by the well portion 32 and the buffer layer 14.

The well portions 32 of the semiconductor fins 30 can be removed using an etch process having an etch selectivity for the material of the well portions 32 semiconductor fins 30 over the materials of the backside contact alignment features 60 and the transitional epitaxial layers 64. In some embodiments, the well portions 32 of the semiconductor fins 30 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. The buffer layer 14 adjacent the sacrificial gate dielectric layer 42 can be removed using the same or different etch process.

After removal of the well portions 32 of the semiconductor fins 30 and the buffer layer 14, the liner layer 122 is deposited on the exposed surfaces. In some embodiments, the liner layer 122 is deposited by a conformal deposition. The liner layer 122 can include a nitride material, such as silicon nitride, silicon oxynitride (SiON), silicon carbon nitride (SiCN), silicon carbon oxynitride (SiCON), or any combinations thereof, a silicon oxide, silicon oxycarbide (SiOC), or silicon carbide (SiC). The liner layer 122 can be formed by, for example, ALD, CVD, PVD, PECVD, remote plasma CVD, or any suitable deposition technique.

The dielectric layer 124 is deposited over the liner layer 122 to fill the cavities vacated by the well portions 32 of the semiconductor fins 30 and the buffer layer 14. In some embodiments, the dielectric layer 124 includes a silicon oxide, a silicon oxide, a material convertible to a silicon oxide, a silicate glass (USG), an alkoxysilane compound (e.g., tetraethoxysilane (TEOS), tetramethoxysilane (TMOS)), thermal oxide, or any suitable dielectric material, or any combination thereof, and can be formed by FCVD, a spin-on coating process, or any suitable deposition technique.

After the formation of the dielectric layer 124, a planarization process, such as CMP, is performed to expose the backside contact alignment features 60. The backside contact alignment features 60 are subsequently removed to form contact holes 126 to eventually expose the epitaxial source/drain feature 66 underneath for metal formation.

In FIGS. 22A-22D, the backside contact alignment features 60 are removed to expose the transitional epitaxial layer 64. Any suitable etch processes can be used to remove the backside contact alignment features 60. Since the transitional epitaxial layer 64 is formed on the backside contact alignment feature 60, and the epitaxial source/drain feature 66 is formed on the transitional epitaxial layer 64, the backside contact alignment feature 60 is aligned with the corresponding epitaxial source/drain feature 66. The contact hole 126 vacated by the backside contact alignment feature 60 is aligned with the epitaxial source/drain feature 66 without using any photolithography and patterning process.

In FIGS. 23A-23D, an etching process is performed on the isolation layer 36 to expand the contact holes 126. In some embodiments, an isotropic etching process is performed to trim the isolation layer 36. The dielectric layer 124 is also trimmed during the process. In some embodiments, an isotropic plasma etching with an etchant comprising fluorocarbons is used. In other embodiments, a suitable wet etch can be used. In some embodiments, the contact holes 126 are expanded to expose the gap fill dielectric layers 70 adjacent to the epitaxial source/drain features 66.

In FIGS. 24A-24D, the gap fill dielectric layers 70 are removed by a suitable etch process. In some embodiments, the gap fill dielectric layers 70 are removed using a wet etching method. For example, the gap fill dielectric layers 70 can be removed using wet etchant including NI-140H, and H202. The removal process is a selective removal process to remove the gap fill dielectric layers 70, while the other exposed materials, such as the transitional epitaxial layer 64 and the dielectric layer 124, are not removed.

In FIGS. 25A-25D, the transitional epitaxial layers 64 are removed by a suitable etch process to expose a top surface of the epitaxial source/drain features 66. In some embodiments, the transitional epitaxial layers 64 are removed by a dry etch method. For example, the transitional epitaxial layers 64 can be removed by a dry etching process using fluorine-based etchant, such as $CF_4$, $NF_3$, $SF_6$. In some embodiments, the transitional epitaxial layer 64 may be removed prior to removal of the gap fill dielectric layer 70.

As shown in FIGS. 25A-25D, after the removal of the transitional epitaxial layer 64 and the gap fill dielectric layer 70, the contact hole 126 extends further from between the gaps 68 to the front side source/drain contacts 92, and a portion of the front side source/drain contacts 92, the bottom surface 66b and side surfaces 66s of the epitaxial source/drain features 66 are exposed.

In FIGS. 26A-26D, backside source/drain contacts 128 are formed by filling in the contact holes 126 with a conductive material. In some embodiments, a preclean process is performed prior to depositing the backside source/drain contacts 128 to remove residue left after the removal of the transitional epitaxial layer 64 and the gap fill dielectric layer 70. The preclean process may be performed using a plasma process. In some embodiments, the exposed surfaces of the front side source/drain contact 92 may be recessed in a range between 1 nm and 3 nm during the preclean.

After preclean, a conductive material is filled in the contact holes 126 to form the backside source/drain contacts 128. The conductive material may be one or more of Co, W, Mo, Ru, Al, or compounds thereof. In some embodiments, the conductive material is filled in the contact holes 126 by CVD, ALD, electro-plating, or other suitable method. In some embodiments, a planarization process, such as CMP, may be performed after filling the contact holes 126 to form the backside source/drain contacts 128.

As shown in FIGS. 26A-26D, each backside source/drain contact 128 has a body portion 128m and two sidewall portions 128w extending from the body portion 128m. The body portion 128m contacts the bottom surface 66b of the epitaxial source/drain feature 66. The two sidewall portions 128w extend from the body portion 128m to the front side source/drain contact 92 along the side surface 66s of the epitaxial source/drain feature 66. In some embodiments, the sidewall portion 128w extends from the bottom surface 66b to the top surface 66t of the epitaxial source/drain feature 66. The sidewall portions 128w of the backside source/drain contact 128 fill the gaps 68 between the epitaxial source/drain feature 66 and the hybrid fins 34. A cross section of the backside source/drain contacts 128 has an U-shape with the body portion 128m and the sidewall portions 128w forming a trench 128t. The epitaxial source/drain feature 66 is enclosed in the trench 128t.

In some embodiments, the body portion 128m has a height H5, measured from a bottom surface 128b of the body portion 128m to the bottom surface 66b of the epitaxial source/drain feature 66. In some embodiments, the height H5 is in a range between about 10 nm and about 30 nm. In some embodiments, the sidewall portion 128w has a height H6, measured from the bottom surface 66b of the epitaxial source/drain feature 66 to a surface of the front side source/drain contact 92. In some embodiments, the height H6 is in a range between from about 10 nm and about 70 nm. Alternatively, the height H6 is similar to the height H4 of the epitaxial source/drain feature 66 (marked in FIG. 10B).

The backside source/drain contacts 128 replace the gap fill dielectric layer 70a, 70b and are in direct contact with the front side source/drain contacts 92. Each backside source/drain contact 128 can be in contact with the front side source/drain contact 92 at one side or both sides of epitaxial source/drain feature 66 depending on the location of the corresponding front side source/drain contact 92. In the example of FIG. 26B, the front side source/drain contact 92a is in contact with the corresponding backside source/drain contact 128 on one side of the epitaxial source/drain feature 66, while the front side source/drain contact 92b is in contact with the corresponding backside source/drain contact 128 on both sides of the epitaxial source/drain feature 66.

Because the front side source/drain contact 92 is in electrical connection with the epitaxial source/drain feature 66 through the silicide layer 90, the direct contact between the backside source/drain contact 128 and the front side source/drain contact 92 will allow electrical connection of the backside source/drain contact 128 to the epitaxial source/drain feature 66. Therefore, an electrical connection is established between the backside source/drain contact 128 and the epitaxial source/drain feature 66 without relying on a silicide layer formed during backside processing, e.g., a silicide layer between the backside source/drain contact 128 and the epitaxial source/drain feature 66.

As shown in FIGS. 26B-26D, the conductive material of the backside source/drain contacts 128 is deposited in the contact holes 126 without forming a silicide layer on the bottom surface 66b and side surfaces 66s of the epitaxial source/drain features 66. As a result, the backside source/drain contacts 128 are in direct contact with the epitaxial source/drain features 66 at one or more of surfaces, such as the side surfaces 66s and the bottom surface 66b, of the epitaxial source/drain features 66. By omitting the silicide process during formation of the backside source/drain contacts 128, embodiments of the present disclosure avoid exposing metal structures formed on the front side of the substrate 10, such as the metal structures in the interconnect structure 100, to a high temperature of a silicide process. Thus, the integrity of the metal structures is preserved. Using the silicide layer 90 formed during the front side processing as part of the conductive path for a backside source/drain contact, devices according to embodiments of the present disclosure effectively reduces high interface resistance between the source/drain feature and a source/drain contact formed on the backside of the substrate.

Figure 26A:
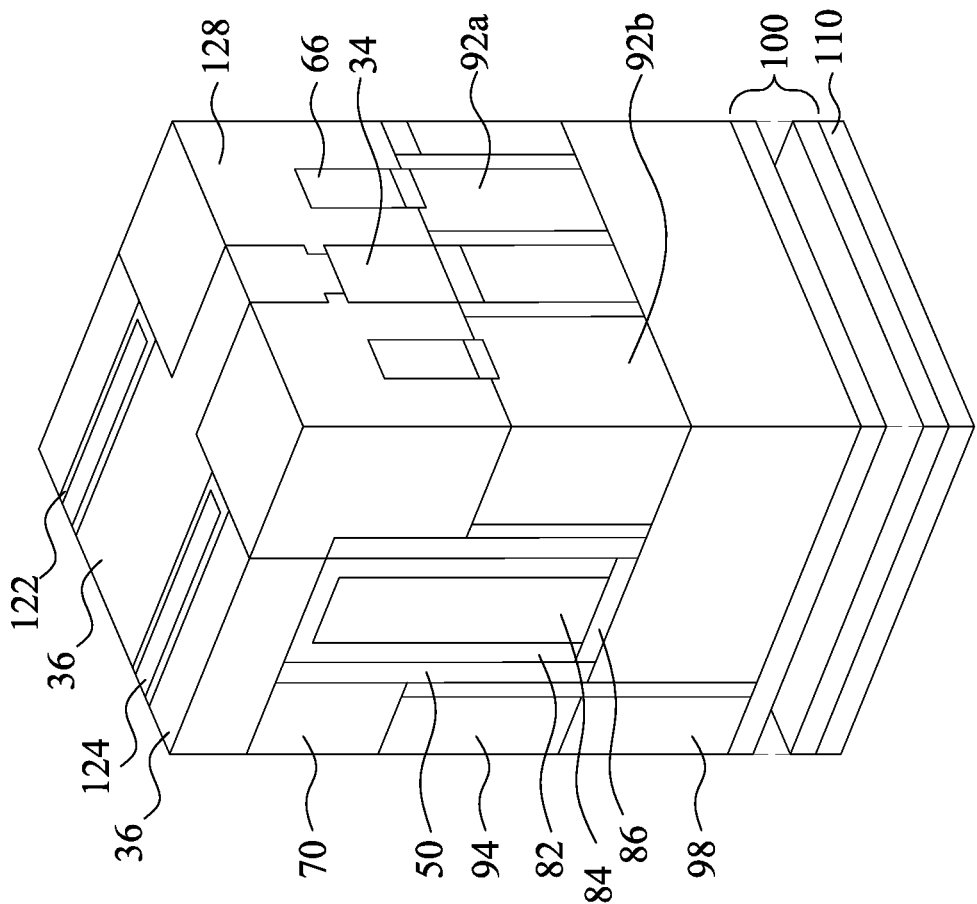
Figure 26G:
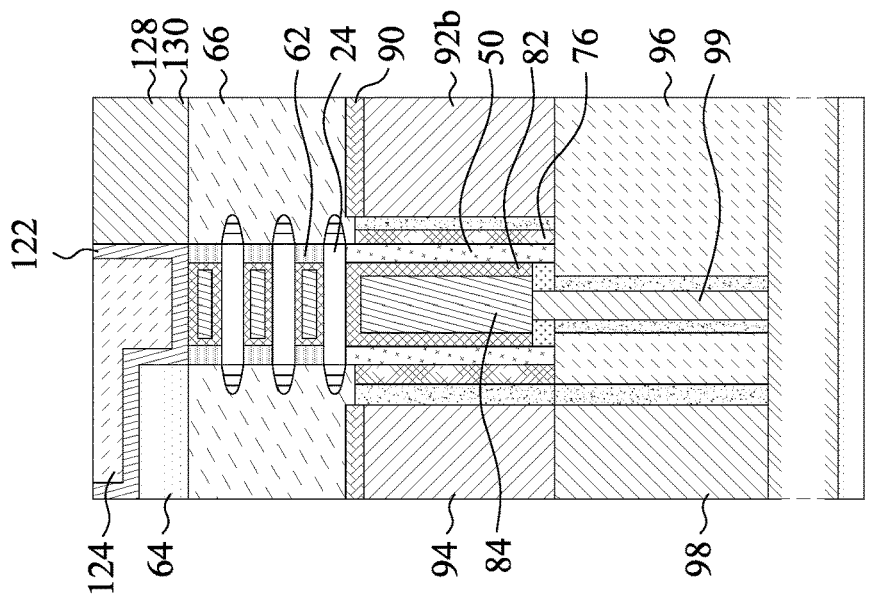
Figure 26F:
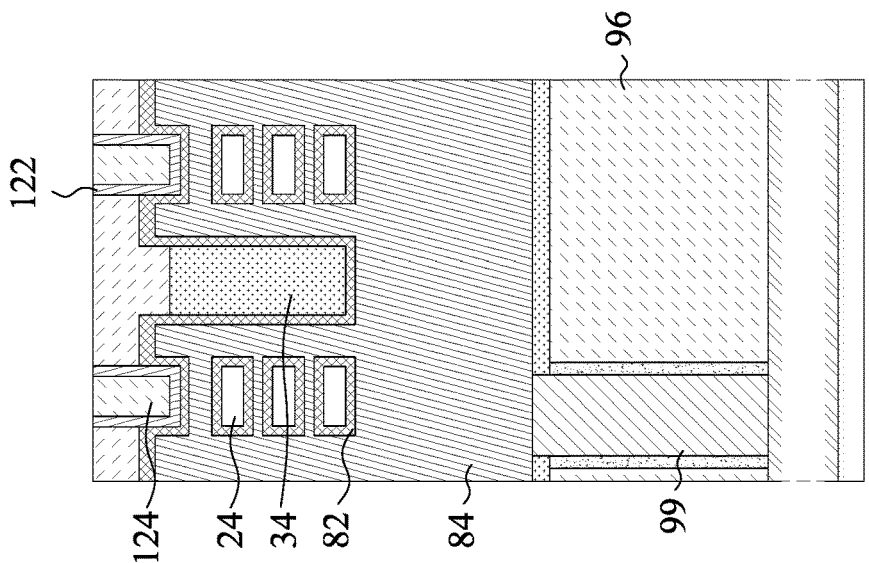
Figure 26E:
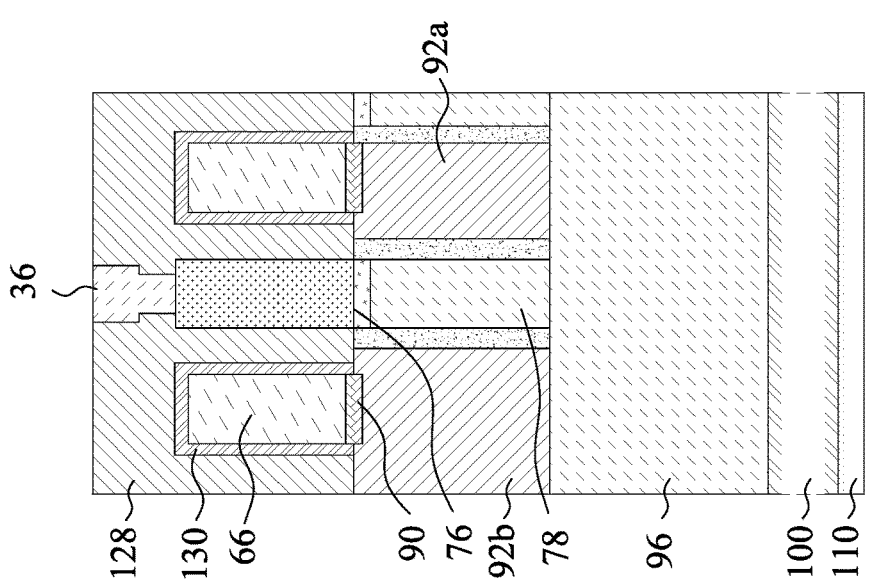

FIGS. 26E-26G show an embodiment alternative to the embodiment shown in FIGS. 26B-26D. In this embodiment, instead of omitting the silicide process, a low temperature silicide process is performed to form a silicide layer on the exposed surfaces of the epitaxial source/drain features 66. As shown in FIGS. 26E-26G, a silicide layer 130 is formed between the epitaxial source/drain features 66 and the backside source/drain contact 128. The silicide layer 130 can be formed by depositing a metal source layer over the substrate to cover the epitaxial source/drain features 66, followed by a low temperature anneal to form the silicide layer 130 over the epitaxial source/drain features 66.

In some embodiments, the metal source layer may include or be a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. The lower temperature anneal may be performed at a temperature below 400° C., for example at a temperature range between about 300° C. and 400° C. During the low temperature anneal, the portion of the metal source layer over the epitaxial source/drain features 66 reacts with silicon in the epitaxial source/drain features 66 to form the silicide layer 130, as shown in FIGS. 26E-26G. Unreacted portion of the metal source layer is then removed. In some embodiments, the silicide layer 130 includes one or more of WSi, CoSi, NiSi, TiSi, MoSi, and TaSi. In some embodiments, the silicide layer 130 has a thickness in a range between greater than 0 nm and less than 3 nm. The silicide layer 130 is thinner than the silicide layer 90. In some embodiments, the silicide layer 130 has a thickness in a range between 0% and 50% thickness of the silicide layer 90.

In the device shown in FIGS. 26E-26G, the backside source/drain contact 128 is in electrical connection with the epitaxial source/drain feature 66 through both the silicide layer 130 and the current path including the front side source/drain contact 92 and the silicide layer 90. The additional connection through the silicide layer 130 improves performance of the device. By performing a low temperature silicide process, embodiments of the present disclosure avoid exposing metal structures formed on the front side of the substrate 10, such as the metal structures in the interconnect structure 100, thus, reducing interface resistance and preserving integrity of the metal structure at the same time.

In FIGS. 27A-27D, an ILD layer 132 is formed over the substrate. One or more conductive features 134 (only one is shown) may be formed in the ILD layer 132. The conductive feature 134 is in contact with the backside source/drain contact 128. In some embodiments, the conductive feature 134 is a portion of a power rail or is in connection with a power rail to be connected to a power supply. In other embodiments, the conductive feature 134 may be connected to an interconnect structure other than a power rail.

Figure 20A:
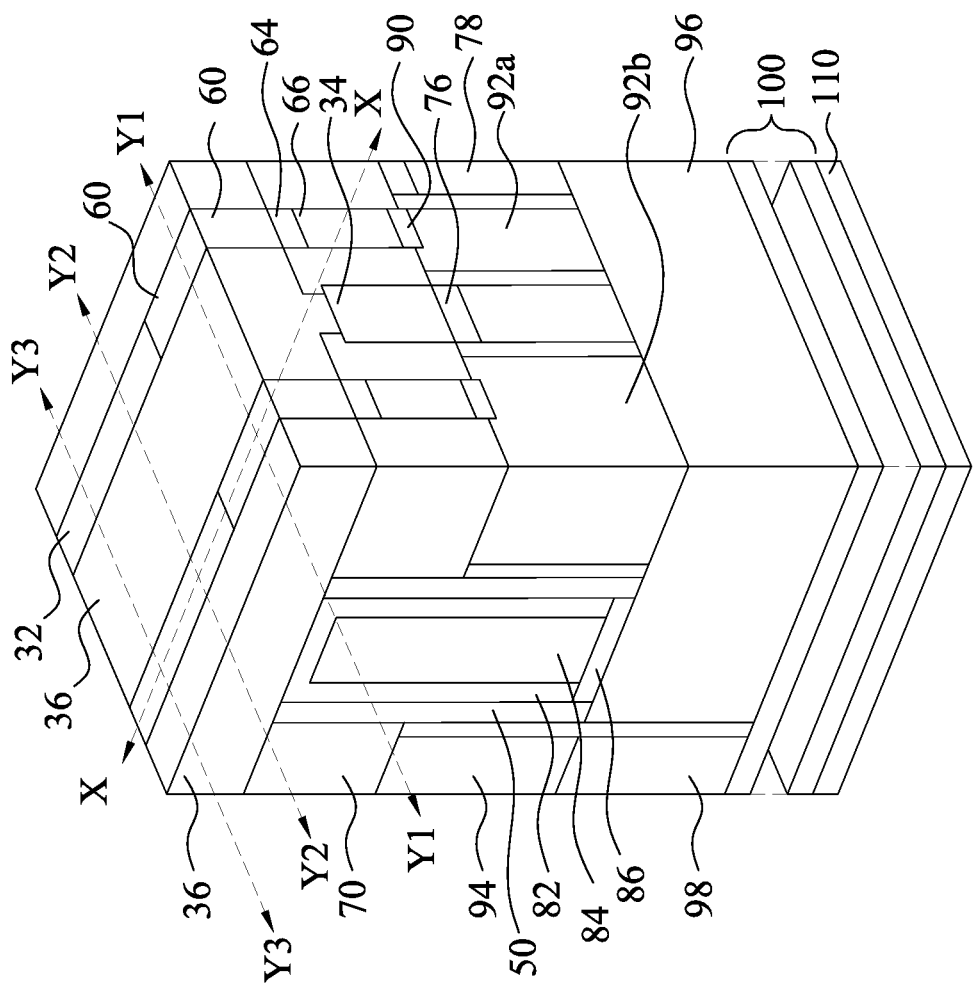
Figure 20D:
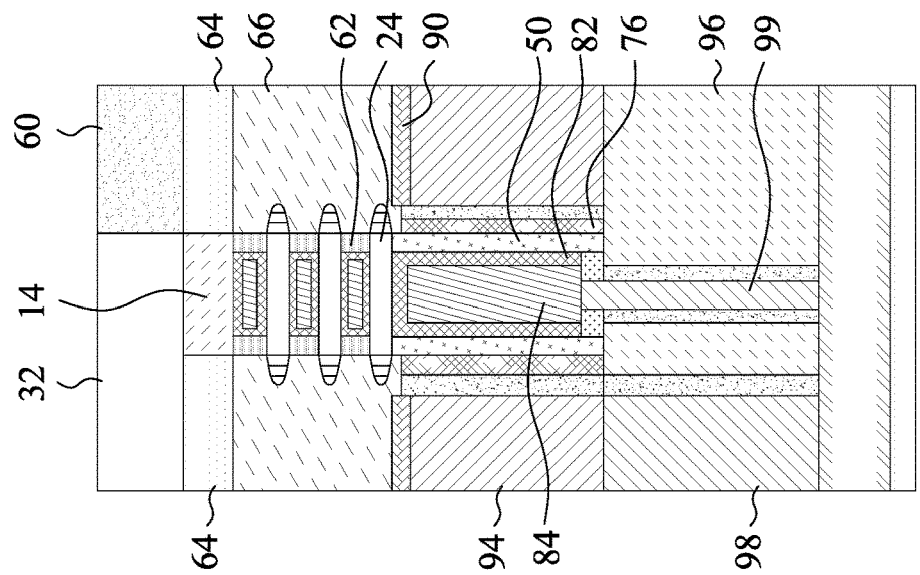
Figure 20C:
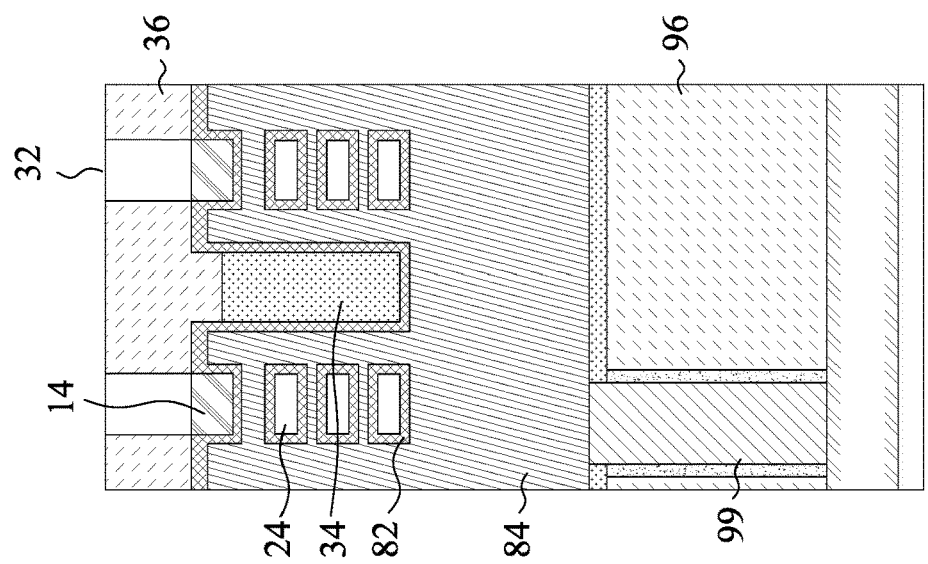
Figure 20B:
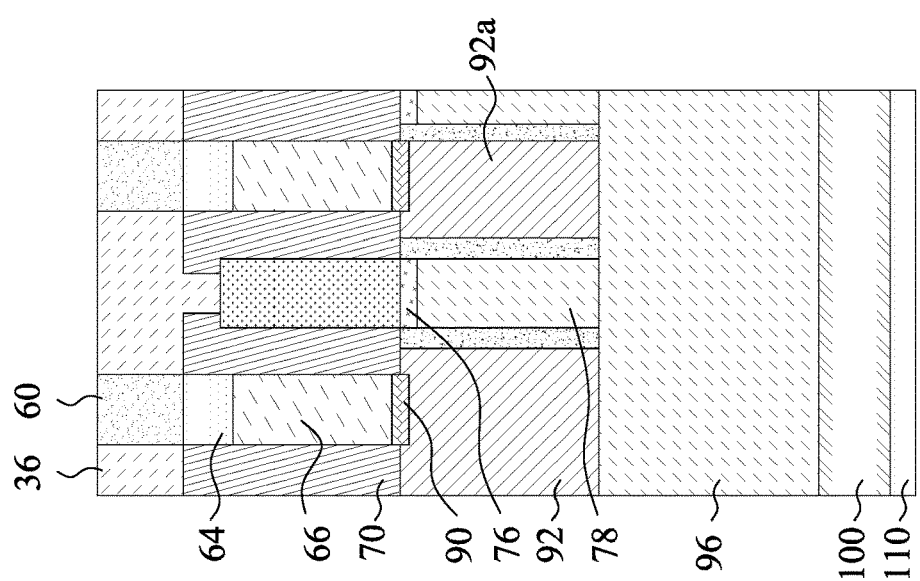
Figure 21A:
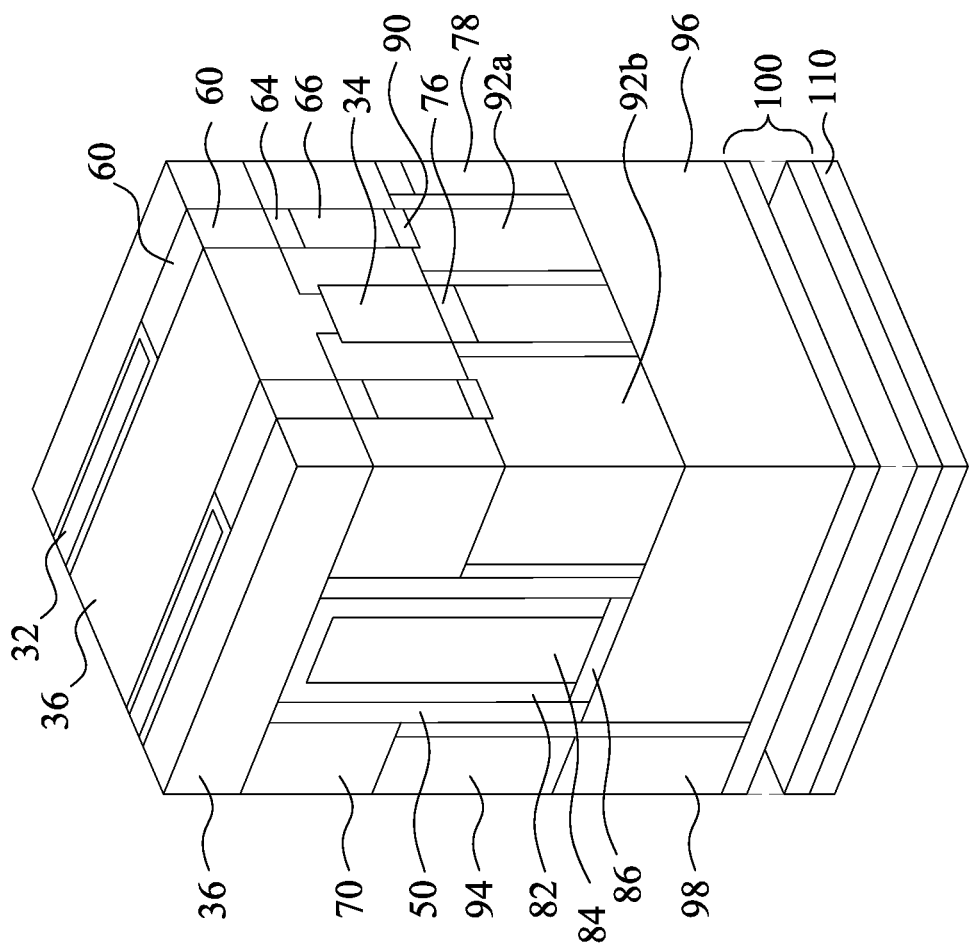
Figure 21D:
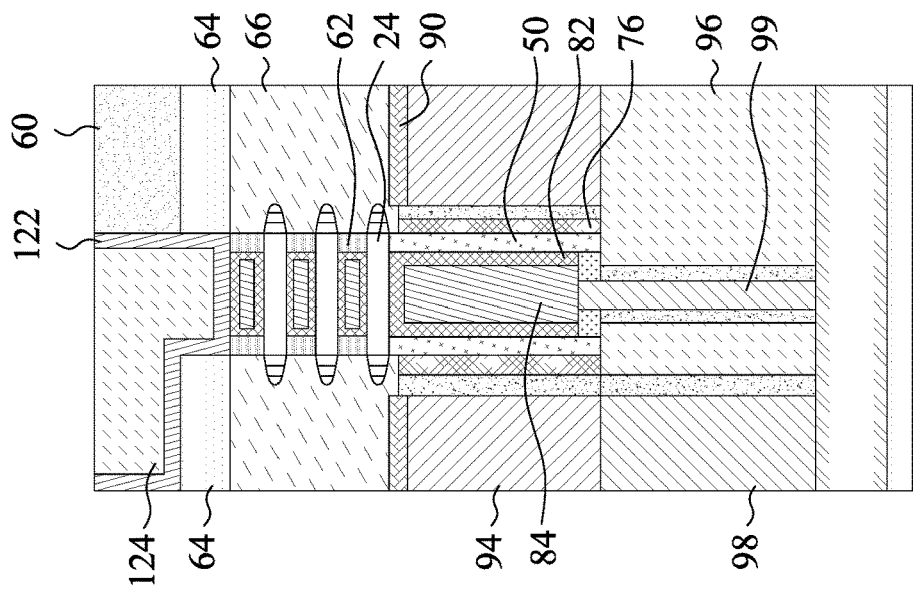
Figure 21C:
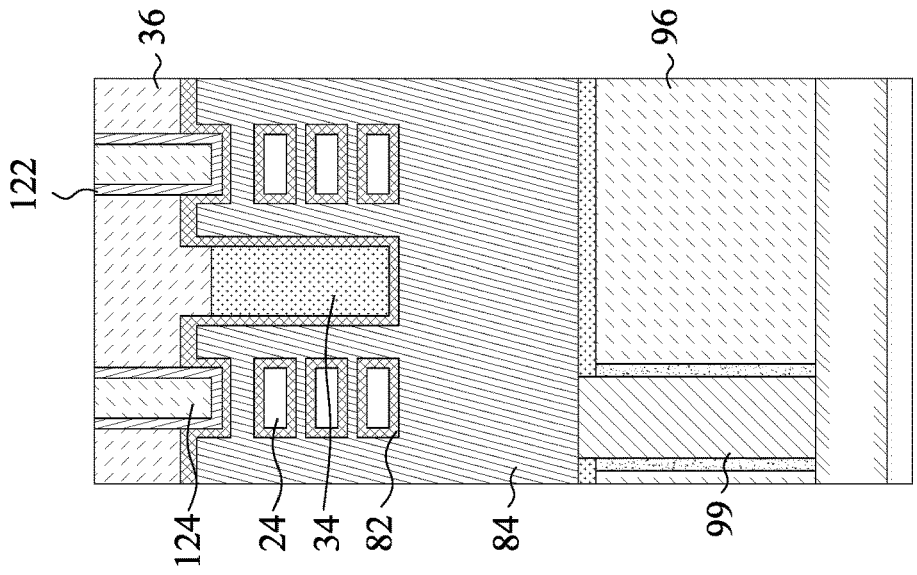
Figure 21B:
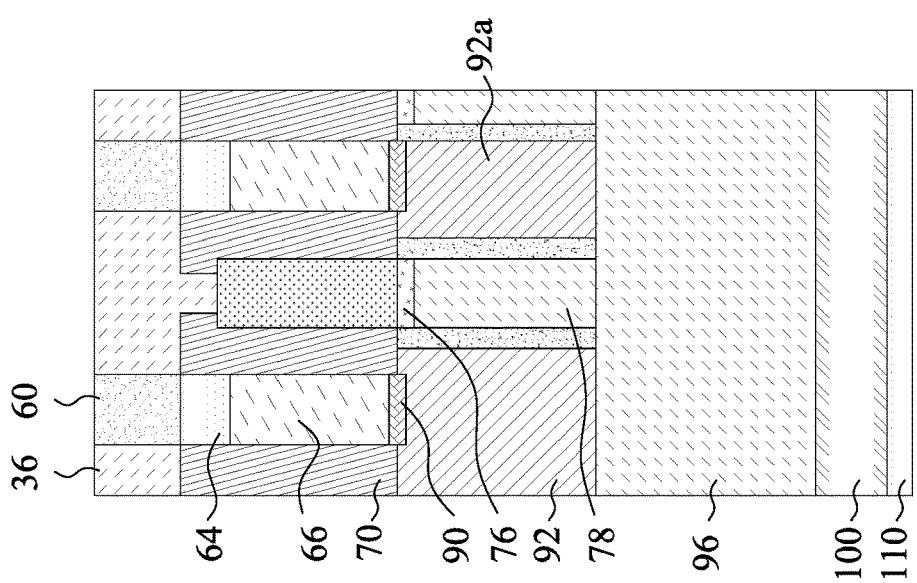
Figure 22A:
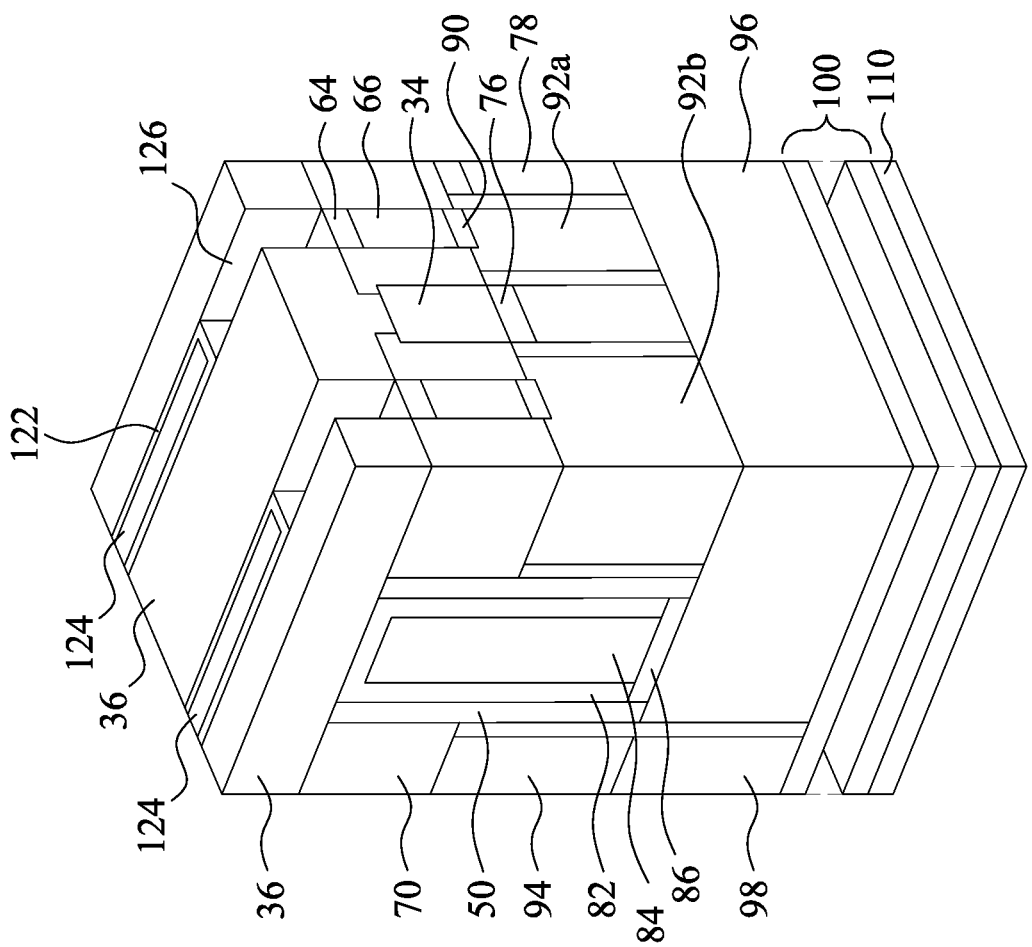
Figure 22A:
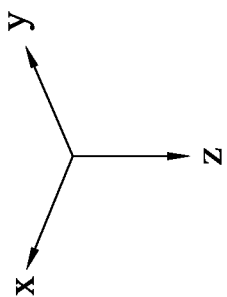
Figure 22D:
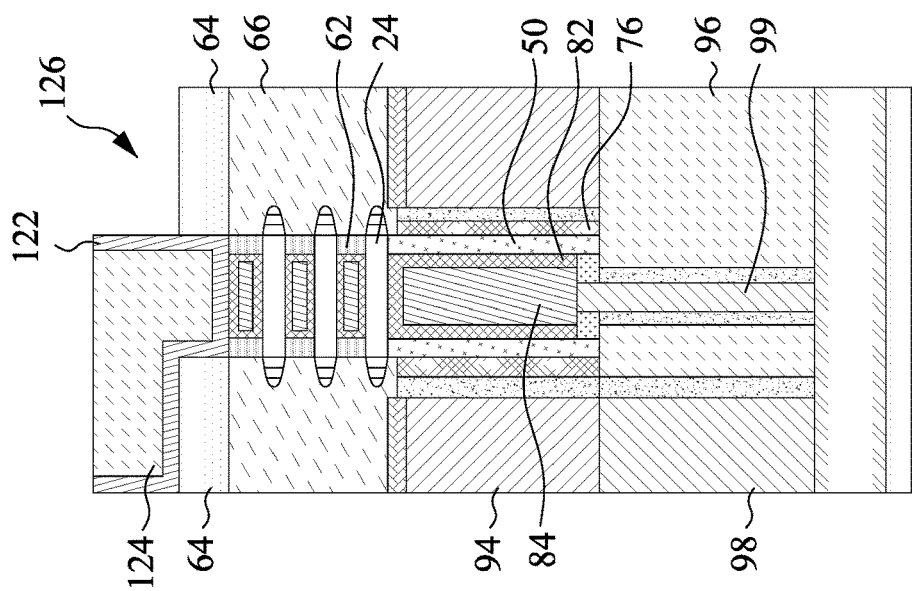
Figure 22C:
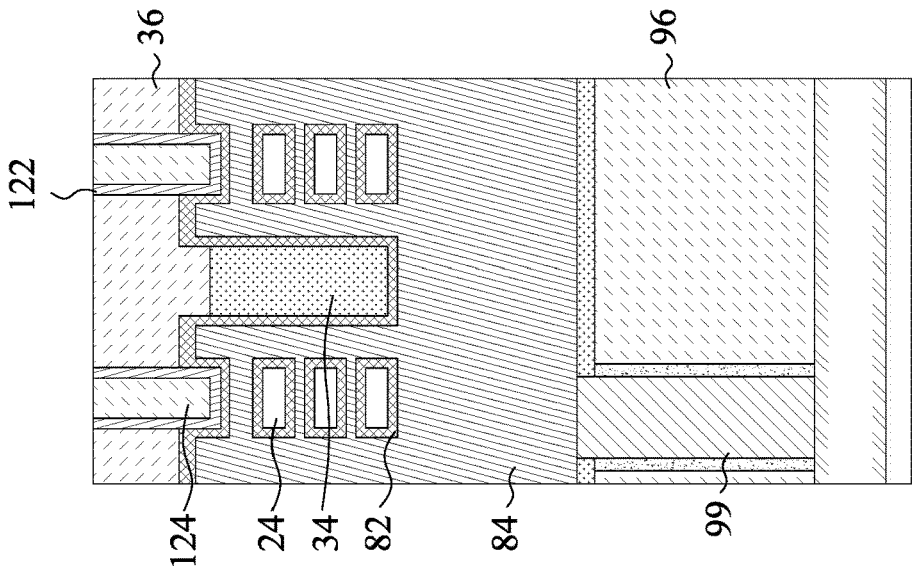
Figure 22B:
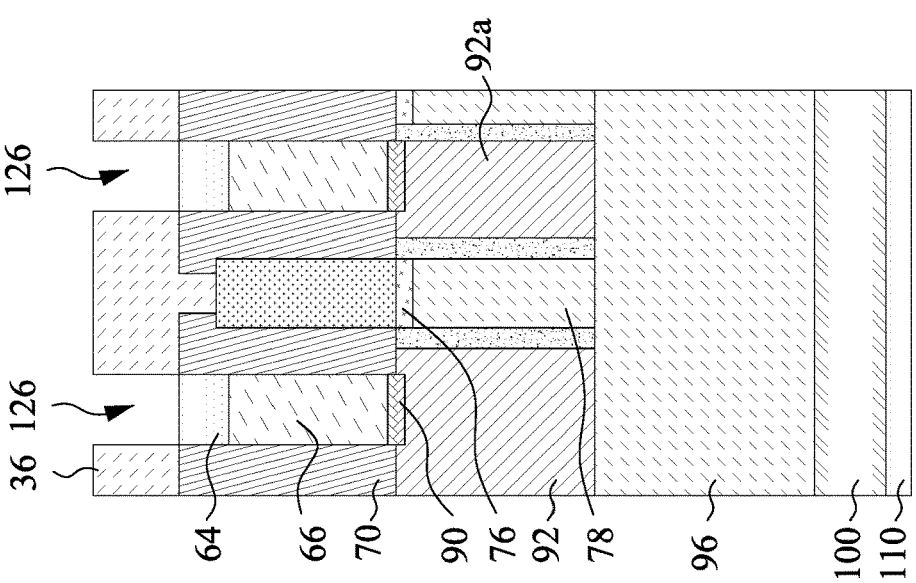
Figure 23A:
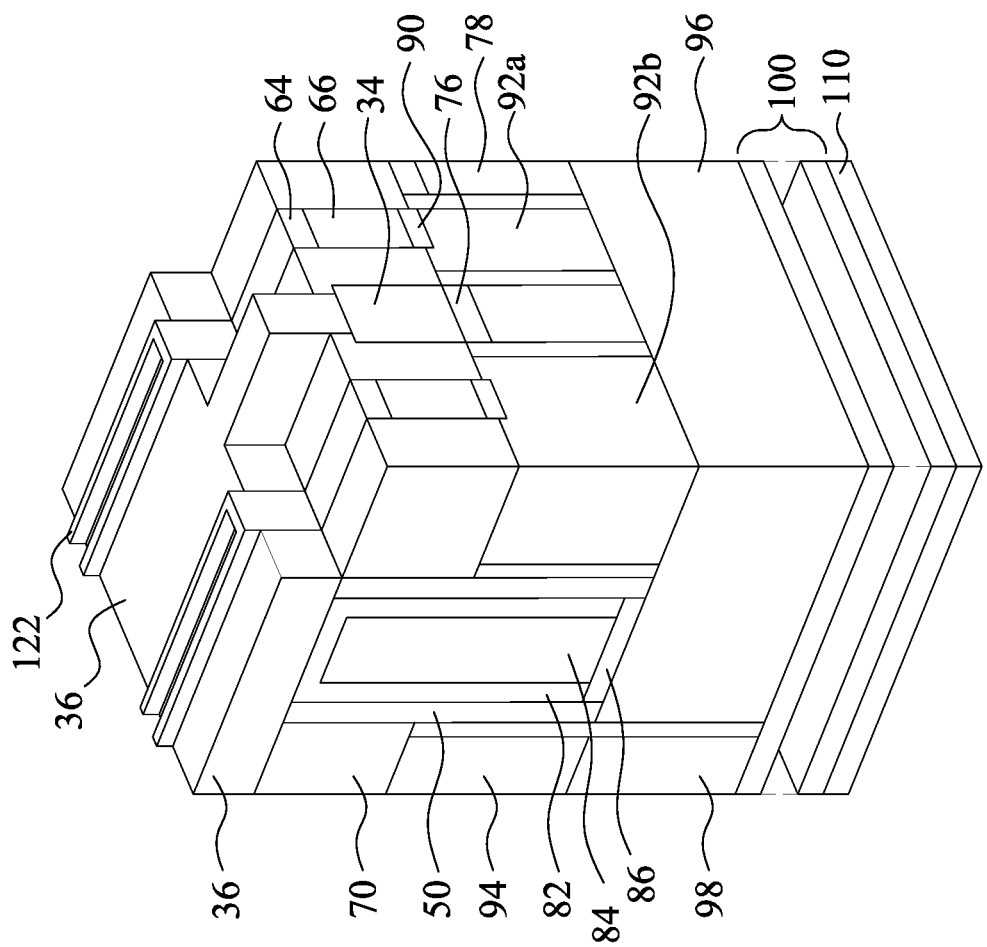
Figure 23D:
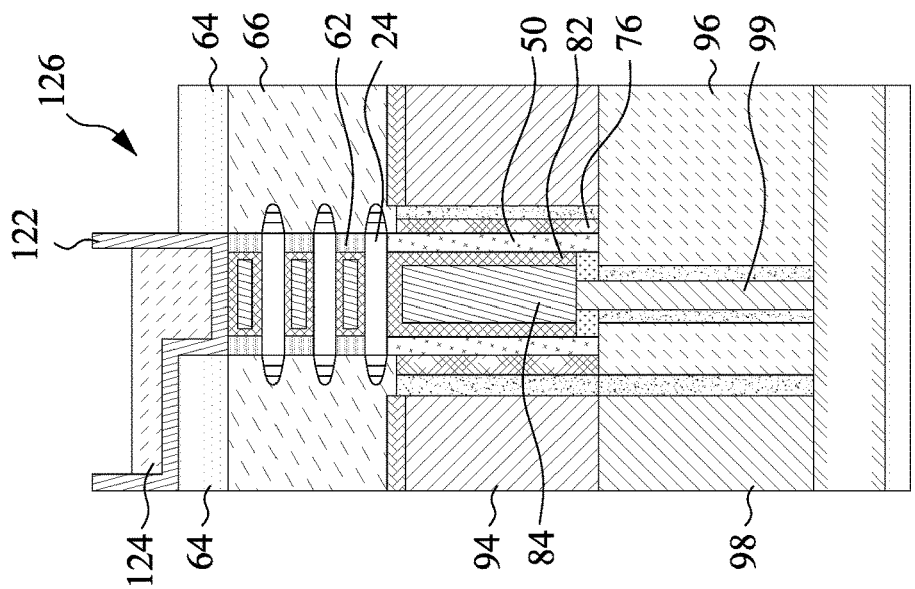
Figure 23C:
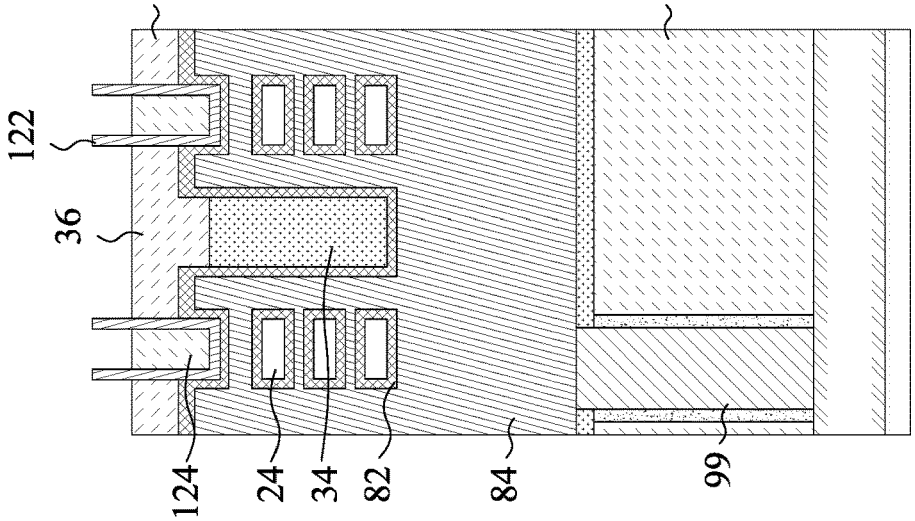
Figure 23B:
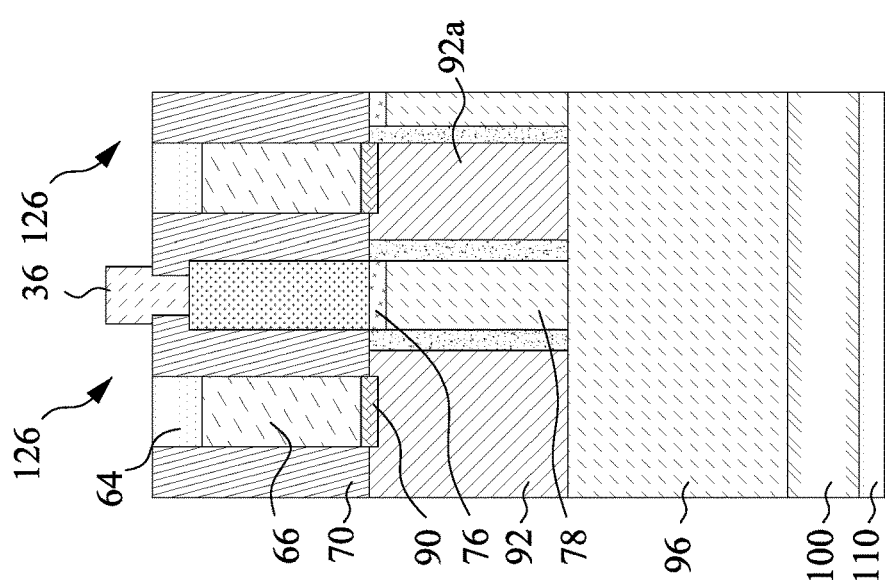
Figure 24A:
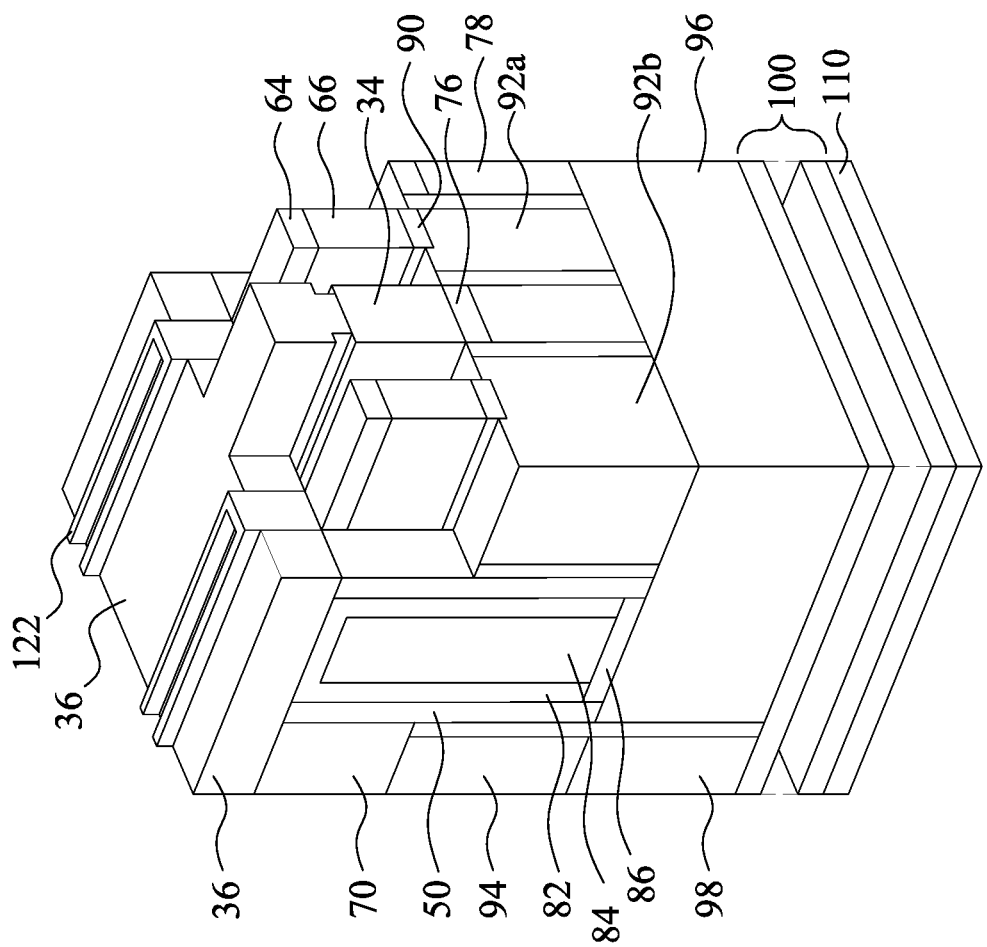
Figure 24D:
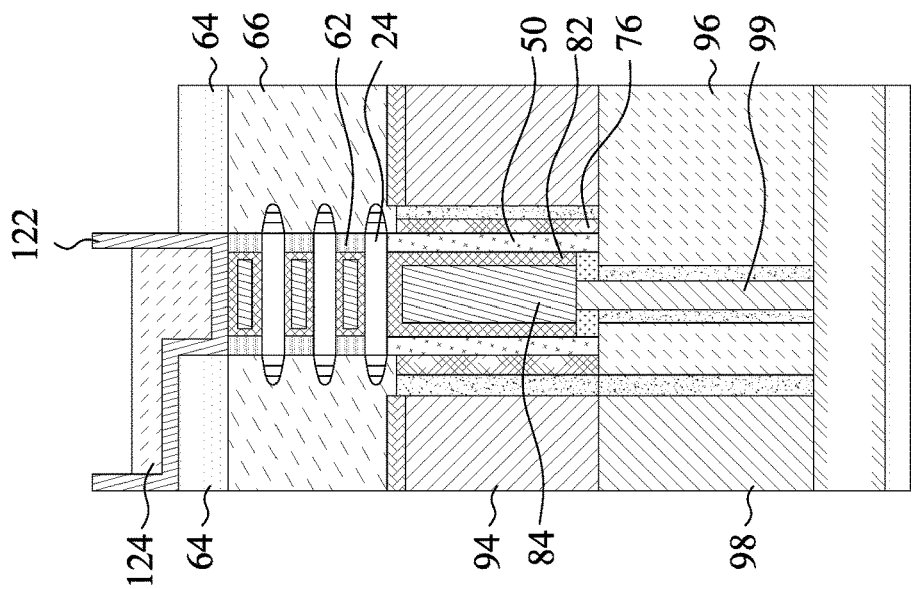
Figure 24C:
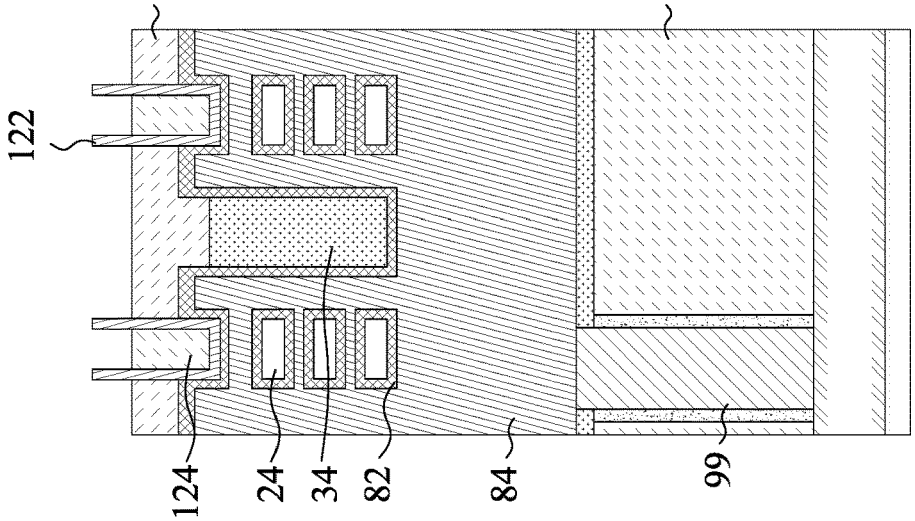
Figure 24B:
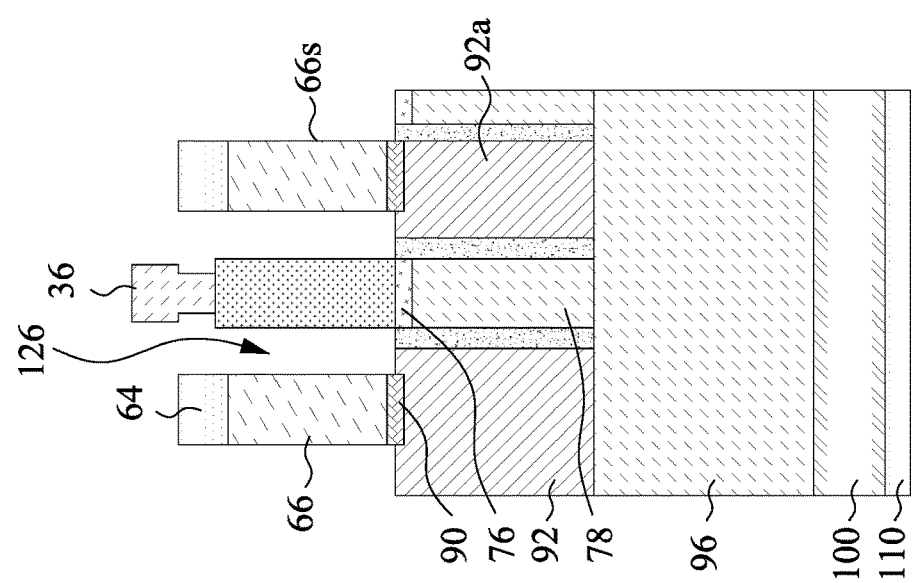
Figure 25A:
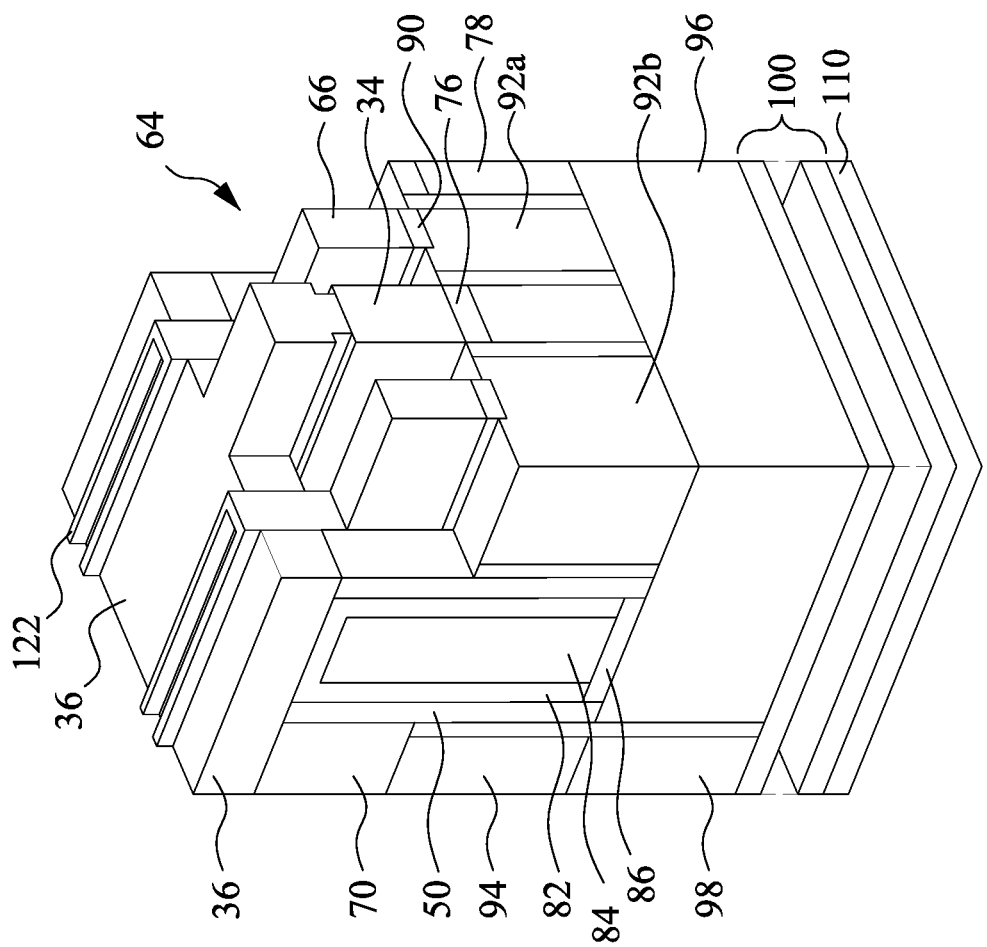
Figure 25D:
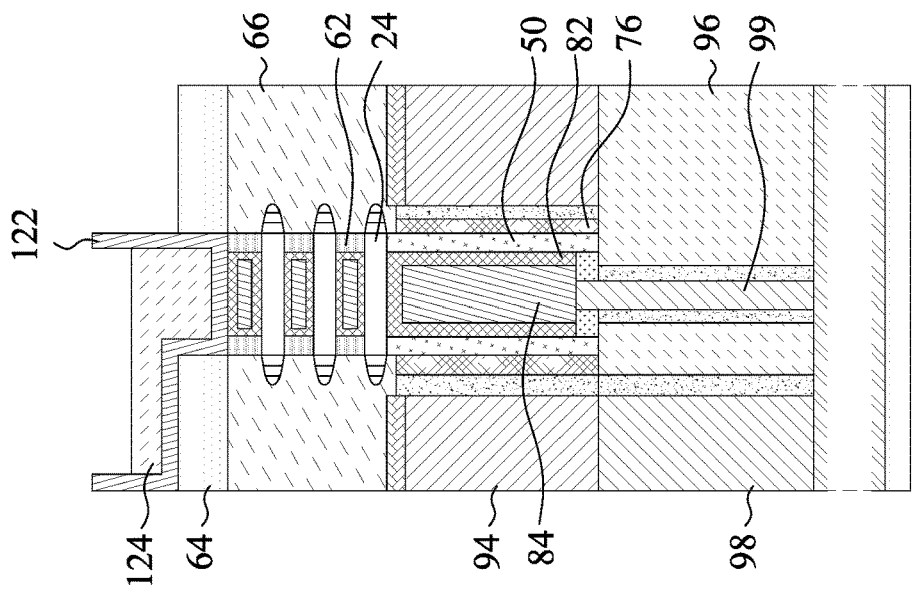
Figure 25C:
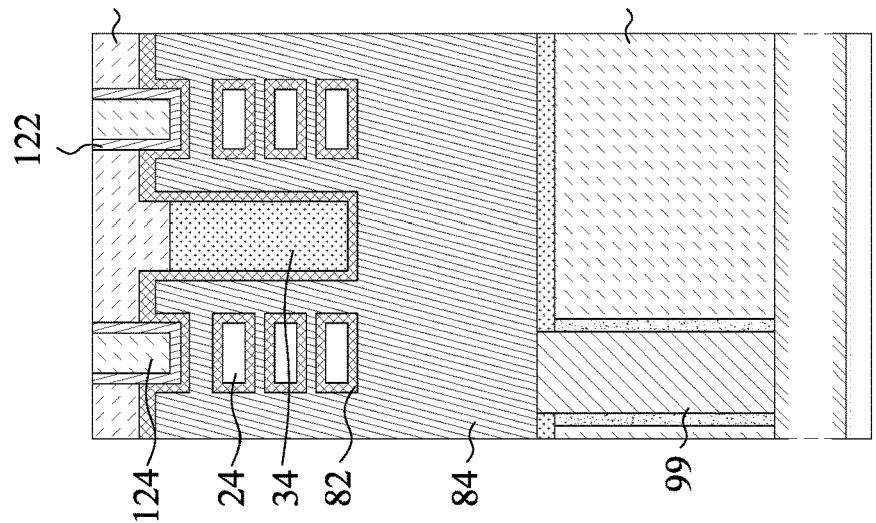
Figure 25B:
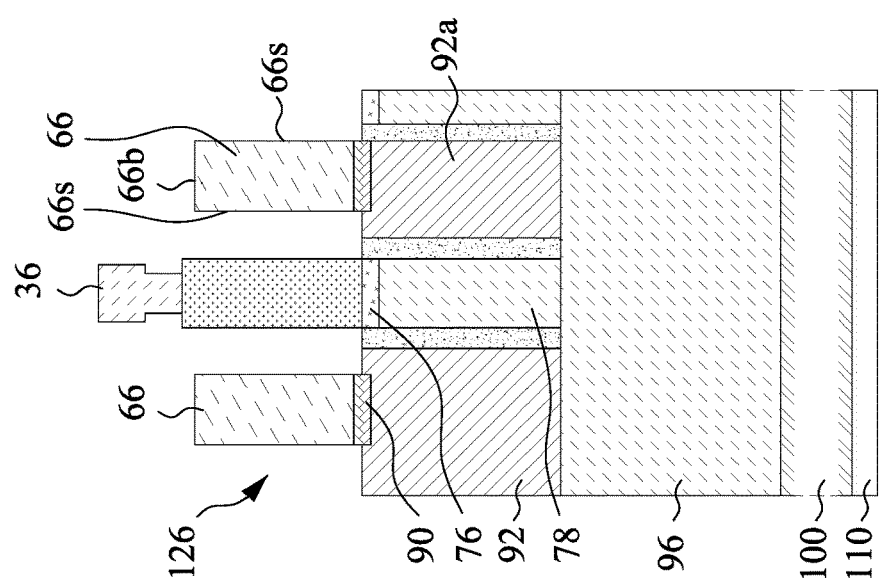
Figure 27A:
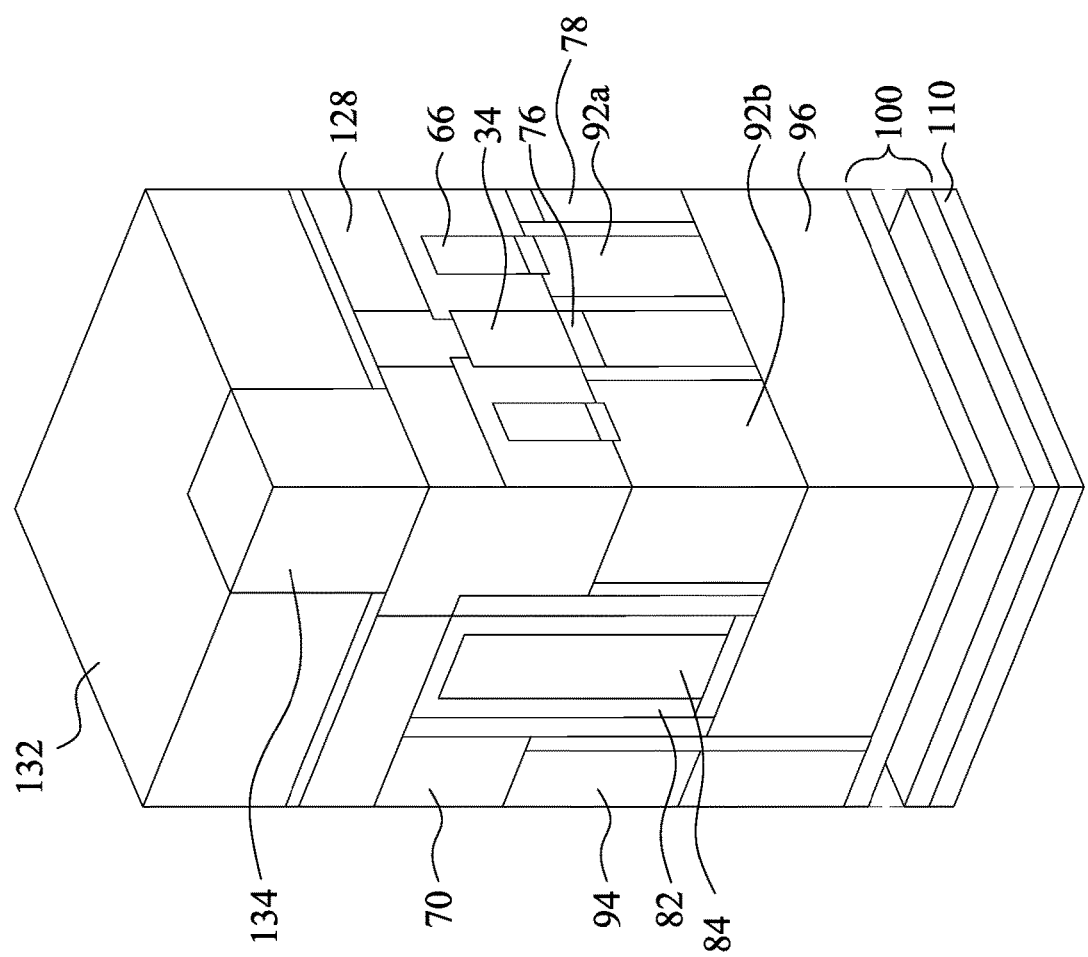
Figure 28A:
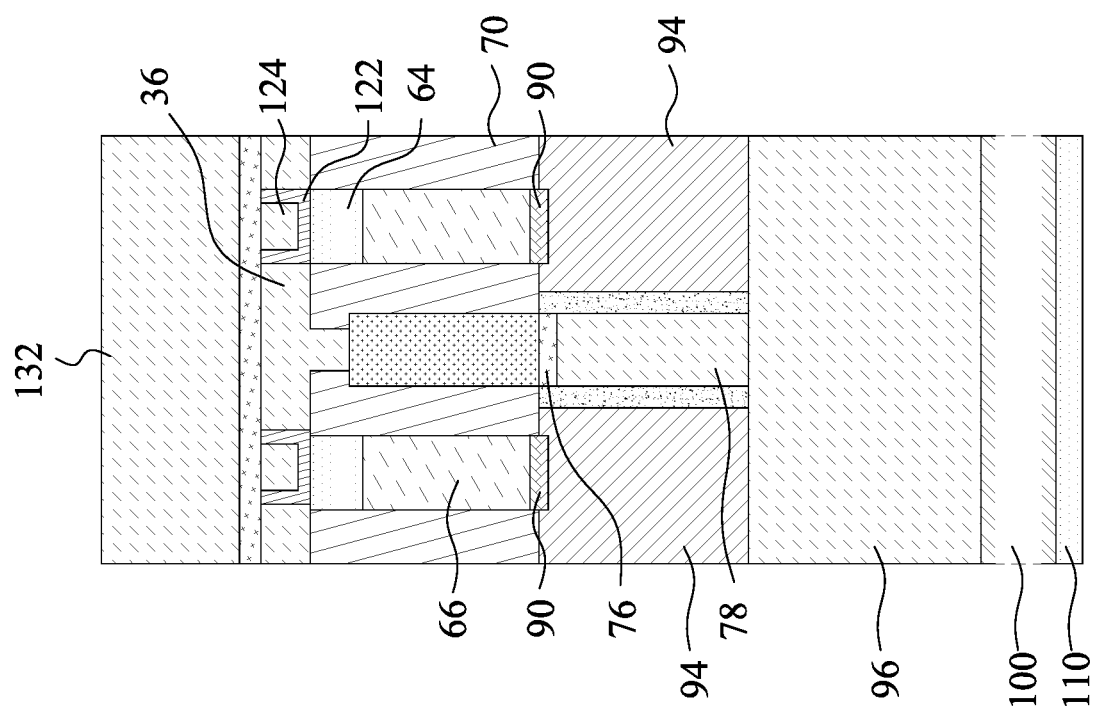

FIG. 28A is a cross section view of FIG. 27A along the Y3-Y3 as shown in FIG. 20A. As shown in FIG. 28A, when the epitaxial source/drain feature 66 is not connected to a backside source/drain contact, the gap fill dielectric layer 70 remains in the alignment recess 58 between the epitaxial source/drain feature 66 and the hybrid fin 34.

Figure 27D:
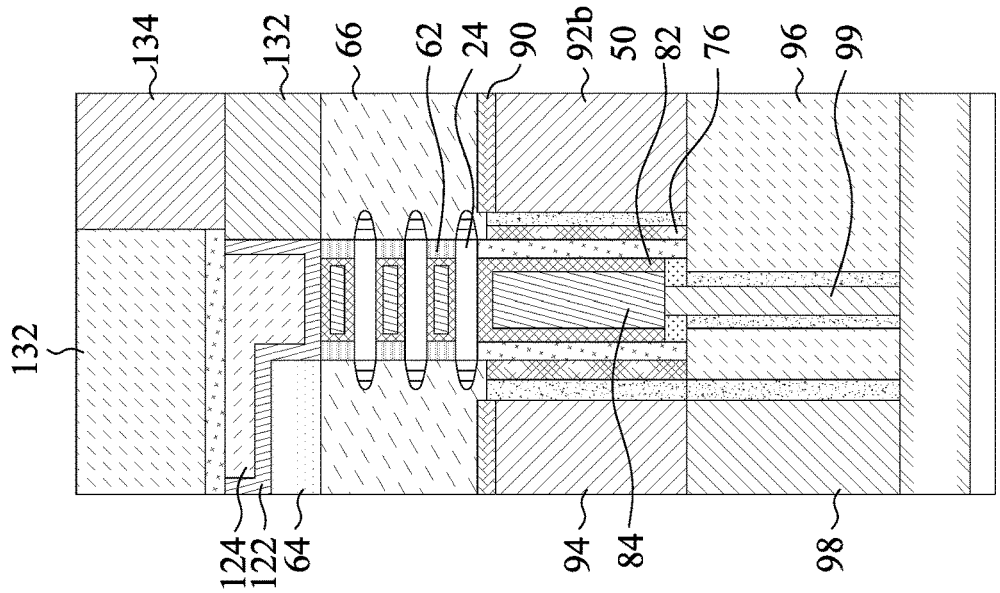
Figure 27C:
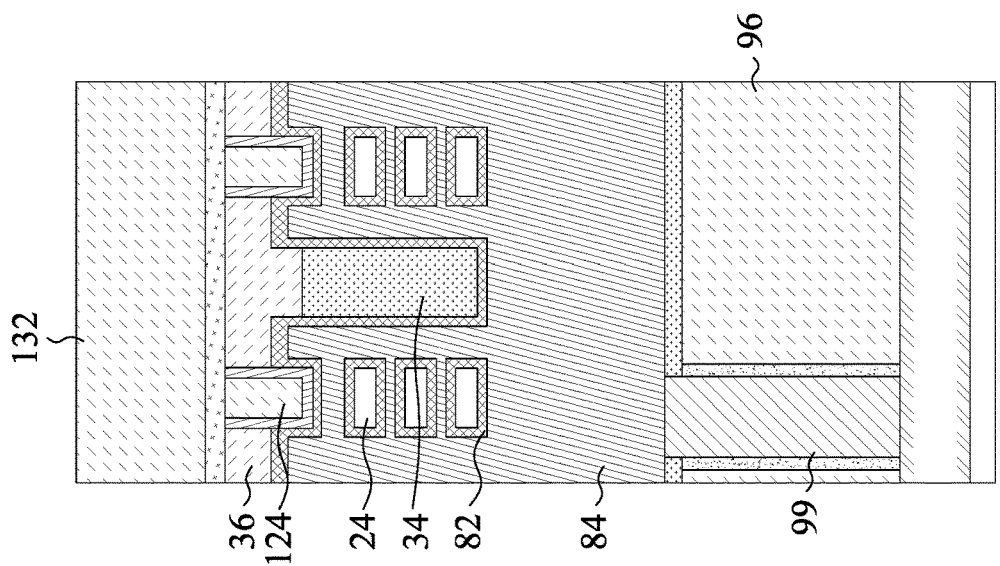
Figure 27B:
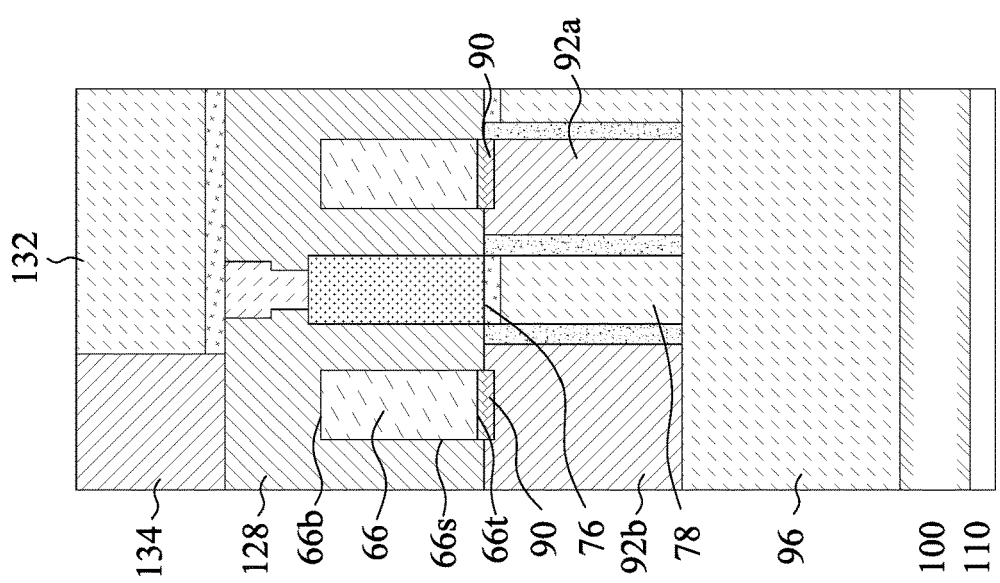
Figure 28B:
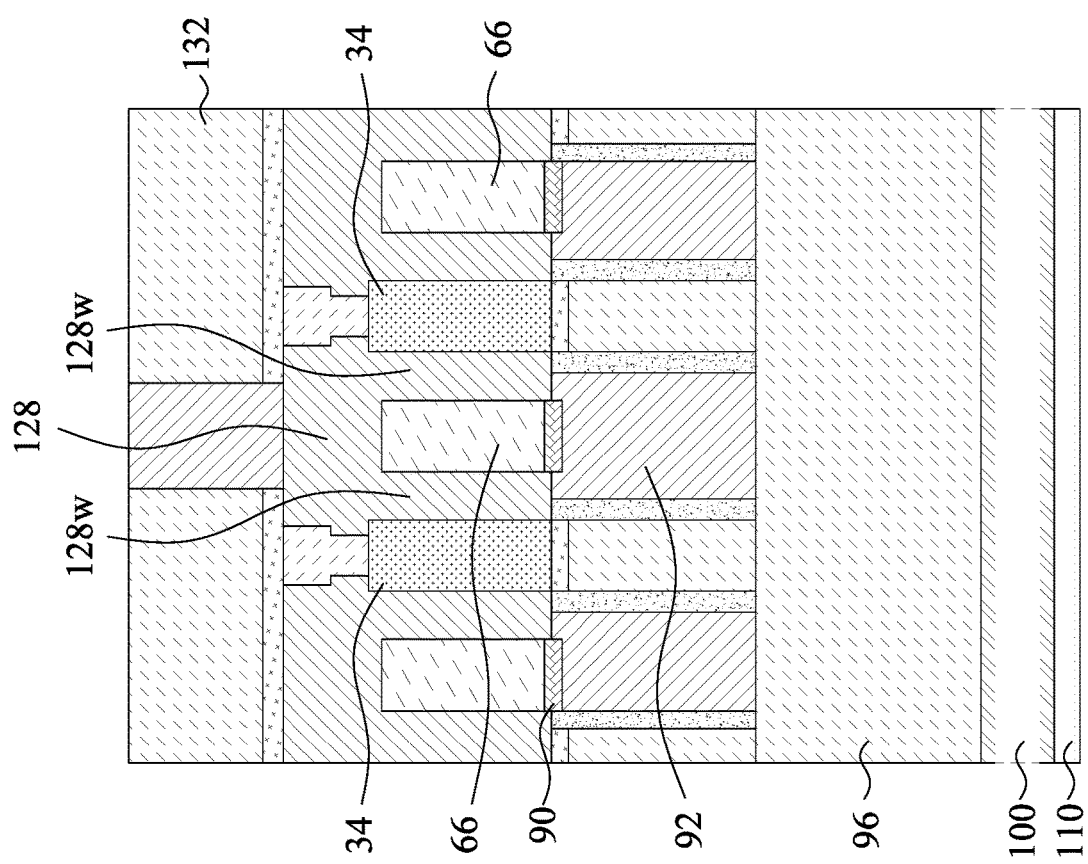

FIG. 28B is an extended cross section of FIG. 27B to include two dielectric features, e.g. hybrid fins 34 in the sectional view. As shown in FIG. 28B, the sidewall portions 128w of the backside source/drain contact 128 are positioned between side surfaces 66s of the epitaxial source/drain feature 66 and the adjacent dielectric features, e.g. hybrid fins 34.

Figure 28C:
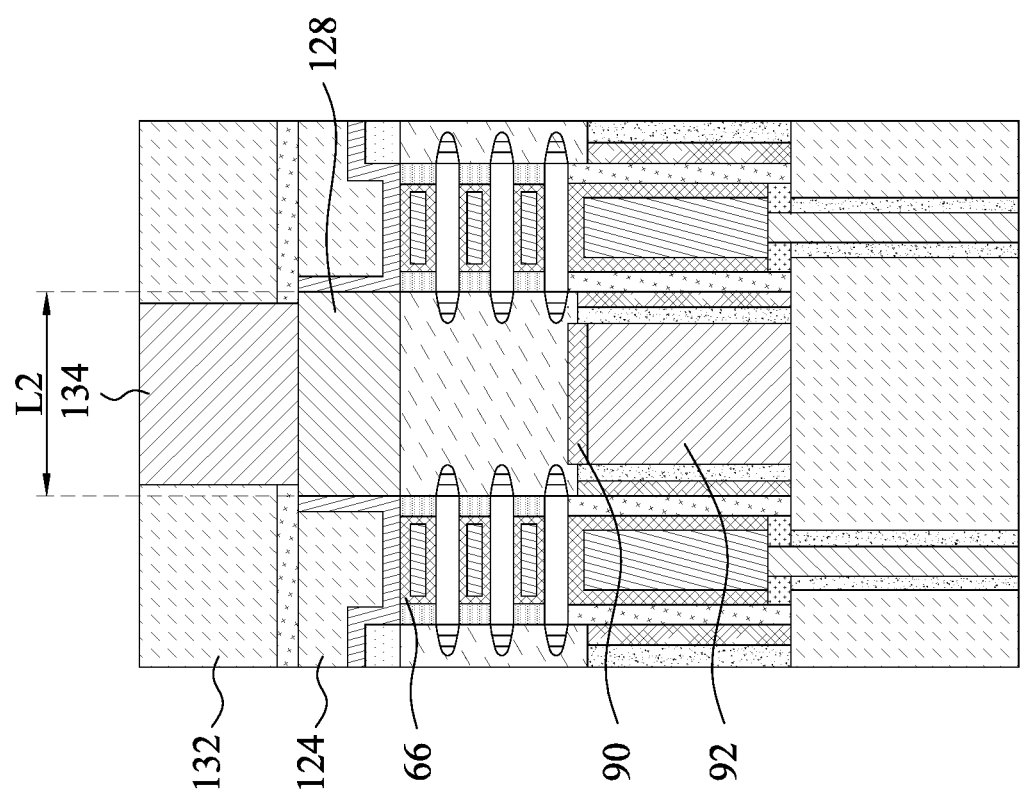

FIG. 28C is an extended cross section of FIG. 27D to include two gate stacks to show a length L2 of the backside source/drain contact 128 along the X direction. In some embodiments, the length L2 is in arrange between about 10 nm and about 50 nm.

Various embodiments or examples described herein offer multiple advantages over the state-of-art technology. Some embodiments provide a semiconductor device having a backside source/drain contact using a silicide layer formed on the front side, thereby, reducing interface resistance between the backside source/drain contact and the source/drain feature. Some embodiments using a low temperature annealing to form a silicide layer during backside processing, therefore further reducing interface resistance and preserving integrity of the metal structure at the same time. Embodiments of the present disclosure also improve alignment between backside contact and front side transistors using a self-alignment feature in forming the backside source/drain contact.

It will be understood that not all advantages have been necessarily discussed herein, no particular advantage is required for all embodiments or examples, and other embodiments or examples may offer different advantages.

Some embodiments of the present provide a semiconductor device. The semiconductor device includes a source/drain feature having a top surface and a bottom surface, a first silicide layer formed in contact with the top surface of the source/drain feature, a first conductive feature formed on the first silicide layer, and a second conductive feature having a body portion and a first sidewall portion extending from the body portion, wherein the body portion is below the bottom surface of the source/drain feature, and the first sidewall portion is in contact with the first conductive feature.

Some embodiments of the present disclosure provide a semiconductor device. The semiconductor device includes first and second dielectric features, a first epitaxial source/drain feature formed between the first and second dielectric features, and a conductive feature having a first portion and a second portion, wherein the first portion of the conductive feature is disposed between the first dielectric feature and the first epitaxial source/drain feature, and the second portion of the conductive feature is disposed between the second dielectric feature and the first epitaxial source/drain feature.

Some embodiments of the present disclosure provide a method for forming a semiconductor device. The method includes forming an epitaxial source/drain feature between a first dielectric feature and a second dielectric feature on a substrate, wherein a first gap is formed between the epitaxial source/drain feature and the first dielectric features, and a second gap is formed between the epitaxial source/drain feature and the second dielectric features, filling the first and second gaps with a gap fill dielectric material, forming a source/drain contact on a front side of the substrate over the epitaxial source/drain feature and the gap fill dielectric material, removing the gap fill dielectric material from a backside of the substrate, and after removal of the gap fill dielectric material, filling the first and second gaps with a conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   a source/drain feature having a top surface and a bottom surface;
   a first silicide layer formed in contact with the top surface of the source/drain feature;
   a first conductive feature formed on the first silicide layer; and
   a second conductive feature having a body portion and a first sidewall portion extending from the body portion, wherein the body portion is below the bottom surface of the source/drain feature, and the first sidewall portion is in contact with the first conductive feature, wherein the second conductive feature contacts the bottom surface and a side surface of the source/drain feature.

2. The semiconductor device of claim 1, further comprising a second silicide layer formed between the second conductive feature and the source/drain feature.

3. The semiconductor device of claim 1, wherein the second conductive feature includes a second sidewall portion extending from the body portion, and the source/drain feature is a bar-shaped epitaxial feature disposed between the first and second sidewall portions of the second conductive feature.

4. The semiconductor device of claim 3, wherein the second sidewall portion of the second conductive feature is in contact with the first conductive feature.

5. The semiconductor device of claim 1, wherein the second conductive feature is connected to a power rail.

6. The semiconductor device of claim 1, wherein the first conductive feature is in contact with the first silicide layer.

7. A semiconductor device, comprising:
   a first dielectric feature and a second dielectric feature;
   a first epitaxial source/drain feature formed between the first and second dielectric features;
   a conductive feature having a first portion and a second portion, wherein the first portion of the conductive feature is disposed between the first dielectric feature and the first epitaxial source/drain feature, and the second portion of the conductive feature is disposed between the second dielectric feature and the first epitaxial source/drain feature;
   a second epitaxial source/drain feature formed between the first and second dielectric features;
   a gap fill dielectric material disposed between the first dielectric feature and the second epitaxial source/drain feature, and between the second dielectric feature and the second epitaxial source/drain feature;
   a gate stack formed between the first and second epitaxial source/drain features; and
   one or more nanosheet channels formed in the gate stack.

8. The semiconductor device of claim 7, further comprising:
   a silicide layer on a top surface of the first epitaxial source/drain feature; and
   a front side source/drain contact disposed on the silicide layer, wherein at least one of the first portion and second portion of the conductive feature contacts the front side source/drain contact.

9. The semiconductor device of claim 8, wherein the conductive feature comprises a third portion disposed adjacent a bottom surface of the first epitaxial source/drain feature.

10. The semiconductor device of claim 9, further comprising a power rail formed below a bottom of the third portion of the conductive feature, wherein the conductive feature is connected to the power rail.

11. The semiconductor device of claim 7, wherein the conductive feature is in direct contact with the first epitaxial source/drain feature.

12. The semiconductor device of claim 7, wherein the gap fill dielectric material comprises a metal oxide.

13. The semiconductor device of claim 7, further comprising a source/drain conductive feature formed on a front surface of the first source/drain feature, and the source/drain conductive feature is in contact with the first portion of the conductive feature.

14. The semiconductor device of claim 7, wherein the first source/drain feature is a bar-shaped epitaxial feature having a first sidewall facing the first dielectric feature and a second sidewall facing the second dielectric feature, and the first portion of the conductive feature is disposed between the first dielectric feature and the first sidewall of the first epitaxial source/drain feature, and the second portion of the conductive feature is disposed between the second dielectric feature and the second sidewall of the first epitaxial source/drain feature.

15. A method for forming a semiconductor device, comprising:
   forming an epitaxial source/drain feature between a first dielectric feature and a second dielectric feature on a substrate, wherein a first gap is formed between the epitaxial source/drain feature and the first dielectric features, and a second gap is formed between the epitaxial source/drain feature and the second dielectric features;
   filling the first and second gaps with a gap fill dielectric material;
   forming a source/drain contact on a front side of the substrate over the epitaxial source/drain feature and the gap fill dielectric material;
   removing the gap fill dielectric material from a backside of the substrate; and
   after removal of the gap fill dielectric material, filling the first and second gaps with a conductive material.

16. The method of claim 15, further comprising:
   forming an alignment feature on the front side of the substrate; and
   forming a transitional epitaxial layer over the alignment feature, wherein the epitaxial source/drain feature is formed from the transitional epitaxial layer.

17. The method of claim 16, further comprising:
   removing the alignment feature from the backside of the substrate to form a contact hole; and
   expanding the contact hole to expose the dielectric material.

18. The method of claim 15, forming the epitaxial source/drain feature comprises epitaxially grown a bar-shaped feature.

19. The method of claim 15, wherein filing the first and second gaps with a conductive material comprises forming the conductive material directly on the epitaxial source/drain feature.

20. The method of claim 15, further comprising:
   prior to filing the conductive material, forming a metal source layer over the epitaxial source/drain feature; and annealing the metal source layer at a temperature below 400° C. to form a silicide layer on the epitaxial source/drain feature.

\* \* \* \* \*